US012720999B2

(12) United States Patent
Yuan et al.

(10) Patent No.: US 12,720,999 B2
(45) Date of Patent: Aug. 25, 2026

(54) DISPLAY SUBSTRATE AND DISPLAY APPARATUS

(71) Applicants: Hefei BOE Joint Technology Co., Ltd., Hefei (CN); BOE Technology Group Co., Ltd., Beijing (CN)

(72) Inventors: Can Yuan, Beijing (CN); Yongqian Li, Beijing (CN); Cheng Xu, Beijing (CN); Dandan Zhou, Beijing (CN); Ning Liu, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 355 days.

(21) Appl. No.: 18/291,759

(22) PCT Filed: Feb. 28, 2023

(86) PCT No.: PCT/CN2023/078576

§ 371 (c)(1),
(2) Date: Jan. 24, 2024

(87) PCT Pub. No.: WO2024/178573

PCT Pub. Date: Sep. 6, 2024

(65) Prior Publication Data

US 2025/0098479 A1 Mar. 20, 2025

(51) Int. Cl.
*H10K 59/80* (2023.01)
*H10K 50/824* (2023.01)
(Continued)

(52) U.S. Cl.
CPC ..... *H10K 59/80522* (2023.02); *H10K 50/824* (2023.02); *H10K 59/122* (2023.02); *H10K 59/131* (2023.02); *H10K 71/60* (2023.02)

(58) Field of Classification Search
CPC ........... H10K 59/80522; H10K 50/824; H10K 59/131; H10K 71/60; H10K 59/122
See application file for complete search history.

(56) References Cited

U.S. PATENT DOCUMENTS 8,692,455 B2 * 4/2014 Hayashi ................. H10D 86/60 313/506
9,570,525 B2 * 2/2017 Jeong .............. H10K 59/80522
(Continued)

FOREIGN PATENT DOCUMENTS

CN 103066212 A 4/2013
CN 104269494 A 1/2015
(Continued)

OTHER PUBLICATIONS

International Search Report & Written Opinion mailed Feb. 28, 2023, regarding PCT/CN2023/078576.
(Continued)

*Primary Examiner* — Maliheh Malek
(74) *Attorney, Agent, or Firm* — Intellectual Valley Law, P.C.

(57) ABSTRACT

A display substrate is provided. The display substrate includes a planarization layer; a light emitting element on the planarization layer, including a first electrode, an organic layer on the first electrode, and a second electrode on a side of the organic layer away from the first electrode; an auxiliary electrode in a layer different from the second electrode; one or more first connecting structures electrically connecting the auxiliary electrode with the second electrode, respectively; and one or more second connecting structures electrically connecting the auxiliary electrode with the second electrode, respectively; wherein a respective first connecting structure of the one or more first connecting structures includes a conductive channel including a sintered
(Continued)

conductive material; and the conductive channel is absent in the one or more second connecting structures.

20 Claims, 43 Drawing Sheets

(51) Int. Cl.

| | |
|---|---|
| ***H10K 59/122*** | (2023.01) |
| ***H10K 59/131*** | (2023.01) |
| *H10K 71/60* | (2023.01) |

(56) References Cited

U.S. PATENT DOCUMENTS

| | | | | |
|---|---|---|---|---|
| 9,620,487 | B2* | 4/2017 | Sakariya | H10W 90/00 |
| 9,748,512 | B2* | 8/2017 | Kim | H10K 59/121 |
| 10,749,134 | B2* | 8/2020 | Yamamoto | H10K 59/131 |
| 12,414,411 | B2* | 9/2025 | Kim | H10H 20/8132 |
| 12,453,254 | B2* | 10/2025 | Zhou | H10K 59/80522 |
| 2012/0205678 | A1* | 8/2012 | Ikeda | H10K 59/131 438/22 |
| 2013/0056784 | A1* | 3/2013 | Lee | H10K 59/1315 438/22 |
| 2014/0225071 | A1* | 8/2014 | Park | H10K 59/131 438/34 |
| 2015/0021560 | A1 | 1/2015 | Jeong et al. | |
| 2015/0179974 | A1 | 6/2015 | Matsuura | |
| 2015/0243934 | A1 | 8/2015 | Han et al. | |
| 2016/0056408 | A1* | 2/2016 | Saito | H10K 50/814 257/40 |
| 2016/0149156 | A1* | 5/2016 | Kim | H10K 59/121 438/46 |
| 2016/0233285 | A1 | 8/2016 | Lee | |
| 2017/0155078 | A1 | 6/2017 | Lee | |
| 2017/0194415 | A1* | 7/2017 | Choi | H10K 50/828 |
| 2018/0175104 | A1* | 6/2018 | Kang | H10H 29/10 |
| 2019/0326370 | A1 | 10/2019 | Lu | |
| 2020/0044116 | A1* | 2/2020 | Chen | H10H 20/8314 |
| 2020/0127167 | A1* | 4/2020 | Lee | H10H 20/833 |
| 2021/0167050 | A1* | 6/2021 | Cho | H10H 20/018 |
| 2021/0202667 | A1* | 7/2021 | Kim | H10K 59/12 |
| 2021/0288033 | A1* | 9/2021 | Lim | H10H 20/813 |
| 2022/0115483 | A1* | 4/2022 | Li | H10K 71/00 |
| 2023/0016834 | A1* | 1/2023 | Jeong | H10H 20/8312 |
| 2023/0077299 | A1* | 3/2023 | Lee | H10K 59/1315 |
| 2023/0163247 | A1* | 5/2023 | Kim | H10H 20/8132 257/89 |
| 2023/0207735 | A1* | 6/2023 | Choi | H10K 59/1315 257/79 |
| 2023/0337496 | A1* | 10/2023 | Liu | H10K 77/10 |
| 2024/0138232 | A1* | 4/2024 | Shim | H10K 59/1315 |
| 2024/0215317 | A1* | 6/2024 | Yang | H10K 59/1201 |
| 2024/0395827 | A1* | 11/2024 | Liu | H10D 86/0221 |
| 2025/0095571 | A1* | 3/2025 | Yuan | H10K 59/131 |
| 2025/0098416 | A1* | 3/2025 | Yuan | H10K 59/1213 |
| 2025/0151473 | A1* | 5/2025 | Kwak | H10H 20/8312 |
| 2025/0160147 | A1* | 5/2025 | Lee | H10K 59/124 |
| 2025/0255107 | A1* | 8/2025 | Shin | H10K 59/1201 |
| 2025/0255143 | A1* | 8/2025 | Shin | H10K 71/13 |
| 2025/0374767 | A1* | 12/2025 | Kwon | H10K 59/122 |
| 2026/0040774 | A1* | 2/2026 | Liu | H10K 59/1213 |

FOREIGN PATENT DOCUMENTS

| | | | |
|---|---|---|---|
| CN | 105870151 | A | 8/2016 |
| CN | 106717120 | A | 5/2017 |
| CN | 108538890 | A | 9/2018 |
| CN | 110556406 | A | 12/2019 |
| CN | 111864116 | A | 10/2020 |
| CN | 113053957 | A | 6/2021 |
| CN | 113488514 | A | 10/2021 |
| CN | 114665052 | A | 6/2022 |
| CN | 115127747 | A | 9/2022 |
| KR | 20150002422 | A | 1/2015 |
| KR | 20170063243 | A | 6/2017 |
| KR | 20190024329 | A | 3/2019 |
| WO | 2022198573 | A1 | 9/2022 |
| WO | 2022205083 | A1 | 10/2022 |
| WO | 2022222078 | A1 | 10/2022 |

OTHER PUBLICATIONS

First Office Action in the Chinese Patent Application No. 202380007945.3, dated Apr. 29, 2026; English translation attached.

* cited by examiner

DISPLAY SUBSTRATE AND DISPLAY APPARATUS

CROSS-REFERENCE TO RELATED APPLICATION

This application is a national stage application under 35 U.S.C. § 371 of International Application No. PCT/CN2023/078576, filed Feb. 28, 2023, the contents of which are incorporated by reference in the entirety.

TECHNICAL FIELD

The present invention relates to display technology, more particularly, to a display substrate and a display apparatus.

BACKGROUND

In recent years, more and more technology companies focus on development of transparent displays. For example, transparent displays have been used in store window display. A viewer can not only see the information displayed on the screen of a transparent display, but also the objects located behind the transparent display. Both the real product and on-screen product-related information can be presented simultaneously, enabling customers to understand the full range of the product information, and to obtain a better display experience. Transparent display panels have been used in vehicular display and various other commercial scenarios such as window display in a hotel or department store setting. The transparent display panels have the advantages of excellent display quality and highly realistic display effects.

SUMMARY

In a first aspect, the present disclosure provides a display substrate, comprising: a planarization layer; a light emitting element on the planarization layer, comprising a first electrode, an organic layer on the first electrode, and a second electrode on a side of the organic layer away from the first electrode; an auxiliary electrode in a layer different from the second electrode; one or more first connecting structures electrically connecting the auxiliary electrode with the second electrode, respectively; and one or more second connecting structures electrically connecting the auxiliary electrode with the second electrode, respectively; wherein a respective first connecting structure of the one or more first connecting structures comprises a conductive channel comprising a sintered conductive material; and the conductive channel is absent in the one or more second connecting structures.

In some embodiments according to the present disclosure, the display substrate comprises a light emitting region and a transparent region; wherein the one or more first connecting structures and the one or more second connecting structures are in the transparent region.

In some embodiments according to the present disclosure, the respective first connecting structure is spaced apart from the light emitting region by a first shortest distance; a respective second connecting structure of the one or more second connecting structures is spaced apart from the light emitting region by a second shortest distance; and the first shortest distance is greater than the second shortest distance.

In some embodiments according to the present disclosure, the display substrate further comprises a planarization layer which extends at least partially in the light emitting region;

wherein an orthographic projection of the planarization layer on a base substrate is non-overlapping with an orthographic projection of the respective first connecting structure on the base substrate, and at least partially overlaps with an orthographic projection of the respective second connecting structure on the base substrate.

In some embodiments according to the present disclosure, the respective first connecting structure comprises a sequentially stacked structure comprising a connecting electrode, a portion of the organic layer on the connecting electrode, and a portion of the second electrode on a side of the portion of the organic layer away from the connecting electrode.

In some embodiments according to the present disclosure, the sintered conductive material comprises at least one of an organic material of the portion of the organic layer, a conductive material of the connecting electrode, or a conductive material of the portion of the second electrode.

In some embodiments according to the present disclosure, the sintered conductive material comprises an organic material of the portion of the organic layer, a conductive material of the connecting electrode, and a conductive material of the portion of the second electrode.

In some embodiments according to the present disclosure, the auxiliary electrode is on a side of the connecting electrode away from the organic layer; the second electrode is connected to the connecting electrode through the conductive channel, and in turn connected to the auxiliary electrode through the connecting electrode; and the auxiliary electrode extends at least partially in one or more subpixels.

In some embodiments according to the present disclosure, a respective second connecting structure of the one or more second connecting structures comprises a first connecting electrode, a second connecting electrode, and a third connecting electrode sequentially stacked; wherein the second electrode is in direct contact with at least one of the first connecting electrode, the second connecting electrode, or the third connecting electrode.

In some embodiments according to the present disclosure, the auxiliary electrode is on a side of the first connecting electrode away from the second connecting electrode; the first connecting electrode extends through a via to connect with the auxiliary electrode; and the auxiliary electrode extends at least partially in one or more subpixels.

In some embodiments according to the present disclosure, the display substrate further comprises a pixel definition layer surrounding a subpixel region; an orthographic projection of the planarization layer on a base substrate at least partially overlaps with an orthographic projection of the pixel definition layer on the base substrate; and an orthographic projection of the pixel definition layer on the base substrate is non-overlapping with an orthographic projection of the second connecting electrode on the base substrate, and is non-overlapping with an orthographic projection of the third connecting electrode on the base substrate.

In some embodiments according to the present disclosure, the second electrode extends from a light emitting region, over the pixel definition layer, and into a transparent region to be in direct contact with at least one of the first connecting electrode, the second connecting electrode, or the third connecting electrode.

In some embodiments according to the present disclosure, the respective second connecting structure further comprises at least one of: a residual organic layer stacked on a side of the third connecting electrode away from the second connecting electrode, the residual organic layer in a same layer as the organic layer, and at least partially segregated from the organic layer; or a residual second electrode stacked on a side of the residual organic layer away from the third connecting electrode, the residual second electrode in a same layer as the second electrode, and at least partially segregated from the second electrode.

In some embodiments according to the present disclosure, the first electrode comprises a first sub-layer, a second sub-layer, and a third sub-layer sequentially stacked; the first sub-layer and the first connecting electrode are in a same layer, and are spaced apart from each other by a pixel definition layer; the second sub-layer and the second connecting electrode are in a same layer, and are spaced apart from each other by the pixel definition layer; and the third sub-layer and the third connecting electrode are in a same layer, and are spaced apart from each other by the pixel definition layer.

In some embodiments according to the present disclosure, the display substrate further comprises one or more dummy structures; wherein a respective dummy structure of the one or more dummy structures comprises a sequentially stacked structure comprising a connecting electrode, a portion of the organic layer on the connecting electrode, and a portion of the second electrode on a side of the portion of the organic layer away from the connecting electrode; the conductive channel connecting the portion of the second electrode and the auxiliary electrode is absent in the respective dummy structure; and the portion of the second electrode is electrically isolated from the auxiliary electrode.

In some embodiments according to the present disclosure, a ratio of a number of the one or more second connecting structures to a number of the one or more first connecting structures in the display substrate is equal to or greater than 0.9:1.0.

In some embodiments according to the present disclosure, a ratio of a number of the one or more second connecting structures to a number of the one or more first connecting structures in the display substrate is in a range of 0.9:1.0 to 1.0:0.9.

In some embodiments according to the present disclosure, the display substrate comprises a plurality of first repeating units and a plurality of second repeating units; a respective first repeating unit of the plurality of first repeating units comprises at least one first connecting structure of the one or more first connecting structures and at least one second connecting structure of the one or more second connecting structure; a respective second repeating unit includes at least one dummy structure of one or more dummy structures and at least one second connecting structure of the one or more second connecting structure; the conductive channel is present in a respective first repeating unit of the plurality of first repeating units, and is absent in a respective second repeating unit of the plurality of second repeating units.

In some embodiments according to the present disclosure, in a row of repeating units, first repeating units and second repeating units are alternately arranged; and in a column of repeating units, first repeating units and second repeating units are alternately arranged.

In a second aspect, the present disclosure provides a display apparatus, comprising the display substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display substrate and a display apparatus that substantially obviate one or more of the problems due to limitations and disadvantages of the related art. In one aspect, the present disclosure provides a display substrate. In some embodiments, the display substrate includes a planarization layer; a light emitting element on the planarization layer, comprising a first electrode, an organic layer on the first electrode, and a second electrode on a side of the organic layer away from the first electrode; an auxiliary electrode in a layer different from the second electrode; one or more first connecting structures electrically connecting the auxiliary electrode with the second electrode, respectively; and one or more second connecting structures electrically connecting the auxiliary electrode with the second electrode, respectively, Optionally, a respective first connecting structure of the one or more first connecting structures comprises a conductive channel comprising a sintered conductive material, Optionally, the conductive channel is absent in the one or more second connecting structures.

Figure 1:
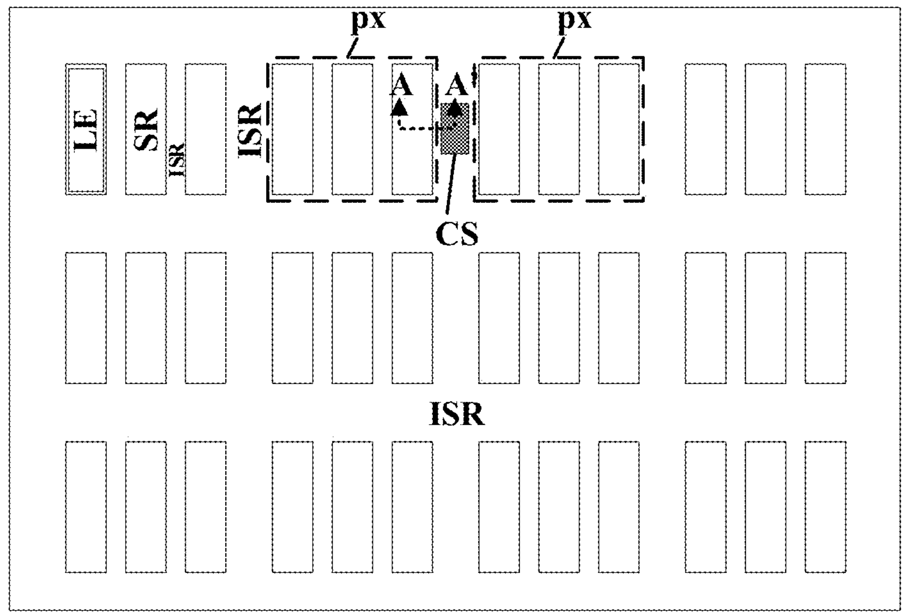
FIG. 1 is a schematic diagram illustrating the structure of a display substrate in some embodiments according to the present disclosure.

FIG. 1 is a schematic diagram illustrating the structure of a display substrate in some embodiments according to the present disclosure. Referring to FIG. 1, the display substrate includes a subpixel region SR and an inter-subpixel region ISR. As used herein, a subpixel region refers to a light emission region of a subpixel, such as a region corresponding to a pixel electrode in a liquid crystal display substrate, a region corresponding to a light emissive layer in a light emitting diode display substrate. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, a region corresponding to a pixel definition layer or a black matrix in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Referring to FIG. 1, the display substrate includes a light emitting element LE in the subpixel region SR, and a connecting structure CS in the inter-subpixel region ISR. The connecting structure CS may be disposed in any appropriate location in the inter-subpixel region ISR. In one example, the display substrate includes a plurality of pixels px. A respective pixel of the plurality of pixels px includes one or more subpixels, e.g., a red subpixel, a blue subpixel, and a green subpixel. In another example, the connecting structure CS is disposed in a location in the inter-subpixel region ISR between two subpixels respectively from two adjacent pixels of the plurality of pixels px, as depicted in FIG. 1. In another example, the connecting structure CS is disposed in a location in the inter-subpixel region ISR between two subpixels in a same pixel of the plurality of pixels px.

Figure 2:
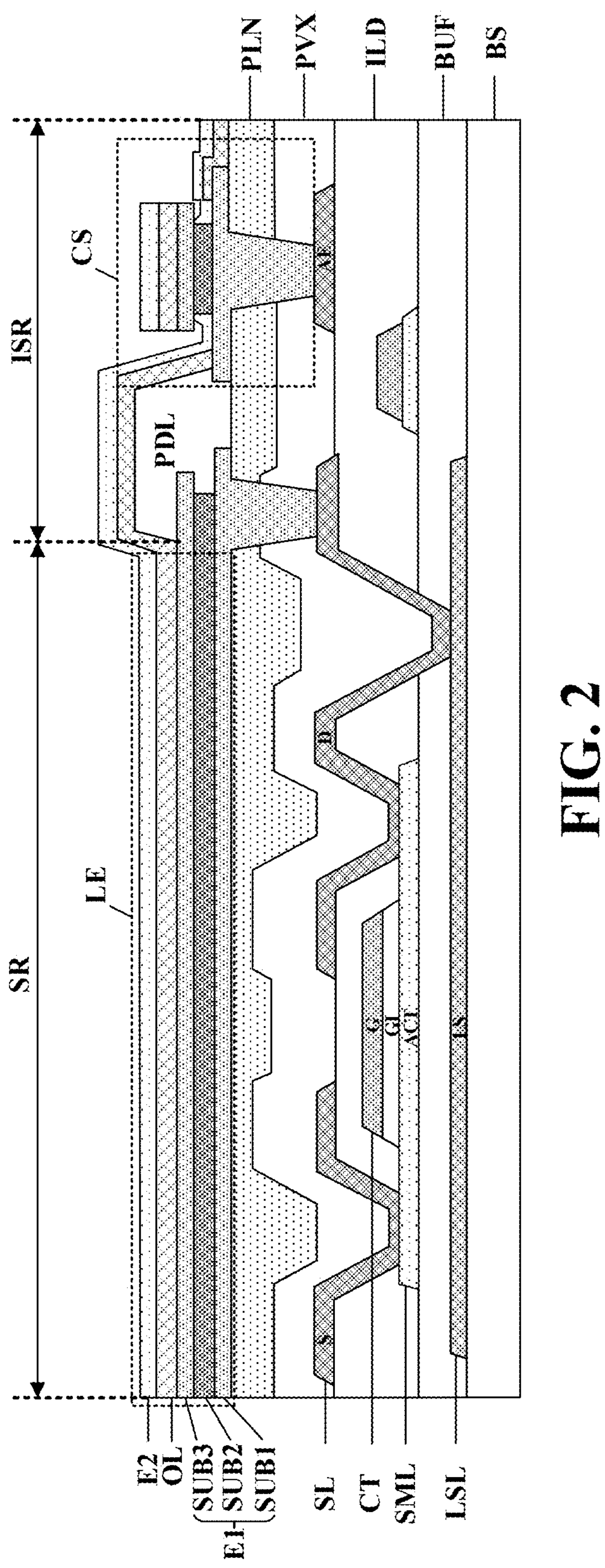
FIG. 2 is a cross-sectional view of a display substrate in some embodiments according to the present disclosure.

FIG. 2 is a cross-sectional view of a display substrate in some embodiments according to the present disclosure. For example, FIG. 2 may be a cross-sectional view along an A-A' line of the display substrate depicted in FIG. 1. Referring to FIG. 2, the display substrate in some embodiments includes a planarization layer PLN; a light emitting element LE on the planarization layer PLN and in the subpixel region SR; and a connecting structure CS in the inter-subpixel region ISR.

In some embodiments, the light emitting element LE includes a first electrode E1 (e.g., an anode), an organic layer OL on the first electrode E1, and a second electrode E2 (e.g., a cathode) on a side of the organic layer OL away from the first electrode E1. The organic layer OL may include one or more organic material layers. In one example, the organic layer OL includes a light emitting layer. In another example, the organic layer OL further includes at least one of a hole injection layer, a hole transport layer, an emitting material layer, an electron transport layer, an electron injection layer, or a charge generating layer.

In some embodiments, the display substrate further includes an auxiliary electrode AE in a layer different from the second electrode E2, and the auxiliary electrode AE is electrically connected to the second electrode E2. Optionally, the connecting structure CS electrically connects the auxiliary electrode AE and the second electrode E2.

In some embodiments, the planarization layer PLN is an insulating material layer that is in direct contact with at least a portion of the first electrode E1, The planarization layer PLN facilitates formation of layers thereon by planarizing a surface of the substrate prior to forming the layers on the planarization layer PLN. The planarization layer PLN extends at least partially in the subpixel region SR. Optionally, the planarization layer PLN extends at least partially in the subpixel region SR, and extends at least partially in the inter-subpixel region ISR.

Various appropriate insulating materials and various appropriate fabricating methods may be used for making the planarization layer PLN. For example, an insulating material may be deposited on the substrate by a plasma-enhanced chemical vapor deposition (PECVD) process or a sputtering process, e.g., a magnetron sputtering process. Examples of appropriate insulating materials include various appropriate resin materials, polyimide, silicon oxide (SiOy), silicon nitride (SiNy, e.g., Si3N4), and silicon oxynitride (SiOxNy).

Figure 3:
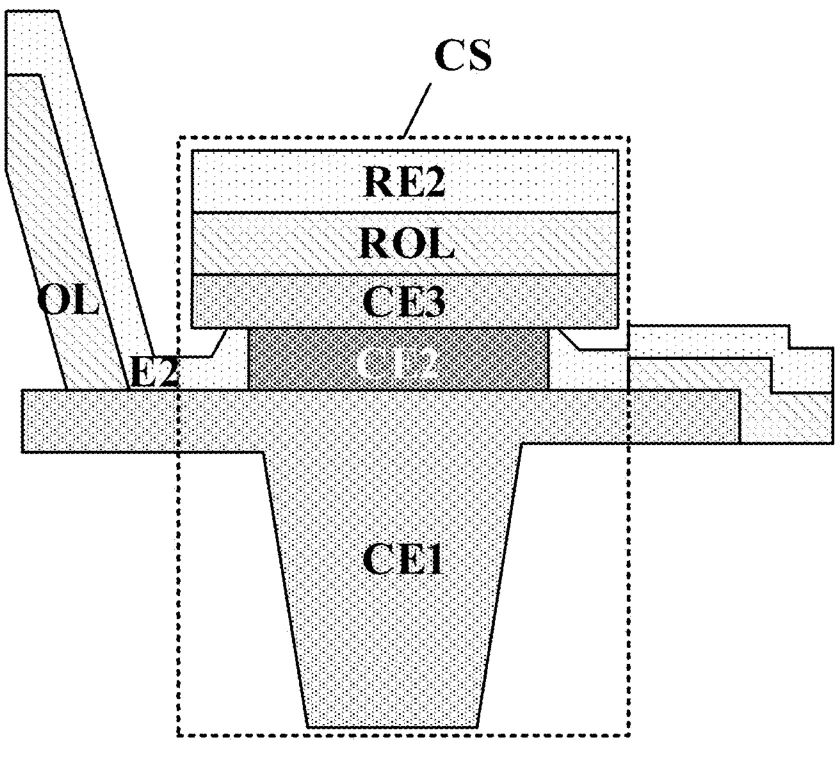
FIG. 3 is a schematic diagram illustrating the structure of a connecting structure in some embodiments according to the present disclosure.

FIG. 3 is a schematic diagram illustrating the structure of a connecting structure in some embodiments according to the present disclosure. Referring to FIG. 3, the connecting structure in some embodiments includes a first connecting electrode CE1, a second connecting electrode CE2, and a third connecting electrode CE3 sequentially stacked. In one example, the first connecting electrode CE1 is in direct contact with the second connecting electrode CE2, and the second connecting electrode CE2 is in direct contact with the third connecting electrode CE3. The second connecting electrode CE2 connects the first connecting electrode CB1 and the third connecting electrode CE3.

Various appropriate conductive electrode materials and various appropriate fabricating methods may be used to make the connecting electrodes. For example, a conductive electrode material may be deposited on the substrate by, e.g., sputtering or vapor deposition, and patterned by, e.g., lithography such as a wet etching process to form the connecting electrodes. Examples of appropriate conductive electrode materials include, but are not limited to, metallic conductive electrode materials and non-metallic conductive electrode materials. Examples of appropriate metallic conductive electrode materials include, but are not limited to, aluminum, chromium, tungsten, titanium, tantalum, molybdenum, copper, and alloys or laminates containing the same. Examples of appropriate non-metallic conductive electrode materials include, but are not limited to, various transparent metal oxide electrode materials and transparent nano-carbon tubes. Examples of transparent metal oxide materials include, but are not limited to, indium tin oxide, indium zinc oxide, indium gallium oxide, and indium gallium zinc oxide.

In one example, the first connecting electrode CE1 and the third connecting electrode CE3 are made of indium tin oxide. In another example, the second connecting electrode CE2 is made of a reflective electrode material such as aluminum alloy.

Various appropriate conductive electrode materials and various appropriate fabricating methods may be used to make the first electrode E1. For example, a conductive electrode material may be deposited on the substrate by, e.g., sputtering or vapor deposition, and patterned by, e.g., lithography such as a wet etching process to form the connecting electrodes. Examples of appropriate conductive electrode materials include, but are not limited to, metallic conductive electrode materials and non-metallic conductive electrode materials. Examples of appropriate metallic conductive electrode materials include, but are not limited to, aluminum, chromium, tungsten, titanium, tantalum, molybdenum, copper, and alloys or laminates containing the same. Examples of appropriate non-metallic conductive electrode materials include, but are not limited to, various transparent metal oxide electrode materials and transparent nano-carbon tubes. Examples of transparent metal oxide materials include, but are not limited to, indium tin oxide, indium zinc oxide, indium gallium oxide, and indium gallium zinc oxide.

In some embodiments, the first electrode E1 includes a plurality of sub-layers. Optionally, the first electrode E1 includes a first sub-layer SUB1, a second sub-layer SUB2, and a third sub-layer SUB3 sequentially stacked.

In one example, the first sub-layer SUB1 and the third sub-layer SUB3 are made of indium tin oxide. In another example, the second sub-layer SUB2 is made of a reflective electrode material such as aluminum alloy.

In some embodiments, the first sub-layer SUB1 and the first connecting electrode CB1 are in a same layer; the second sub-layer SUB2 and the second connecting electrode CE2 are in a same layer; and the third sub-layer SUB3 and the third connecting electrode CE3 are in a same layer. Optionally, the first sub-layer SUB1 and the first connecting electrode CE1 are spaced apart from each other, e.g., by a pixel definition layer PDL; the second sub-layer SUB2 and the second connecting electrode CE2 are spaced apart from each other, e.g., by the pixel definition layer PDL; and the third sub-layer SUB3 and the third connecting electrode CE3 are spaced apart from each other, e.g., by the pixel definition layer PDL.

As used herein, the term "same layer" refers to the relationship between the layers simultaneously formed in the same step. In one example, the first sub-layer SUB1 and the first connecting electrode CE1 are in a same layer when they are formed as a result of one or more steps of a same patterning process performed in a material deposited in a same deposition process. In another example, the first sub-layer SUB1 and the first connecting electrode CE1 can be formed in a same layer by simultaneously performing the step of forming the first sub-layer SUB1 and the step of forming the first connecting electrode CE1. The term "same layer" does not always mean that the thickness of the layer or the height of the layer in a cross-sectional view is the same.

Various appropriate conductive electrode materials and various appropriate fabricating methods may be used to make the second electrode E2. For example, a conductive electrode material may be deposited on the substrate by, e.g., sputtering or vapor deposition, and patterned by, e.g., lithography such as a wet etching process to form the connecting electrodes. Examples of appropriate conductive electrode materials for making the second electrode E2 include, but are not limited to, various transparent metal oxide electrode materials and transparent nano-carbon tubes. Examples of transparent metal oxide materials include, but are not limited to, indium tin oxide, indium zinc oxide, indium gallium oxide, and indium gallium zinc oxide. In one example, the second electrode E2 is made of indium zinc oxide.

In some embodiments, the second electrode E2 is in direct contact with at least one of the first connecting electrode CE1, the second connecting electrode CE2, or the third connecting electrode CE3. In one example, the second electrode E2 is in direct contact with the first connecting electrode CE1. In another example, the second electrode E2 is in direct contact with the second connecting electrode CE2. In another example, the second electrode E2 is in direct contact with the first connecting electrode CE1 and the second connecting electrode CE2. In another example, the second electrode E2 is in direct contact with the second connecting electrode CE2 and the third connecting electrode CE3. In another example, the second electrode E2 is in direct contact with the first connecting electrode CE1, the second connecting electrode CE2, and the third connecting electrode CE3.

In some embodiments, referring to FIG. 2 and FIG. 3, the auxiliary electrode AE is on a side of the first connecting electrode CE1 away from the second connecting electrode CE2. In one example, the auxiliary electrode AE is in a same layer as a source electrode S and a drain electrode D of a transistor in the display substrate.

In some embodiments, the display substrate includes a base substrate BS; a light shielding layer LSL on the base substrate, and comprising a light shield LS; a buffer layer BUF on a side of the light shielding layer LSL away from the base substrate BS; an active layer ACT on a side of the buffer layer BUF away from the base substrate BS, wherein an orthographic projection of the light shield LS on the base substrate BS at least partially overlaps with (e.g., completely covers) an orthographic projection of the active layer ACT on the base substrate BS: a gate insulating layer GI on a side of the active layer ACT away from the base substrate BS; a gate layer CT comprising a gate electrode G on a side of the gate insulating layer GI away from the base substrate BS; an inter-layer dielectric layer ILD on a side of the gate layer CT away from the base substrate BS; a signal line layer SL comprising a source electrode S, a drain electrode D, and an auxiliary electrode AE on a side of the inter-layer dielectric layer ILD away from the base substrate BS; a passivation layer PVX on a side of the signal line layer SL away from the base substrate BS; a planarization layer PLN on a side of the passivation layer PVX away from the base substrate BS: a pixel definition layer PDL, a light emitting element LE, and a connecting structure CS on a side of the planarization layer PLN away from the base substrate BS. The pixel definition layer PDL defines a subpixel aperture for receiving at least one sub-layer (e.g., a light emitting layer) of the organic layer OL.

Referring to FIG. 2 and FIG. 3, in some embodiments, the connecting structure CS further includes at least one of a residual organic layer ROL stacked on a side of the third connecting electrode CE3 away from the second connecting electrode CE2; or a residual second electrode RE2 stacked on a side of the residual organic layer ROL away from the third connecting electrode CE3. In one example as depicted in FIG. 2 and FIG. 3, the connecting structure CS includes a sequentially stacked structure comprising a first connecting electrode CE1, a second connecting electrode CE2 on the first connecting electrode CE1, a third connecting electrode CE3 on a side of the second connecting electrode CE2 away from the first connecting electrode CE1, a residual organic layer ROL on a side of the third connecting electrode CE3 away from the second connecting electrode CE2, and a residual second electrode RE2 on a side of the residual organic layer ROL away from the third connecting electrode CE3.

In some embodiments, the residual organic layer ROL is in a same layer as the organic layer OL, and at least partially (e.g., completely) segregated from the organic layer OL. Optionally, at least one sub-layer of the residual organic layer ROL and at least one sub-layer of the organic layer OL are in a same layer. In one example, the residual organic layer ROL includes a residual hole transport layer in a same layer as a hole transport layer of the organic layer OL. In another example, the residual organic layer ROL includes a residual hole injection layer in a same layer as a hole injection layer of the organic layer OL. In one example, the residual organic layer ROL includes a residual electron transport layer in a same layer as an electron transport layer of the organic layer OL, In another example, the residual organic layer ROL includes a residual electron injection layer in a same layer as an electron injection layer of the organic layer OL.

In some embodiments, the residual second electrode RE2 is in a same layer as the second electrode E2, and at least partially (e.g., completely) segregated from the second electrode E2.

Referring to FIG. 2 and FIG. 3, in some embodiments, the first connecting electrode CE1 extends through a via to connect with the auxiliary electrode AE. In one example depicted in FIG. 2 and FIG. 3, the via extends through the planarization layer PLN and the passivation layer PVX. As shown in FIG. 2 and FIG. 3, in some embodiments, an orthographic projection of the planarization layer PLN on a base substrate BS completely covers an orthographic projection of the first connecting electrode CE1 on the base substrate BS. Optionally, the orthographic projection of the planarization layer PLN on the base substrate BS completely covers an orthographic projection of the second connecting electrode CE2 on the base substrate BS. Optionally, the orthographic projection of the planarization layer PLN on the base substrate BS completely covers an orthographic projection of the third connecting electrode CE3 on the base substrate BS. Optionally, the orthographic projection of the planarization layer PLN on the base substrate BS completely covers an orthographic projection of the connecting structure CS on the base substrate BS.

In some embodiments, the connecting structure CS further includes at least one of a residual organic layer ROL or a residual second electrode RE2. Optionally, the orthographic projection of the planarization layer PLN on the base substrate BS completely covers an orthographic projection of the residual organic layer ROL on the base substrate BS, and completely covers an orthographic projection of the residual second electrode RE2 on the base substrate BS.

By having the orthographic projection of the planarization layer PLN on the base substrate BS completely covers the orthographic projection of the connecting structure CS on the base substrate BS, the connecting structure CS (e.g., layers of the connecting structure CS) are formed on a planarized surface. The connecting structure CS can be made to have a substantially flat morphology, obviating damages to the organic layer OL caused by protrusions of the connecting structure CS.

Figure 4:
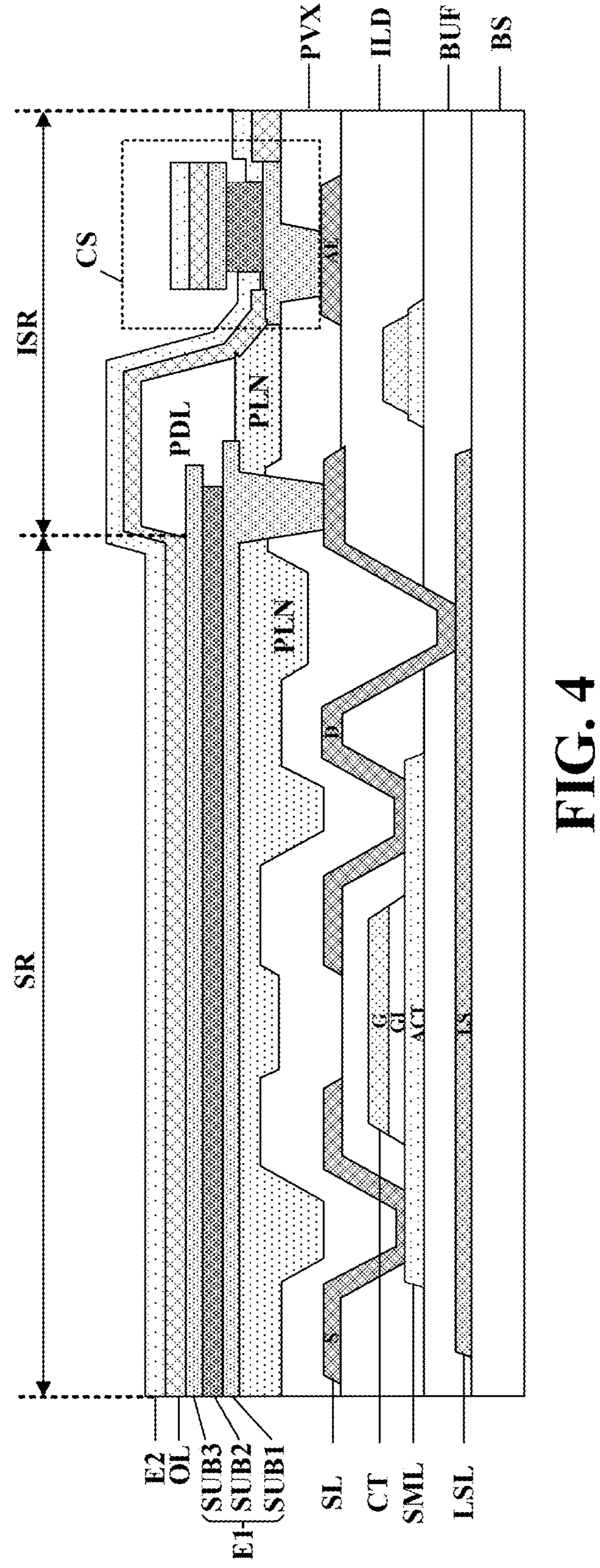
FIG. 4 is a cross-sectional view of a display substrate in some embodiments according to the present disclosure.
Figure 5:
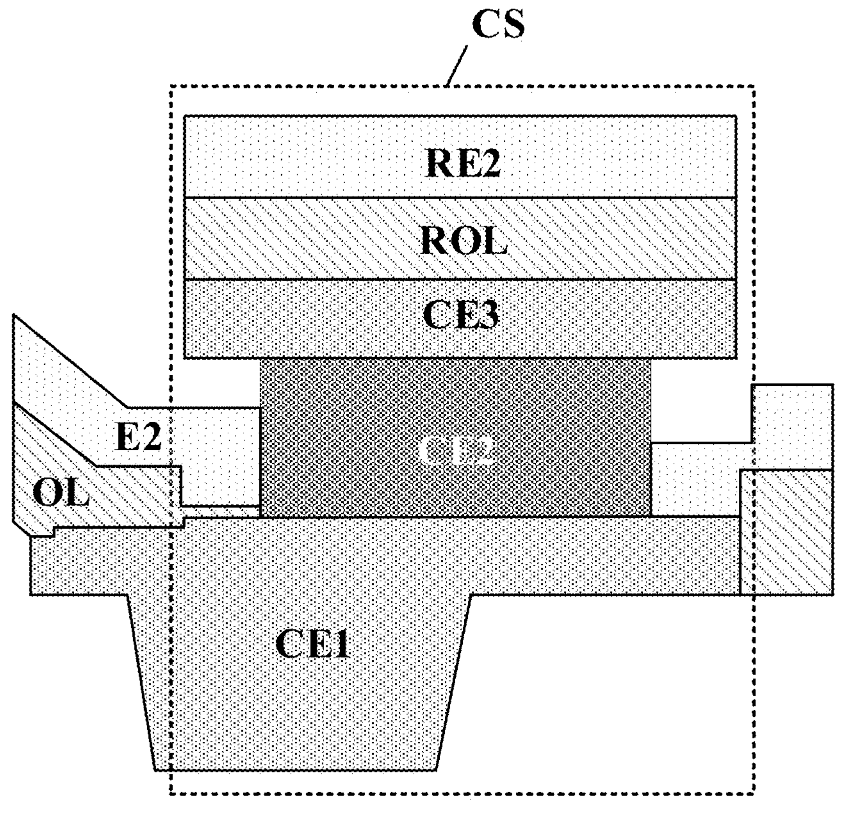
FIG. 5 is a schematic diagram illustrating the structure of a connecting structure in some embodiments according to the present disclosure.

FIG. 4 is a cross-sectional view of a display substrate in some embodiments according to the present disclosure. FIG. 5 is a schematic diagram illustrating the structure of a connecting structure in some embodiments according to the present disclosure. Referring to FIG. 4 and FIG. 5, in some embodiments, the first connecting electrode CE1 extends through a via to connect with the auxiliary electrode AE. In one example depicted in FIG. 4, the via extends through the passivation layer PVX but not the planarization layer PLN. As shown in FIG. 4 and FIG. 5, in some embodiments, an orthographic projection of the planarization layer PLN on a base substrate BS is non-overlapping with an orthographic projection of the first connecting electrode CE1 on the base substrate BS. Optionally, the orthographic projection of the planarization layer PLN on the base substrate BS is non-overlapping with an orthographic projection of the second connecting electrode CE2 on the base substrate BS. Optionally, the orthographic projection of the planarization layer PLN on the base substrate BS is non-overlapping with an orthographic projection of the third connecting electrode CE3 on the base substrate BS. Optionally, the orthographic projection of the planarization layer PLN on the base substrate BS is non-overlapping with an orthographic projection of the connecting structure C'S on the base substrate BS.

In some embodiments, the connecting structure CS further includes at least one of a residual organic layer ROL or a residual second electrode RE2. Optionally, the orthographic projection of the planarization layer PLN on the base substrate BS is non-overlapping with an orthographic projection of the residual organic layer ROL on the base substrate BS, and is non-overlapping with an orthographic projection of the residual second electrode RE2 on the base substrate BS.

By having the orthographic projection of the planarization layer PLN on the base substrate BS non-overlapping with an orthographic projection of the connecting structure CS on the base substrate BS, the connecting structure CS (e.g., layers of the connecting structure CS) are formed having a relatively smaller height with respect to the base substrate BS. When the substrate is subject to brush cleaning during the fabricating process, edges of the connecting structure CS is less prone to be damages. Intact edges of the connecting structure CS can ensure segregation of the residual organic layer ROL from the organic layer OL, and segregation of the residual second electrode RE2 from the second electrode E2.

Figure 6:
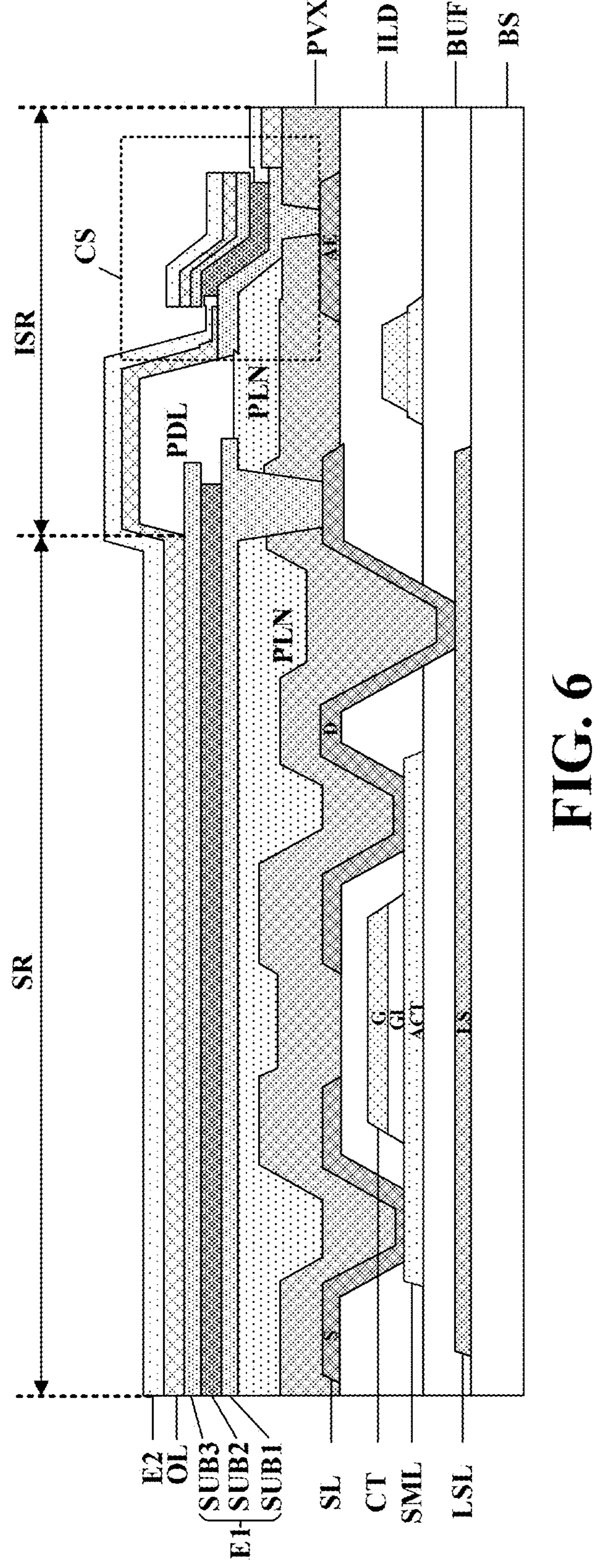
FIG. 6 is a cross-sectional view of a display substrate in some embodiments according to the present disclosure.
Figure 7:
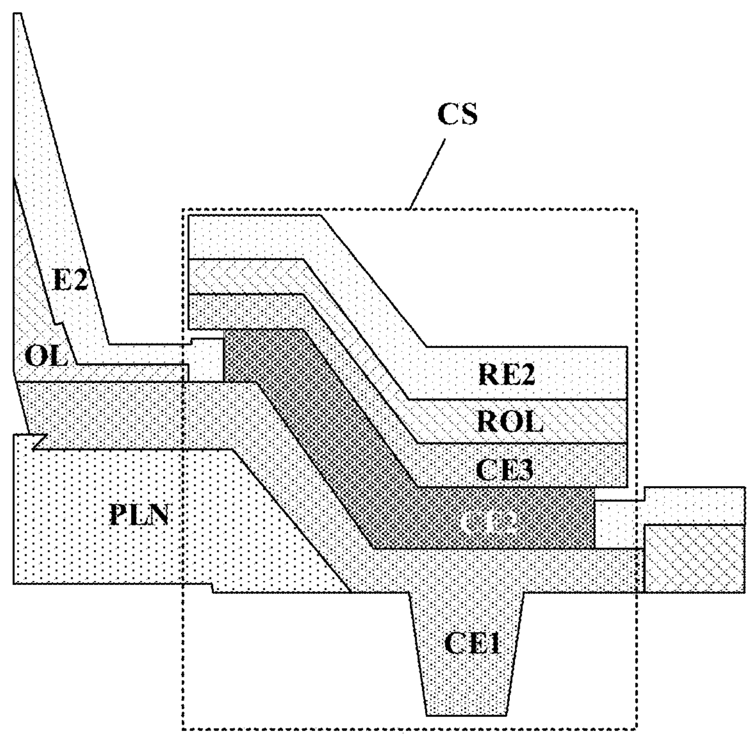
FIG. 7 is a schematic diagram illustrating the structure of a connecting structure in some embodiments according to the present disclosure.

FIG. 6 is a cross-sectional view of a display substrate in some embodiments according to the present disclosure. FIG. 7 is a schematic diagram illustrating the structure of a connecting structure in some embodiments according to the present disclosure. Referring to FIG. 6 and FIG. 7, the first connecting electrode CE1 extends through a via to connect with the auxiliary electrode AE. In one example depicted in FIG. 6 and FIG. 7, the via extends through the passivation layer PVX but not the planarization layer PLN. As shown in FIG. 6 and FIG. 7, in some embodiments, an orthographic projection of the planarization layer PLN on a base substrate BS only partially overlaps with an orthographic projection of the first connecting electrode CE1 on the base substrate BS. Optionally, the orthographic projection of the planarization layer PLN on the base substrate BS only partially overlaps with an orthographic projection of the second connecting electrode CE2 on the base substrate BS. Optionally, the orthographic projection of the planarization layer PLN on the base substrate BS only partially overlaps with an orthographic projection of the third connecting electrode CE3 on the base substrate BS. Optionally, the orthographic projection of the planarization layer PLN on the base substrate BS only partially overlaps with an orthographic projection of the connecting structure CS on the base substrate BS.

In some embodiments, the connecting structure CS further includes at least one of a residual organic layer ROL or a residual second electrode RE2. Optionally, the orthographic projection of the planarization layer PLN on the base substrate BS only partially overlaps with an orthographic projection of the residual organic layer ROL on the base substrate BS, and only partially overlaps with an orthographic projection of the residual second electrode RE2 on the base substrate BS.

By having the orthographic projection of the planarization layer PLN on the base substrate BS only partially overlaps with an orthographic projection of the connecting structure CS on the base substrate BS, the edges of the connecting structure CS may be maintained substantially intact when the substrate is subject to brush cleaning during the fabricating process, ensuring segregation of the residual organic layer ROL from the organic layer OL, and segregation of the residual second electrode RE2 from the second electrode E2. At the same time, the connecting structure CS may be made without large protrusions that may damage the organic layer OL.

Figure 8:
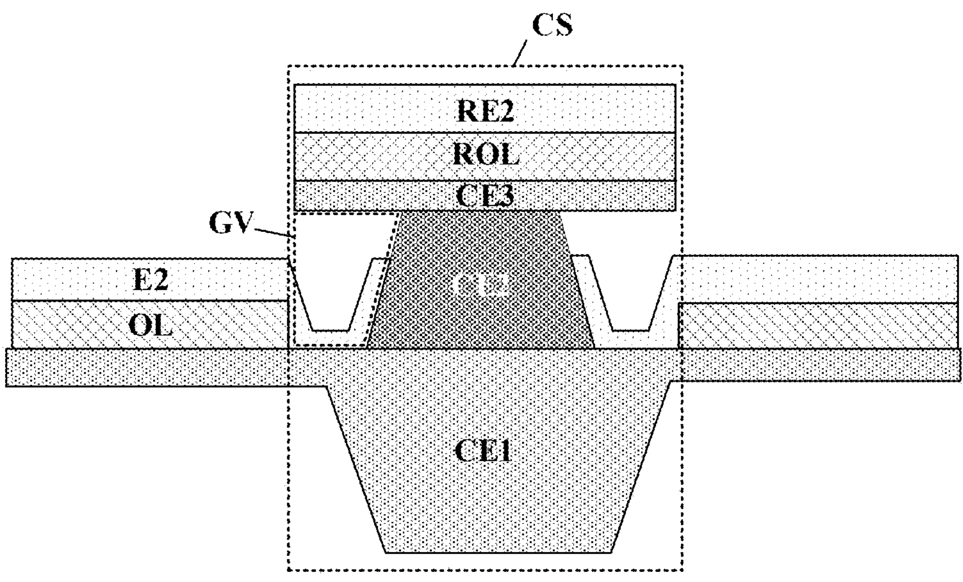
FIG. 8 is a schematic diagram illustrating the structure of a connecting structure in some embodiments according to the present disclosure.

FIG. 8 is a schematic diagram illustrating the structure of a connecting structure in some embodiments according to the present disclosure. Referring to FIG. 8, FIG. 2, FIG. 4, and FIG. 6, in some embodiments, the second connecting electrode CE2 includes an upper surface in contact with the third connecting electrode CE3, a lower surface in contact with the first connecting electrode CE1 and opposite to the upper surface. In some embodiments, a cross-section along a plane intersecting the first connecting electrode CE1, the second connecting electrode CE2, and the third connecting electrode CE3, and perpendicular to a main surface of the base substrate BS (e.g., a cross-section as shown in any of FIG. 2 to FIG. 7) includes a top side located within the upper surface and a bottom side located within the lower surface, an orthographic projection of the bottom side on the base substrate BS covers an orthographic projection of the top side on the base substrate BS.

Having the auxiliary electrode AE further reduces the voltage drop across the extension path of the second electrode E2 when the display substrate is in operation. Accordingly, the second electrode can be made relatively thinner, thereby increasing light transmittance of the display substrate. In the present display substrate, the orthographic projection of the bottom side of the cross-section of the second connecting electrode CE2 on the base substrate BS covers the orthographic projection of the top side of the cross-section of the second connecting electrode CE2 on the base substrate BS. In some embodiments, the second connecting electrode CE2 has a slope structure located between its upper and lower surfaces, as described further below, and this slope structure facilitates the achievement of a larger contact area between the second electrode E2 and the connecting structure CS, reducing the contact resistance between the second electrode E2 and the connecting structure CS, further effectively reducing the voltage drop across the extension path of the second electrode E2 during operation of the display substrate. Accordingly, excessive voltage drop across the second electrode E2 can be obviated, light transmittance of the display substrate can be further improved by making the second electrode E2 thinner, further enhancing the brightness uniformity of the image displayed by the display substrate.

As discussed above, the orthographic projection of the auxiliary electrode AE on the base substrate BS is non-overlapping with the orthographic projection of the subpixel region SR on the base substrate BS, thereby minimizing the effect of the auxiliary electrode AE on light emission in the subpixel region SR. The auxiliary electrode AE and the connecting structure CS may have various appropriate relative positional relationship. In one example, the orthographic projection of the auxiliary electrode AE on the base substrate BS is non-overlapping with the orthographic projection of the connecting structure CS on the base substrate BS. In another example, the orthographic projection of the auxiliary electrode AE on the base substrate BS is at least partially overlapping with the orthographic projection of the connecting structure CS on the base substrate BS, to increase aperture ratio of the display substrate. The auxiliary electrode AE is in a layer (e.g., the signal line layer SL) on a side of the organic layer OL closer to the base substrate BS, to obviate adverse effects of the auxiliary electrode AE on the light emitting layer of the organic layer OL.

In some embodiments, an orthographic projection of the first connecting electrode CE1 on the base substrate BS completely covers an orthographic projection of the third connecting electrode CE3 on the base substrate BS; and an orthographic projection of the second connecting electrode CE2 on the base substrate BS does not exceed the orthographic projection of the third connecting electrode CE3 on the base substrate BS. In one example, in a cross-section along a plane intersecting the first connecting electrode CE1, the second connecting electrode CB2, and the third connecting electrode CE3, and perpendicular to a main surface of the base substrate BS (e.g., a cross-section as shown in any of FIG. 2 to FIG. 8), the first connecting electrode CE1, the second connecting electrode CE2, and the third connecting electrode CE3 have a I shape, which is conducive for forming a stable and effective connection between the second electrode E2 and the connecting structure CS.

In some embodiments, the second connecting electrode CE2 includes an upper surface in contact with the third connecting electrode CE3, a lower surface in contact with the first connecting electrode CE1 and opposite to the upper surface. In some embodiments, a cross-section along a plane intersecting the first connecting electrode CE1, the second connecting electrode CE2, and the third connecting electrode CE3, and perpendicular to a main surface of the base substrate BS (e.g., a cross-section as shown in any of FIG. 2 to FIG. 7) includes a top side located within the upper surface, a bottom side located within the lower surface, and a lateral side connecting the top side and the bottom side. The lateral side and the lower surface intersect at an intersection point within the lower surface. An included angle between a line from any point on the lateral side to the intersection point and the lower surface is less than or equal to 90 degrees, wherein an opening of the included angle is facing the second connecting electrode CE2. A slope structure of the second connecting electrode CE2 having the included angle is conducive for allowing the material of the second electrode E2 to spread onto the lateral side of the second connecting electrode CE2 during the fabrication process of the display substrate, facilitating the achievement of a larger contact area between the second electrode E2 and the second connecting electrode CE2.

Figure 9A:
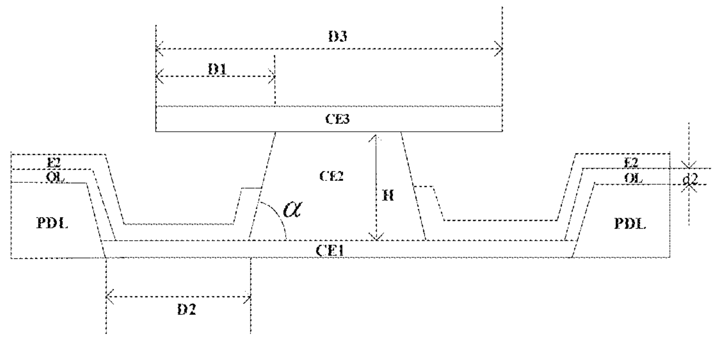
FIG. 9A is a cross-sectional view of a connecting structure in some embodiments according to the present disclosure.

FIG. 9A is a cross-sectional view of a connecting structure in some embodiments according to the present disclosure. Referring to FIG. 9A, the second connecting electrode CE2 has a cross-section perpendicular to its upper and lower surfaces, a height of the cross-section along a vertical direction being H. The cross-section of the second connecting electrode CE2 includes a top side located in the upper surface, a bottom side located in the lower surface, and a lateral side connecting the top side to the bottom side. The lateral side and the bottom side intersect to form an acute angle $\alpha$. The acute angle $\alpha$ shown in FIG. 9A is an example of the aforementioned included angle.

Figure 9B:
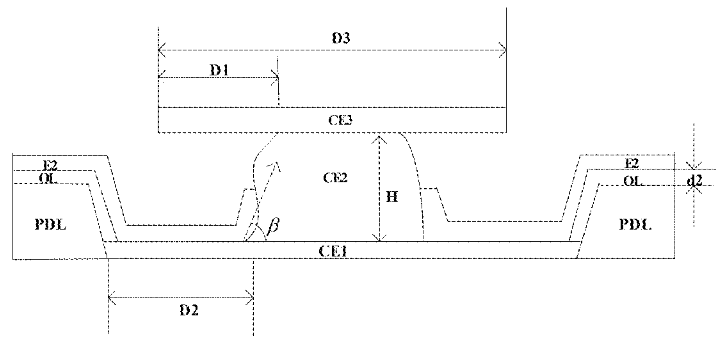
FIG. 9B is a cross-sectional view of a connecting structure in some embodiments according to the present disclosure.

The lateral side of the second connecting electrode CE2 may have any appropriate morphology. In one example, the lateral side may be substantially flat. In another example, the lateral side may be uneven or irregular. FIG. 9B is a cross-sectional view of a connecting structure in some embodiments according to the present disclosure. Referring to FIG. 9B, the lateral side is uneven. The lateral side and the lower surface intersect to form an acute angle $\beta$.

The inventors of the present disclosure discover, through extensive experiments, that degrees of the included angle can affect the effective connection between the second electrode E2 and the second connecting electrode CE2. A relatively small included angle may lead to occurrence of bulge on the second connecting electrode CE2, preventing or reducing effective connection between the second electrode E2 and the second connecting electrode CE2, The inventors of the present disclosure discover, through extensive experiments, an included angle in a range between 45 degrees and 70 degrees is optimal for avoiding bulge on the second connecting electrode CE2 and forming effective connection between the second electrode E2 and the second connecting electrode CE2.

The cross-section of the second connecting electrode CE2 may have various appropriate shapes. In one example depicted in FIG. 9A, the cross-section of the second connecting electrode CE2 has a trapezoidal shape.

Referring to FIG. 2, FIG. 4, and FIG. 6, the display substrate in some embodiments further includes a pixel definition layer PDL surrounding the subpixel region SR. Optionally; an orthographic projection of the planarization layer PLN on a base substrate BS at least partially overlaps with (e.g., at least 30%, at least 40%, at least 50%, at least 60%, at least 70%, at least 80%, at least 90%, at least 95%, or at least 99%) an orthographic projection of the pixel definition layer PDL on the base substrate BS. Optionally, an orthographic projection of the pixel definition layer PDL on the base substrate BS is non-overlapping with an orthographic projection of the second connecting electrode CE2 on the base substrate BS, and is non-overlapping with an orthographic projection of the third connecting electrode CE3 on the base substrate BS.

In some embodiments, the second electrode E2 extends from the subpixel region SR, over the pixel definition layer PDL, and into the inter-subpixel region ISR to be in direct contact with at least one of the first connecting electrode CE1, the second connecting electrode CE2, or the third connecting electrode CE3.

In some embodiments, at least one sub-layer of the organic layer OL extends from the subpixel region SR, over the pixel definition layer PDL, and into the inter-subpixel region ISR.

In some embodiments, the display substrate includes a stacked structure comprising the pixel definition layer PDL; a portion of at least one sub-layer of the organic layer OL on the pixel definition layer PDL and in direct contact with the pixel definition layer PDL; and a portion of the second electrode E2 on a side of the portion of at least one sub-layer of the organic layer OL away from the pixel definition layer PDL, and in direct contact with the portion of at least one sub-layer of the organic layer OL. Optionally, an orthographic projection of the second electrode E2 on the base substrate BS at least partially overlaps with (e.g., completely covers) an orthographic projection of the pixel definition layer PDL on the base substrate BS. Optionally, an orthographic projection of the at least one sub-layer of the organic layer OL on the base substrate BS at least partially overlaps with (e.g., completely covers) an orthographic projection of the pixel definition layer PDL on the base substrate BS.

In some embodiments, referring to FIG. 8, the connecting structure CS has an open groove GV formed between the first connecting electrode CE1, the second connecting electrode CE2, and the third connecting electrode CE3. The second electrode E2 extends at least partially into the open groove GV to be in direct contact with at least one of the first connecting electrode CE1, the second connecting electrode CE2, or the third connecting electrode CE3.

In some embodiments, an orthographic projection of the third connecting electrode CE3 on a base substrate BS covers an orthographic projection of the open groove GV on the base substrate BS, and at least partially overlaps with (e.g., completely covers) an orthographic projection of the second connecting electrode CE2 on the base substrate BS. Optionally, an orthographic projection of the first connecting electrode CE1 on the base substrate BS covers an orthographic projection of the open groove GV on the base substrate BS, and at least partially overlaps with (e.g., completely covers) an orthographic projection of the second connecting electrode CE2 on the base substrate BS. Optionally, the orthographic projection of the third connecting electrode CE3 on the base substrate BS partially overlaps with an orthographic projection of the second electrode E2 on the base substrate BS.

In some embodiments, referring to FIG. 2, FIG. 4, FIG. 6, and FIG. 8, the open groove GV has an open side open toward the pixel definition layer PDL, The second electrode E2 extends through the open side into the open groove GV to be in direct contact with at least one of the first connecting electrode CE1, the second connecting electrode CE2, or the third connecting electrode CE3.

In some embodiments, the open groove has an upper wall, a lower wall and a side wall. The upper wall of the open groove GV is formed by a portion of the third connecting electrode CE3 that extends towards the pixel definition layer PDL and not in direct contact with the second connecting electrode CE2. The lower wall is formed by a portion of the first connecting electrode CE1 that extends towards the pixel definition layer PDL and not in direct contact with the second connecting electrode CE2. The side wall is formed by a portion of the second connecting electrode CE2. The upper wall extends along a horizontal direction parallel to a main surface of the base substrate BS for a first length, the lower wall extends along the horizontal direction parallel to the main surface of the base substrate BS for a second length. Optionally, the second length is greater than the first length.

Referring to FIG. 9A and FIG. 9B, the first length is denoted as D1, and the second length is denoted as D2. The presence of the open groove GV in the connecting structure facilitates the extension of the material of the second electrode E2 into the open groove GV and to be in direct contact with the third connecting electrode CE3 during the fabrication of the display substrate, further reducing the voltage drop across the second electrode E2 during operation of the display substrate.

In some embodiments, the second length D2 is from 4 to 10 times of the first length D1. In one example, the second length D2 is approximately 5 μm, while the first length D1 is between 0.5 μm and 1.2 μm. The inventors of the present disclosure discover that these ranges ensures that the second electrode E2 may extend inside the open groove GV to be in direct contact with at least one of the lower wall and the side wall of the open groove GV, increasing the contact area between the second electrode E2 and the first connecting electrode CE1, or between the second electrode E2 and the second connecting electrode CE2, further reducing the voltage drop across the extension path of the second electrode E2 during the operation of the display substrate.

In some embodiments, the third connecting electrode CE3 extends along a horizontal direction parallel to the surface direction of the base substrate BS for a third length D3. Optionally, the third length D3 is in a range between 12 μm and 14 μm.

In some embodiments, the first length D1 is 1 to 2 times of a height of the second connecting electrode CE2 in the second direction, the second direction being a vertical direction perpendicular to the horizontal direction. This may facilitate the process of making the display substrate by preventing too much material of the light-emitting layer EL from entering the open groove GV. The height of the second connecting electrode CE2 in the second direction is denoted as H in FIG. 9A and FIG. 9B. In some embodiments, the height H is between 0.5 μm and 0.6 μm, and a height d2 of the organic layer OL in the second direction is approximately 3200 Å. As shown in FIG. 9A and FIG. 9B, at least part of the organic layer OL in the sub-pixel area may extend beyond the pixel definition layer PDL to the auxiliary electrode connection area. Optionally, the height H of the second connecting electrode CE2 in the second direction is 1.5 to 2 times of the height d2 of the organic layer OL in the second direction.

Figure 10A:
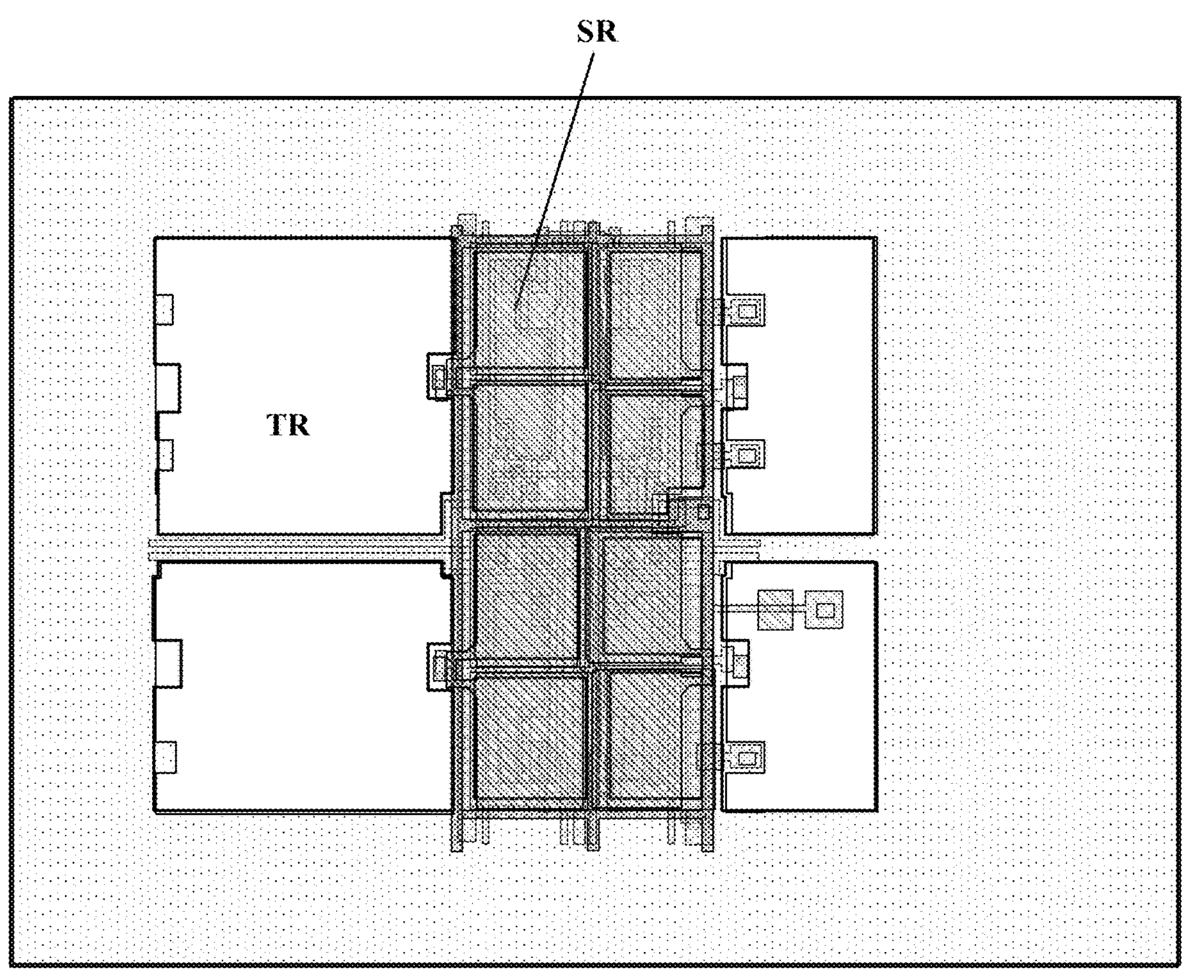
FIG. 10A illustrates the structure of a portion of a display substrate in some embodiments according to the present disclosure.
Figure 10B:
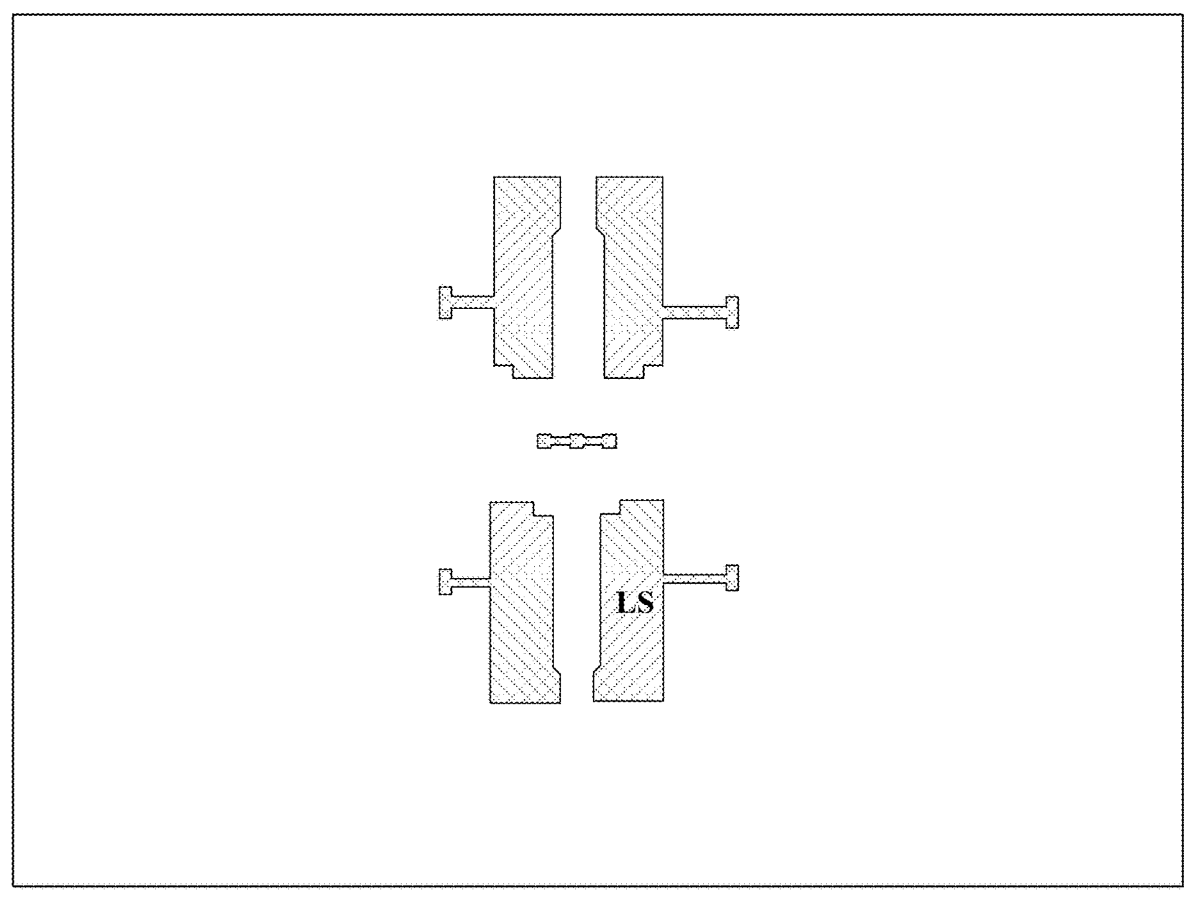
FIG. 10B illustrates the structure of a light shielding layer in the portion of a display substrate depicted in FIG. 10A.
Figure 10C:
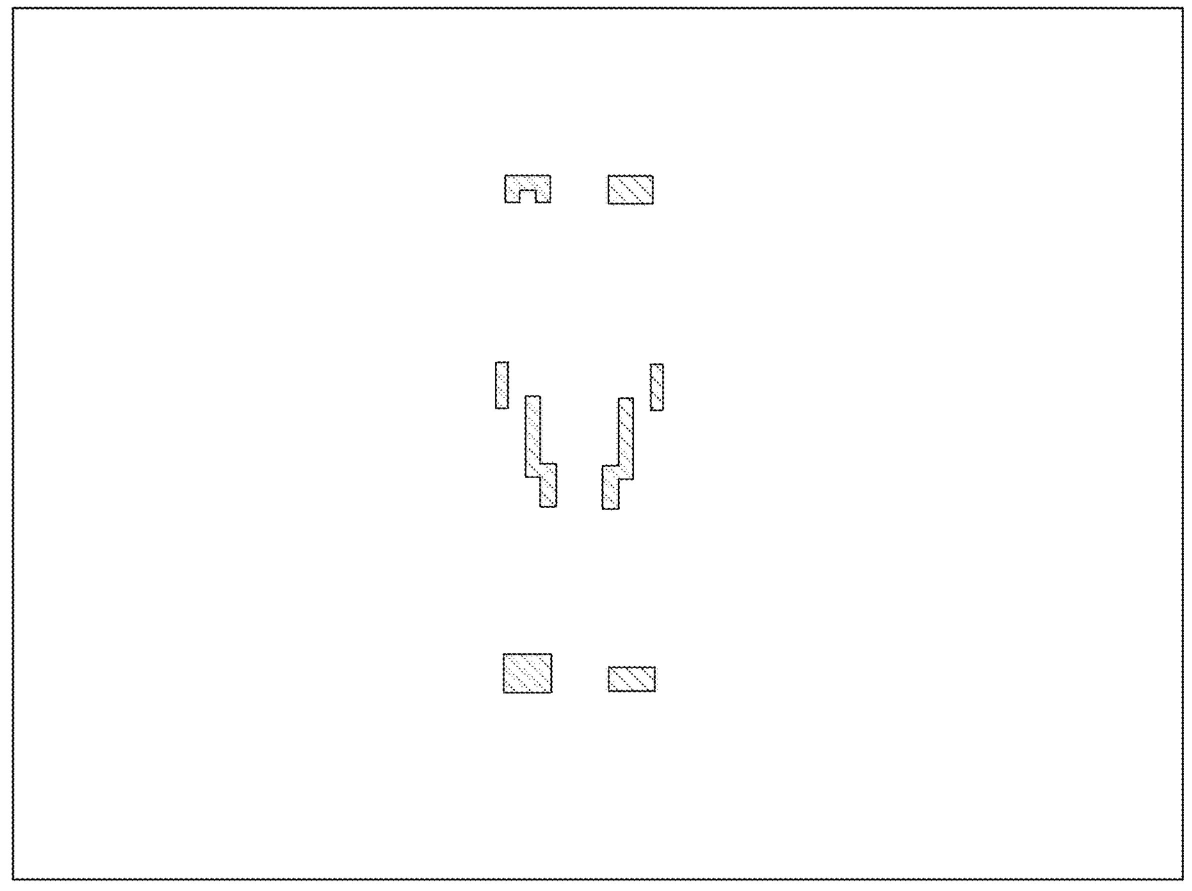
FIG. 10C illustrates the structure of a semiconductor material layer in the portion of a display substrate depicted in FIG. 10A.
Figure 10D:
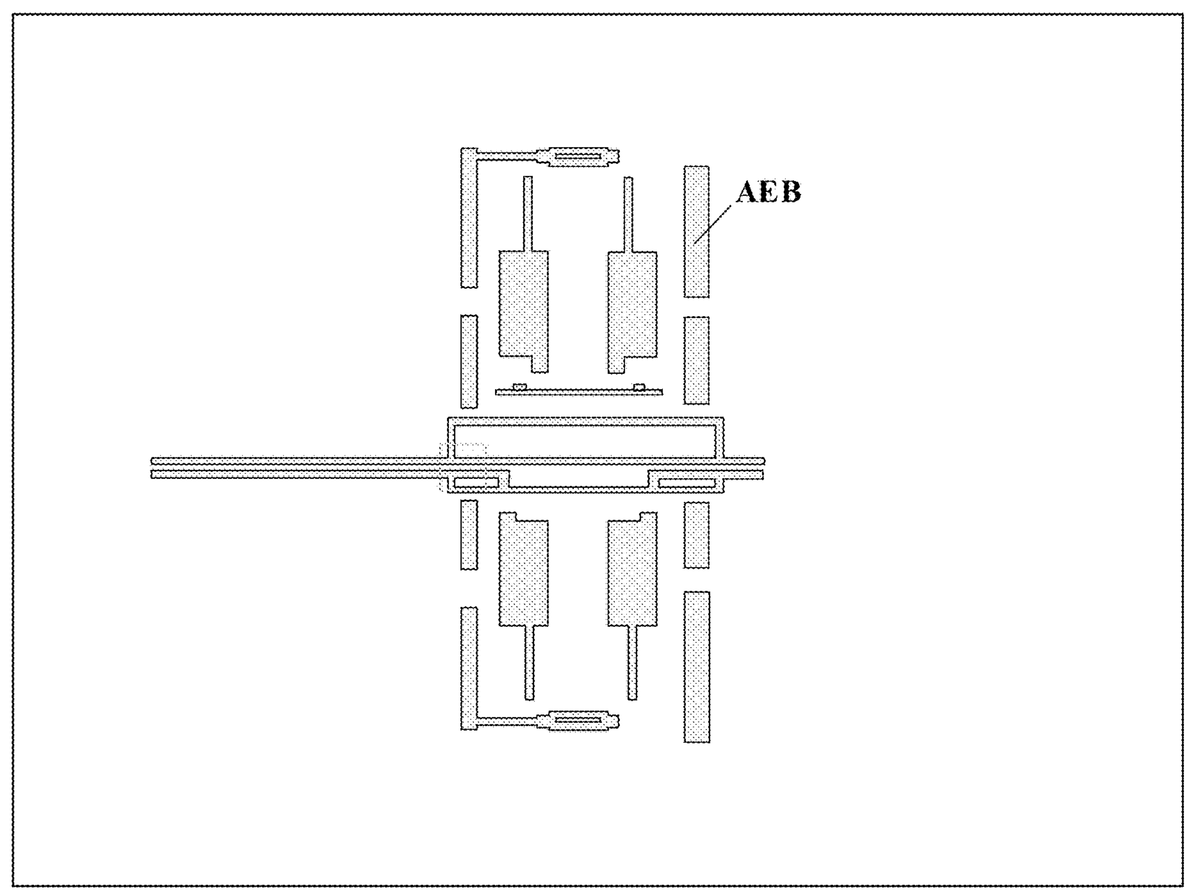
FIG. 10D illustrates the structure of a gate layer in the portion of a display substrate depicted in FIG. 10A.
Figure 10E:
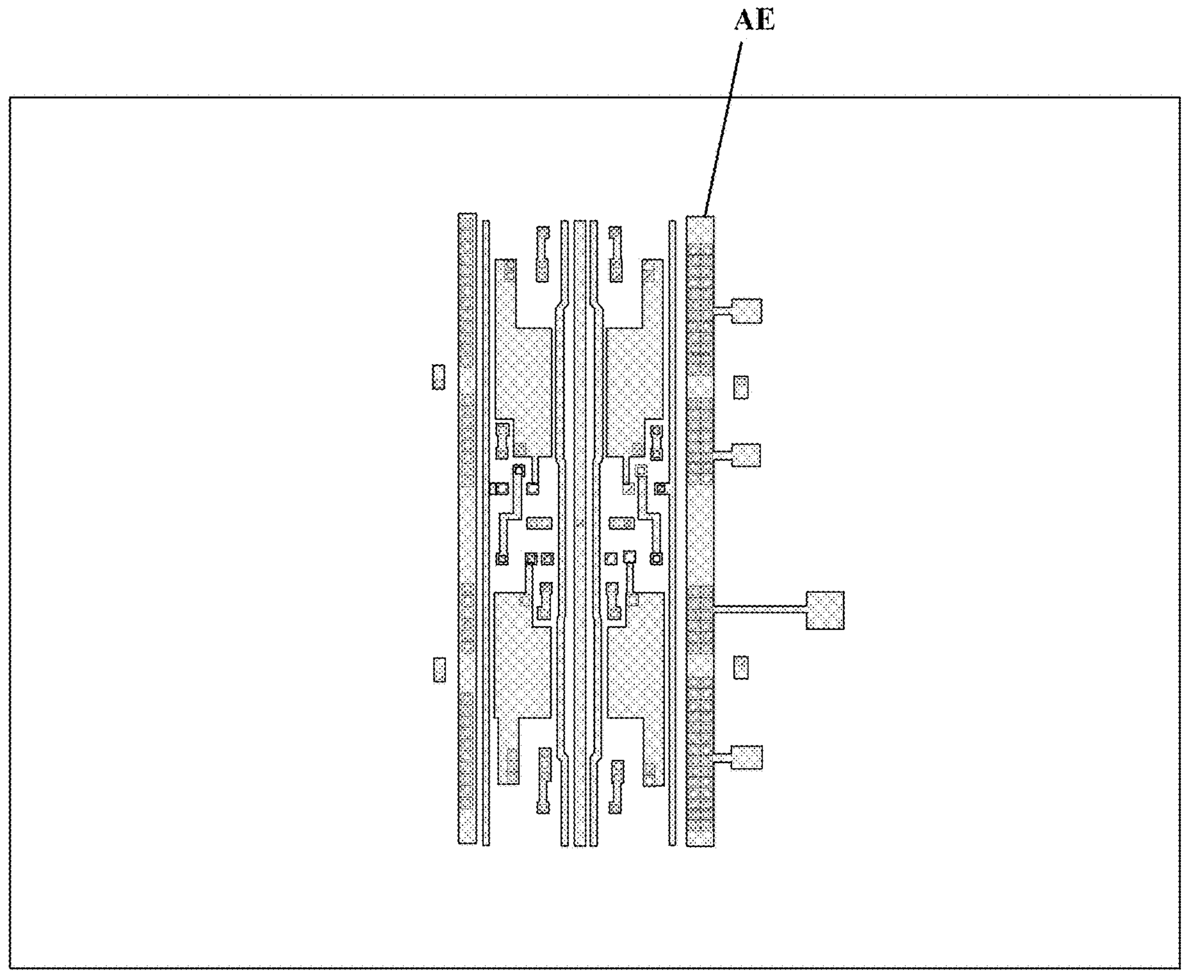
FIG. 10E illustrates the structure of a signal line layer in the portion of a display substrate depicted in FIG. 10A.
Figure 10F:
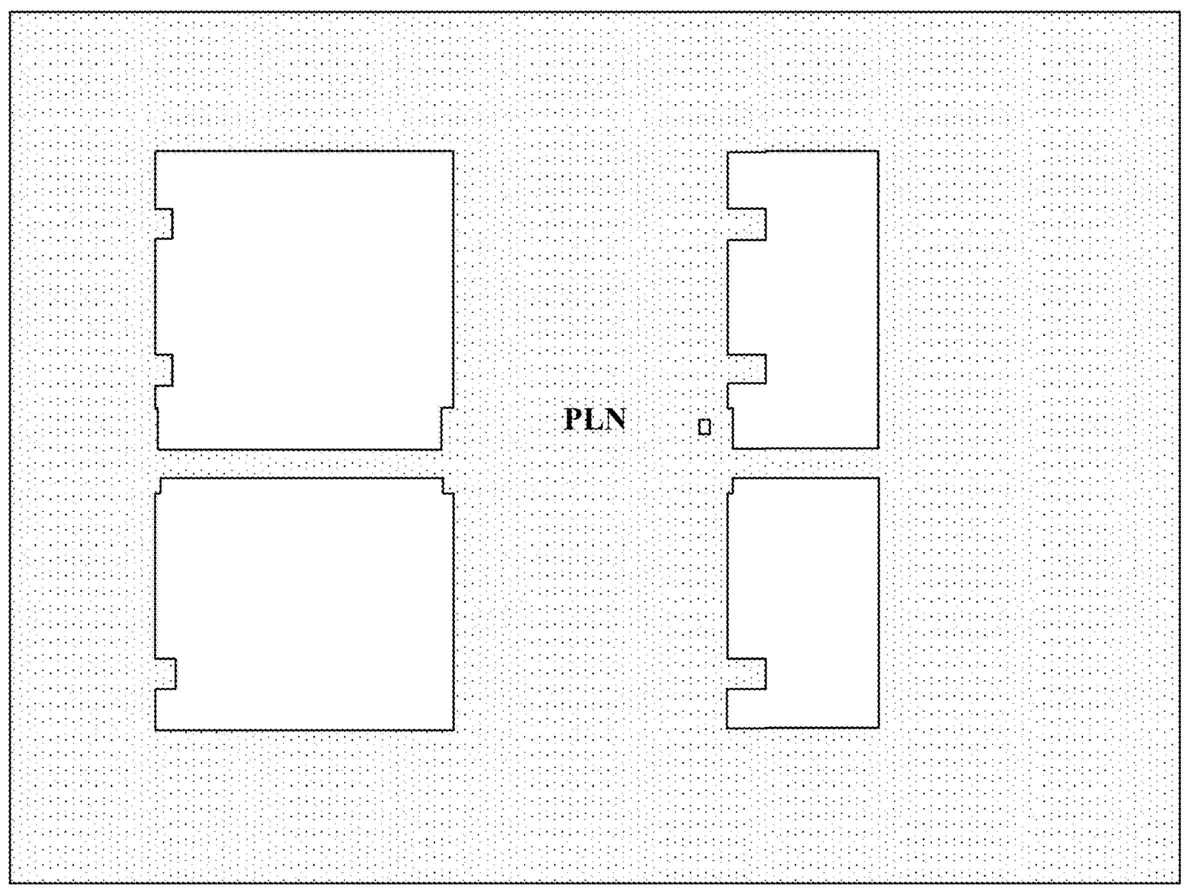
FIG. 10F illustrates the structure of a planarization layer in the portion of a display substrate depicted in FIG. 10A.
Figure 10G:
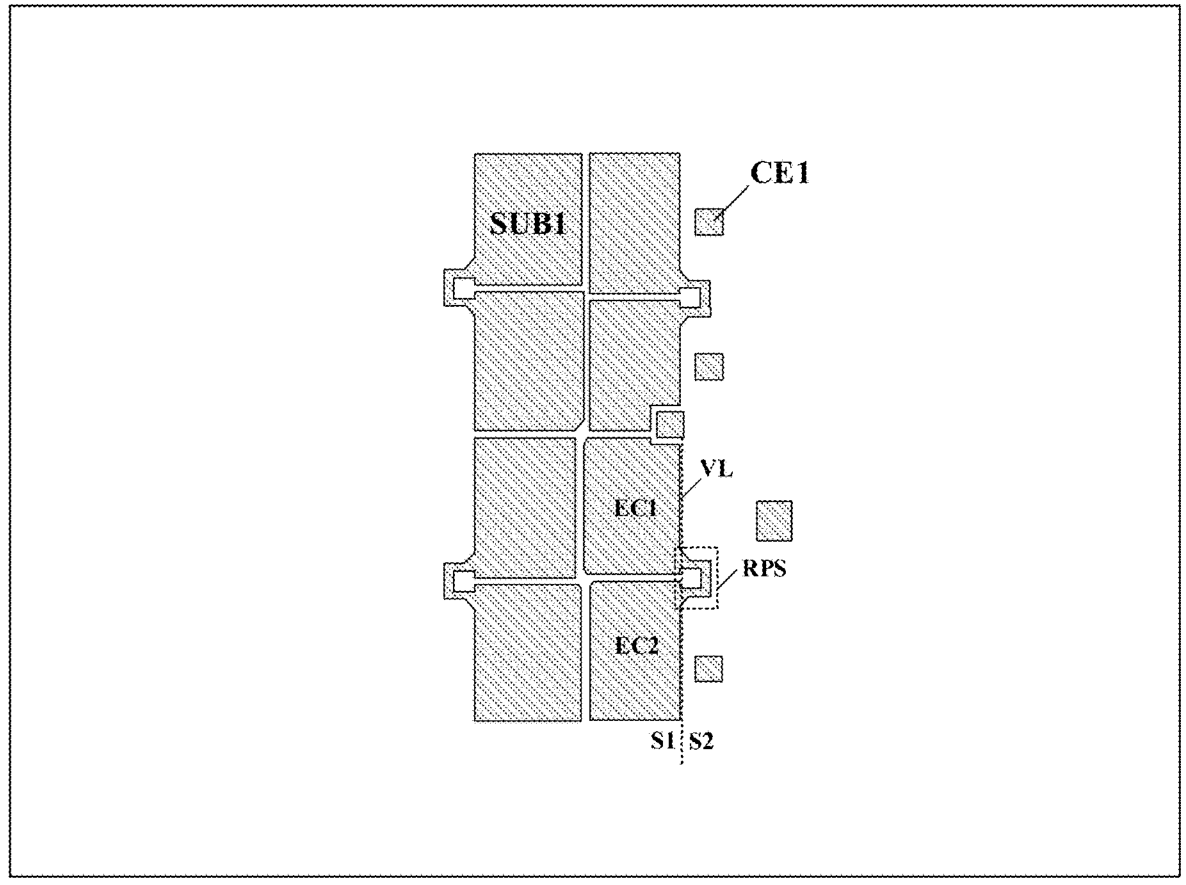
FIG. 10G illustrates the structure of a first conductive layer in the portion of a display substrate depicted in FIG. 10A.
Figure 10H:
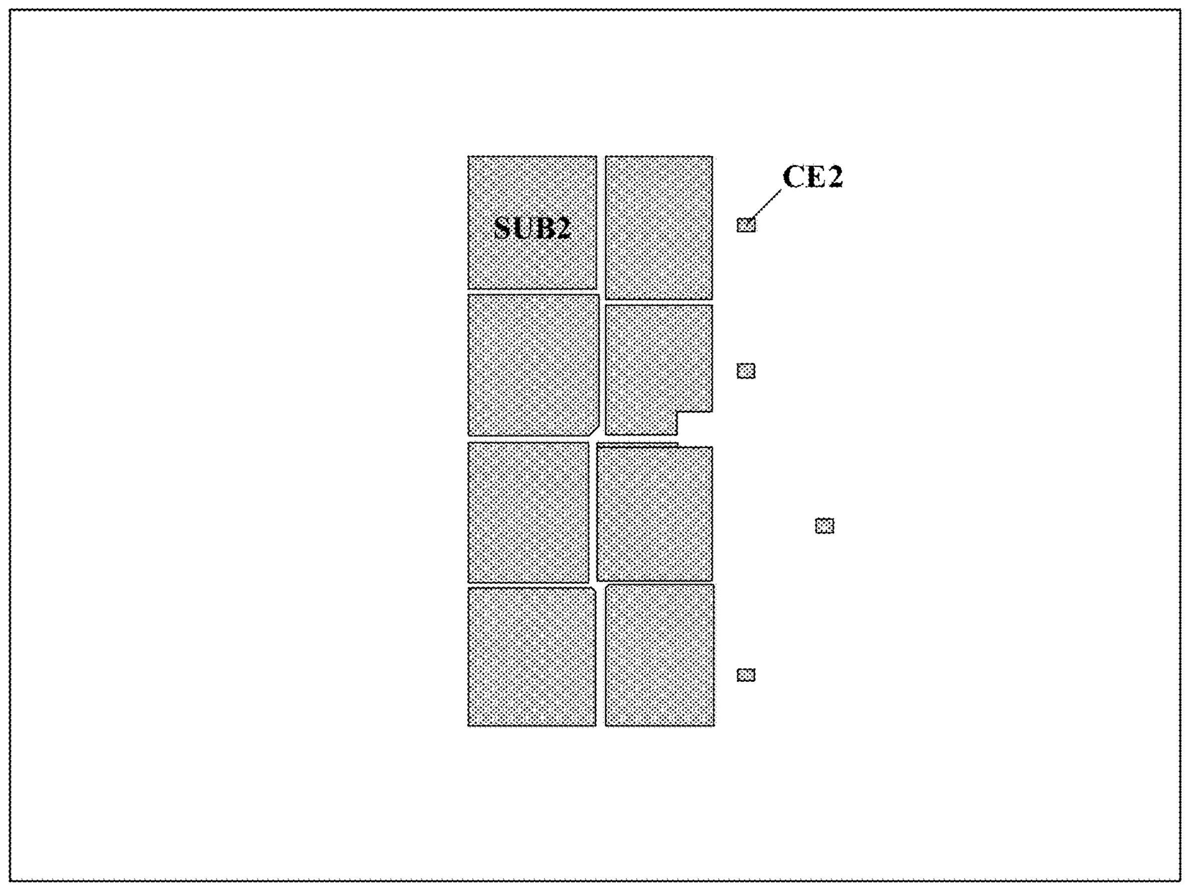
FIG. 10H illustrates the structure of a second conductive layer in the portion of a display substrate depicted in FIG. 10A.
Figure 10I:
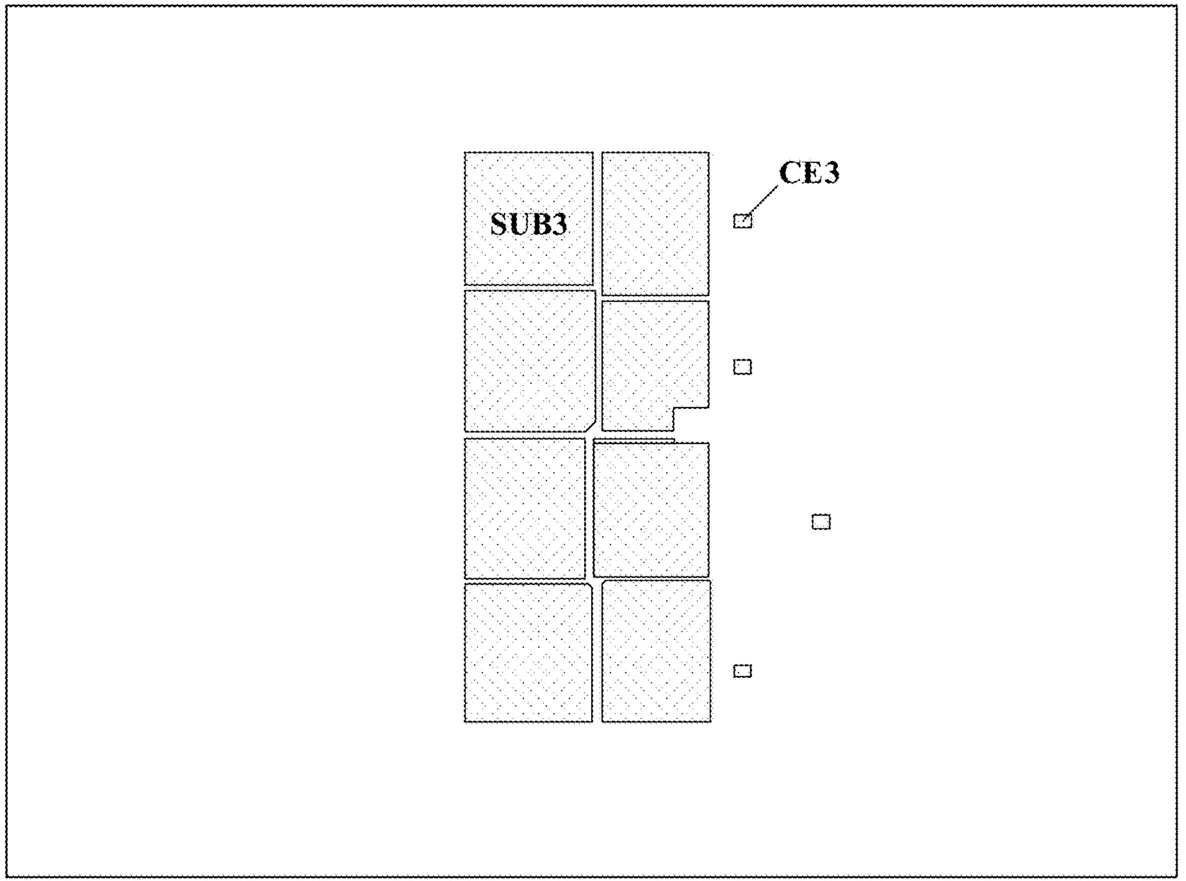
FIG. 10I illustrates the structure of a third conductive layer in the portion of a display substrate depicted in FIG. 10A.
Figure 10J:
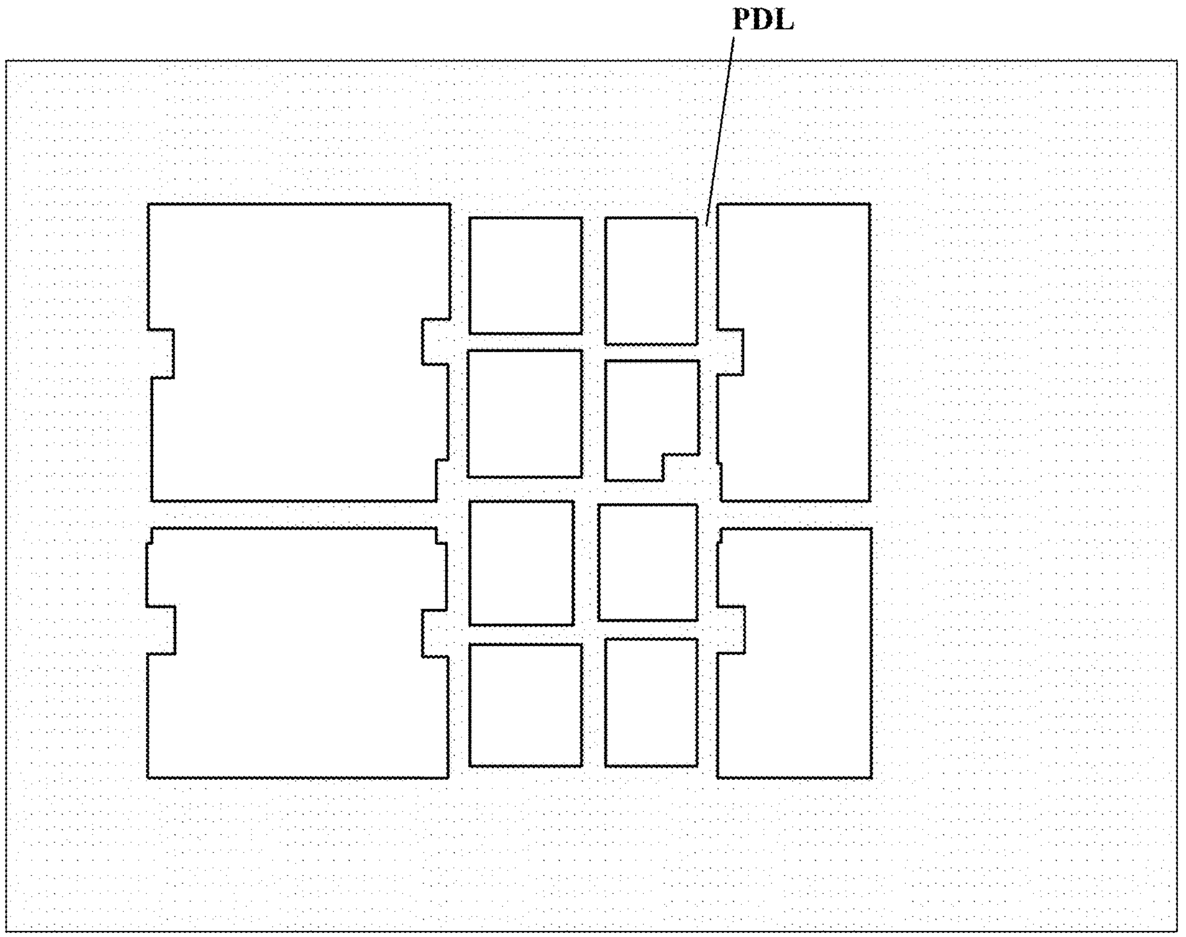
FIG. 10J illustrates the structure of a pixel definition layer in the portion of a display substrate depicted in FIG. 10A.
Figure 10K:
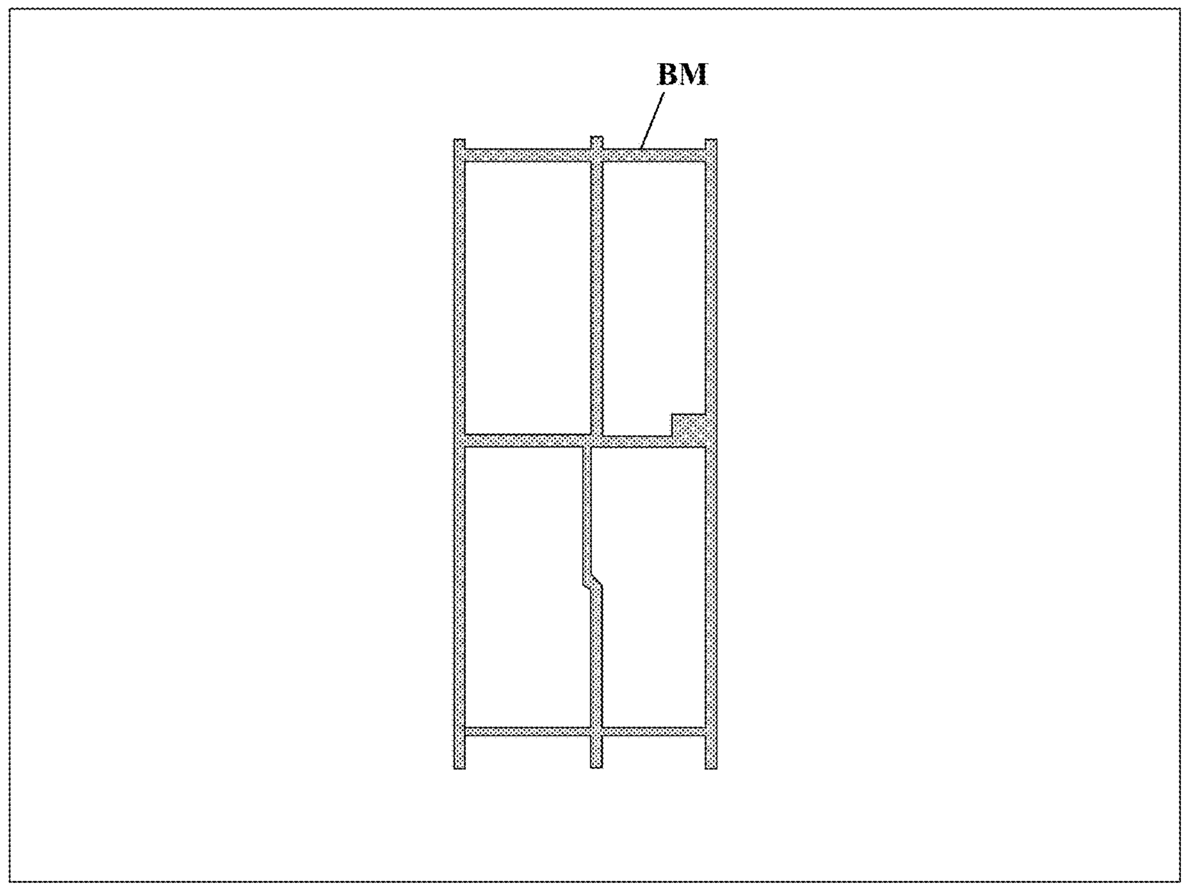
FIG. 10K illustrates the structure of a black matrix layer in the portion of a display substrate depicted in FIG. 10A.

FIG. 10A illustrates the structure of a portion of a display substrate in some embodiments according to the present disclosure. FIG. 10B illustrates the structure of a light shielding layer in the portion of a display substrate depicted in FIG. 10A. FIG. 10C illustrates the structure of a semiconductor material layer in the portion of a display substrate depicted in FIG. 10A. FIG. 10D illustrates the structure of a gate layer in the portion of a display substrate depicted in FIG. 10A. FIG. 10E illustrates the structure of a signal line layer in the portion of a display substrate depicted in FIG. 10A. FIG. 10F illustrates the structure of a planarization layer in the portion of a display substrate depicted in FIG. 10A. FIG. 10G illustrates the structure of a first conductive layer in the portion of a display substrate depicted in FIG. 10A. FIG. 10H illustrates the structure of a second conductive layer in the portion of a display substrate depicted in FIG. 10A. FIG. 10I illustrates the structure of a third conductive layer in the portion of a display substrate depicted in FIG. 10A. FIG. 10J illustrates the structure of a pixel definition layer in the portion of a display substrate depicted in FIG. 10A. FIG. 10K illustrates the structure of a black matrix layer in the portion of a display substrate depicted in FIG. 10A. Referring to FIG. 10A to FIG. 10K, the display substrate includes a subpixel region SR and an inter-subpixel region outside the subpixel region SR. Each individual subpixel region corresponds to an individual subpixel. In the inter-subpixel region, the display substrate further includes a transparent region TR allowing a viewer to see through.

Figure 11A:
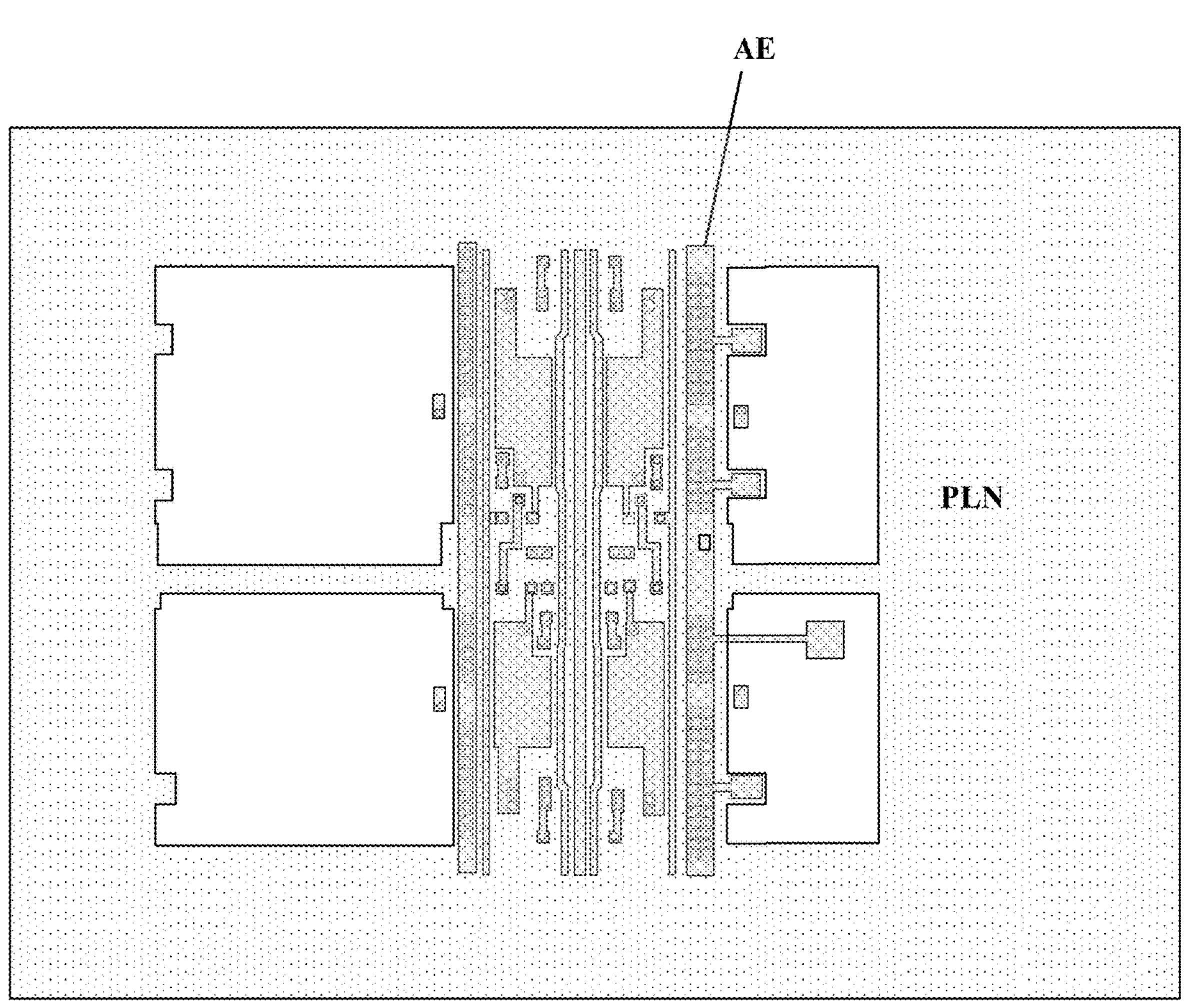
FIG. 11A illustrates the structure of a planarization layer and a signal line layer in the portion of a display substrate depicted in FIG. 10A.

As shown in FIG. 10A to FIG. 10K, the auxiliary electrode AE in some embodiments extends at least partially in one or more subpixels. Optionally, the auxiliary electrode AE extends at least partially in a plurality of subpixels in a plurality of subpixel regions, as shown in FIG. 10A. FIG. 11A illustrates the structure of a planarization layer and a signal line layer in the portion of a display substrate depicted in FIG. 10A. Referring to FIG. 11A, in some embodiments, an orthographic projection of the planarization layer PLN on a base substrate at least partially overlaps with an orthographic projection of the auxiliary electrode AE on the base substrate. In the display substrate depicted in FIG. 10A to FIG. 10K, and FIG. 11A, the orthographic projection of the planarization layer PLN on a base substrate completely covers the orthographic projection of the auxiliary electrode AE on the base substrate.

Figure 12A:
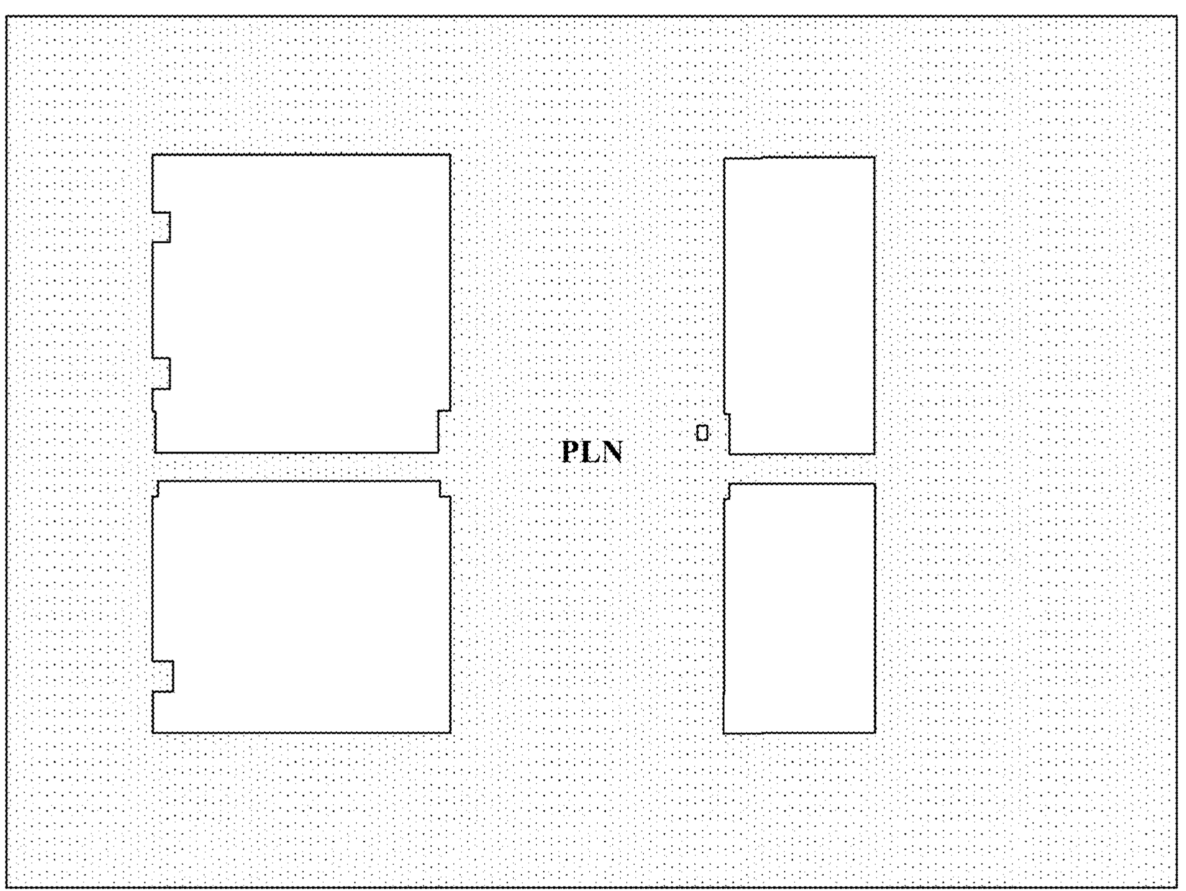
FIG. 12A illustrates the structure of a planarization layer in the portion of a display substrate in some embodiments according to the present disclosure.
Figure 12B:
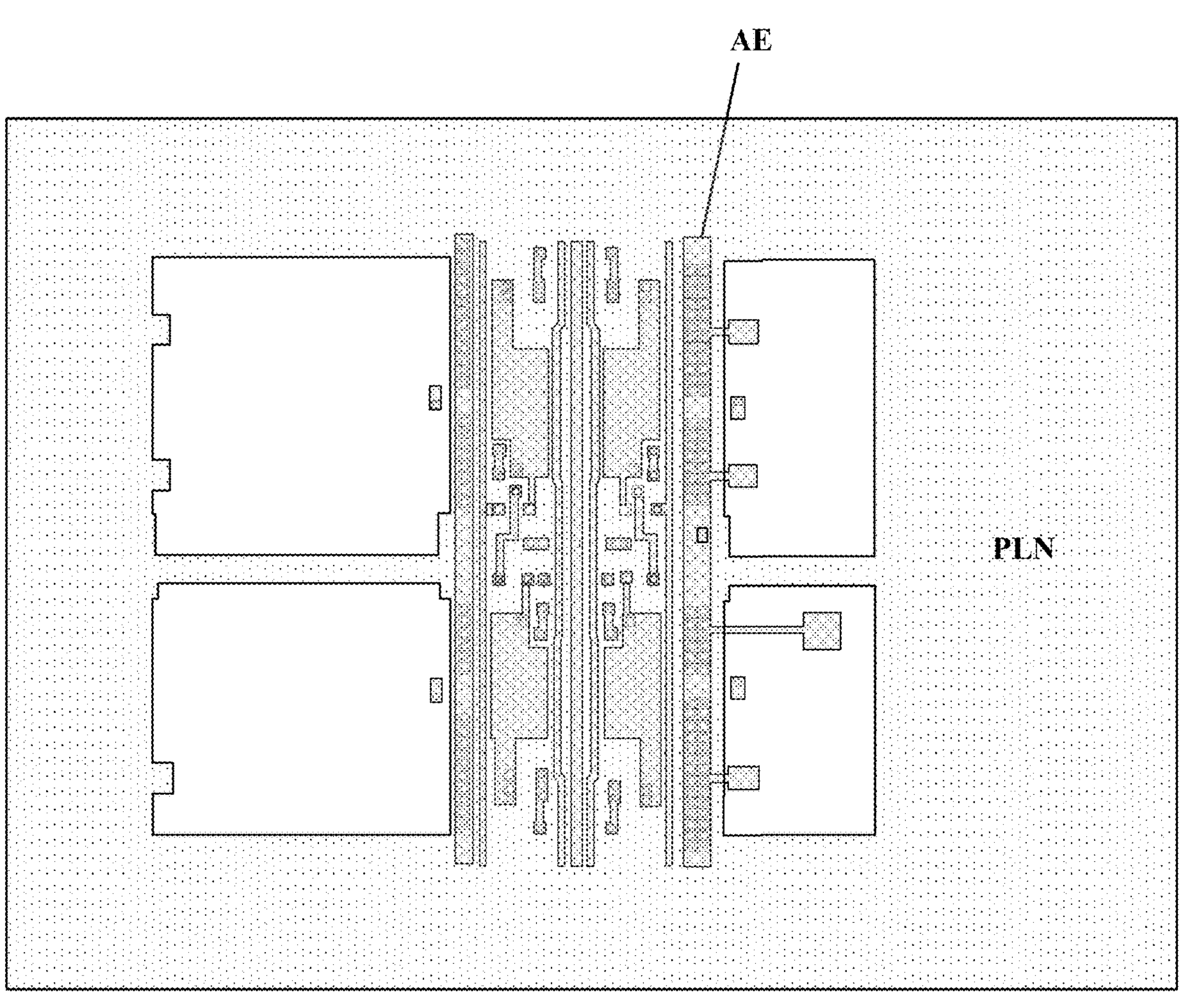
FIG. 12B illustrates the structure of a planarization layer and a signal line layer in the portion of a display substrate in some embodiments according to the present disclosure.
Figure 13A:
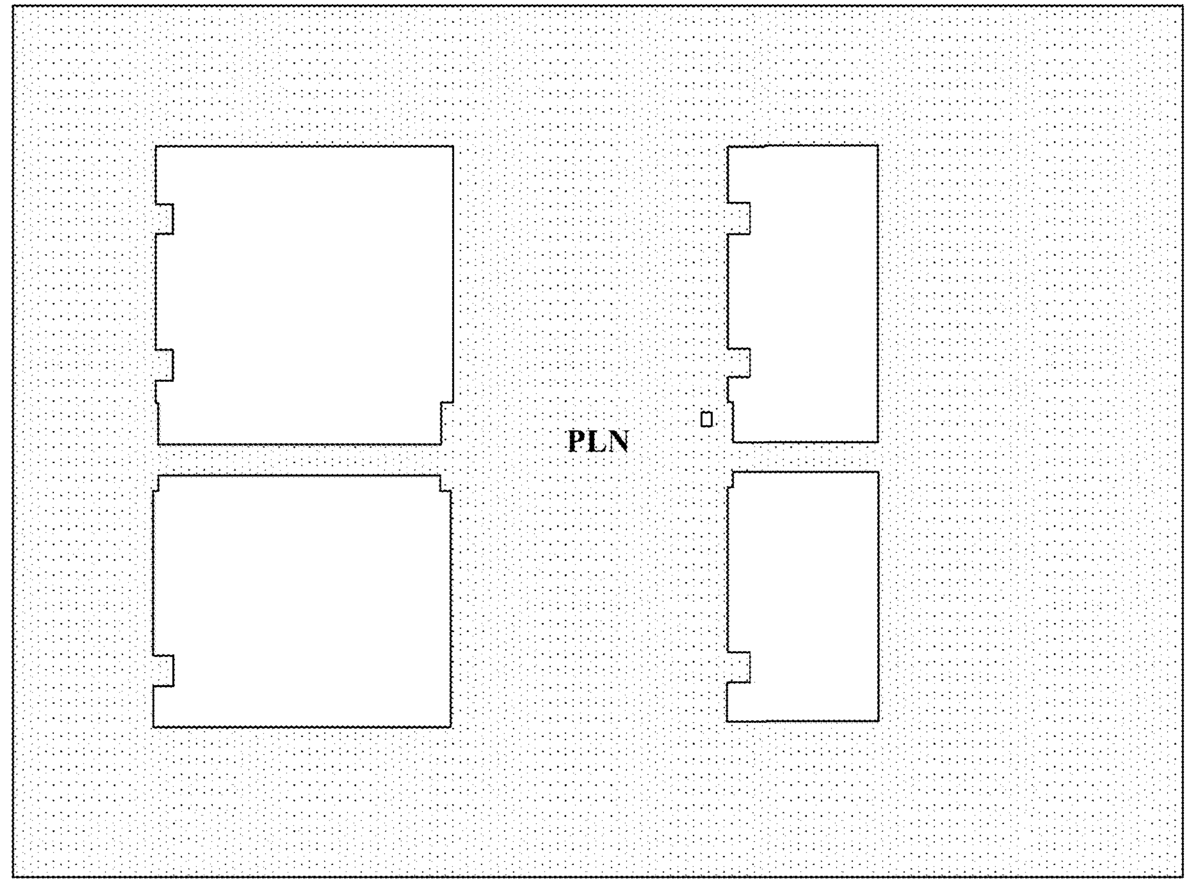
FIG. 13A illustrates the structure of a planarization layer in the portion of a display substrate in some embodiments according to the present disclosure.
Figure 13B:
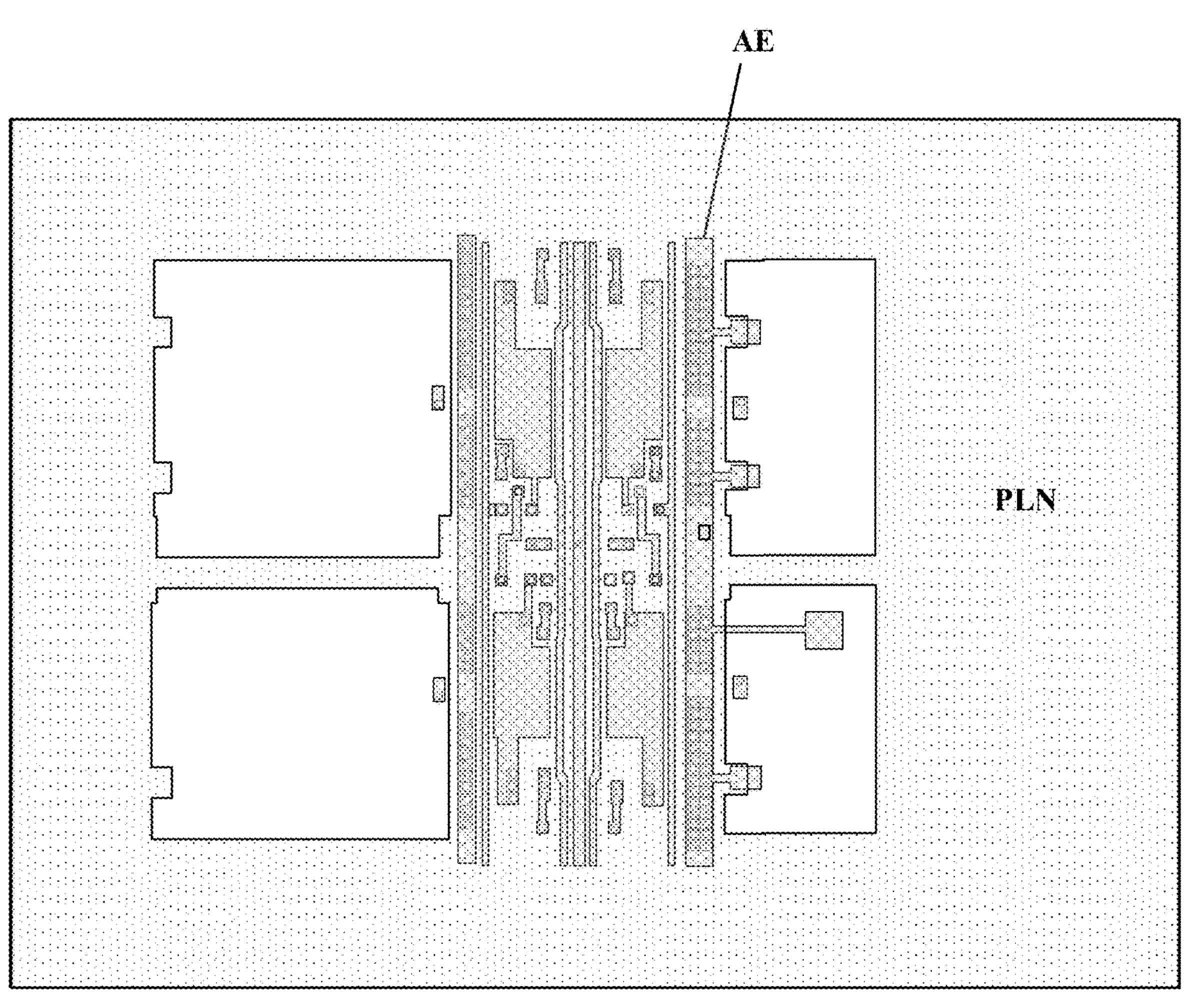
FIG. 13B illustrates the structure of a planarization layer and a signal line layer in the portion of a display substrate in some embodiments according to the present disclosure.

FIG. 12A illustrates the structure of a planarization layer in the portion of a display substrate in some embodiments according to the present disclosure. FIG. 12B illustrates the structure of a planarization layer and a signal line layer in the portion of a display substrate in some embodiments according to the present disclosure. FIG. 13A illustrates the structure of a planarization layer in the portion of a display substrate in some embodiments according to the present disclosure. FIG. 13B illustrates the structure of a planarization layer and a signal line layer in the portion of a display substrate in some embodiments according to the present disclosure. Referring to FIG. 12A, FIG. 12B, FIG. 13A, and FIG. 13B, in some embodiments, the orthographic projection of the planarization layer PLN on a base substrate only partially overlaps with the orthographic projection of the auxiliary electrode AE on the base substrate.

Figure 11B:
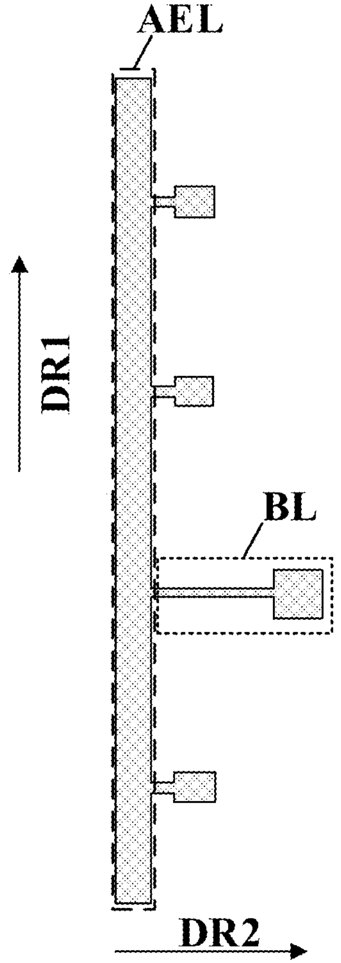
FIG. 11B illustrates the structure of an auxiliary electrode in some embodiments according to the present disclosure.

FIG. 11B illustrates the structure of an auxiliary electrode in some embodiments according to the present disclosure. Referring to FIG. 11B, in some embodiments, the auxiliary electrode includes an auxiliary electrode line AEL extending along a first direction DR1 through a plurality of subpixels; and a branch line BL extending from the auxiliary electrode line AEL along a second direction DR2. The second direction DR2 is different from the first direction DR1.

Referring to FIG. 2, FIG. 4, FIG. 6, FIG. 10A to FIG. 10K, FIG. 11A, and FIG. 11B, in some embodiments, the first connecting electrode CE1 extends through a via to connect to the branch line BL. Optionally, an orthographic projection of the first connecting electrode CE1 on a base substrate BS partially overlaps with an orthographic projection of the branch line BL on the base substrate BS, and is non-overlapping with an orthographic projection of the auxiliary electrode line AEL on the base substrate BS.

Figure 11C:
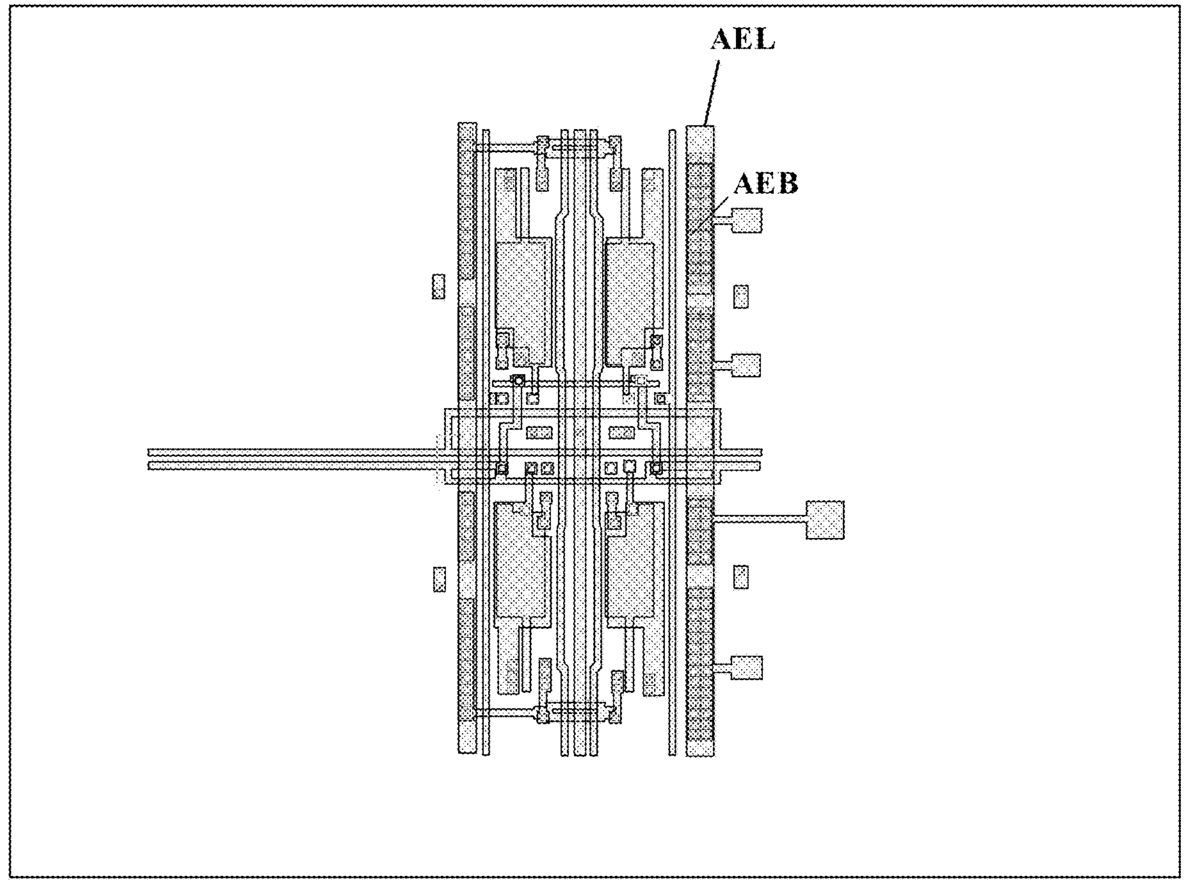
FIG. 11C illustrates the structure of a gate layer and a signal line layer in the portion of a display substrate depicted in FIG. 10A.
Figure 11D:
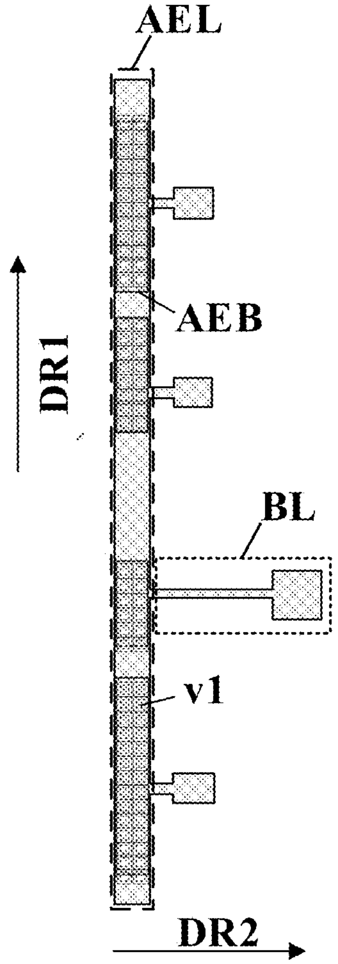
FIG. 11D illustrates the structure of an auxiliary electrode in some embodiments according to the present disclosure.

In some embodiments, the auxiliary electrode further includes one or more auxiliary electrode blocks AEB in a layer different from the auxiliary electrode line AEL. In one example, the one or more auxiliary electrode blocks AEB is in the gate layer, and the auxiliary electrode line AEL is in the signal line layer. FIG. 11C illustrates the structure of a gate layer and a signal line layer in the portion of a display substrate depicted in FIG. 10A. FIG. 11D illustrates the structure of an auxiliary electrode in some embodiments according to the present disclosure. Referring to FIG. 11C and FIG. 11D, the auxiliary electrode line AEL is connected to the one or more auxiliary electrode blocks AEB through one or more vias v1. Optionally, the one or more auxiliary electrode blocks AEB are arranged along the first direction DR1. Optionally, an orthographic projection of the auxiliary electrode line AEL on the base substrate at least partially overlaps with an orthographic projection of the one or more auxiliary electrode blocks AEB on the base substrate.

Referring to FIG. 2, FIG. 4, FIG. 6, and FIG. 11D, the display substrate in some embodiments includes an inter-layer dielectric layer ILD between the gate layer CT and the signal line layer SL. Optionally, the auxiliary electrode line AEL is on a side of the inter-layer dielectric layer ILD away from the one or more auxiliary electrode blocks AEB. Optionally, the auxiliary electrode line AEL is connected to the one or more auxiliary electrode blocks AEB through one or more vias v1 extending through the inter-layer dielectric layer ILD.

Figure 11E:
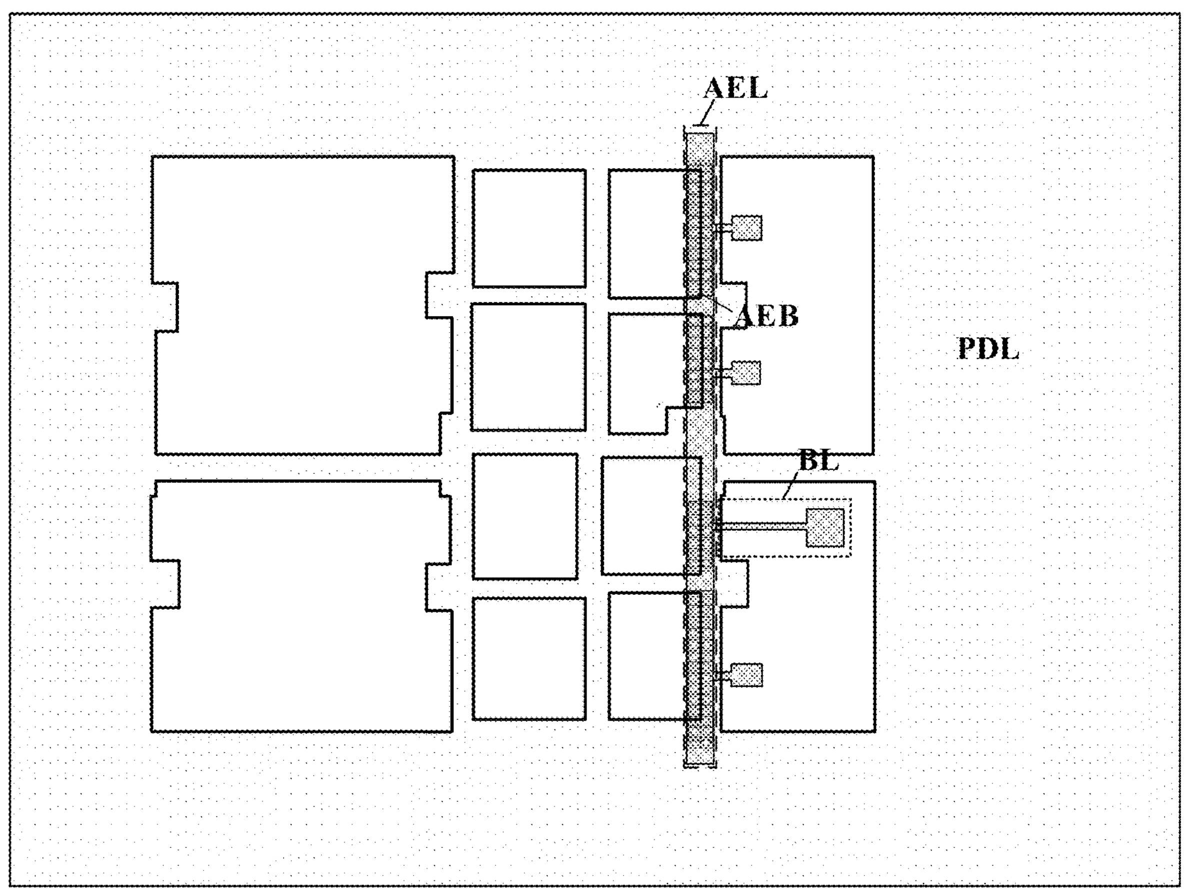
FIG. 11E illustrates the structure of a pixel definition layer and an auxiliary electrode in some embodiments according to the present disclosure.

FIG. 11E illustrates the structure of a pixel definition layer and an auxiliary electrode in some embodiments according to the present disclosure, Referring to FIG. 11E, FIG. 2, FIG. 4, and FIG. 6, in some embodiments, an orthographic projection of the pixel definition layer PDL on a base substrate partially overlaps with an orthographic projection of the auxiliary electrode line AEL on the base substrate BS, and is non-overlapping with an orthographic projection of the first connecting electrode CE1 on the base substrate BS. Optionally, the orthographic projection of the pixel definition layer PDL on a base substrate partially overlaps with an orthographic projection of the one or more auxiliary electrode blocks AEB on the base substrate BS. Optionally, the orthographic projection of the pixel definition layer PDL on a base substrate is at least partially non-overlapping with an orthographic projection of the branch line on the base substrate BS.

Figure 11F:
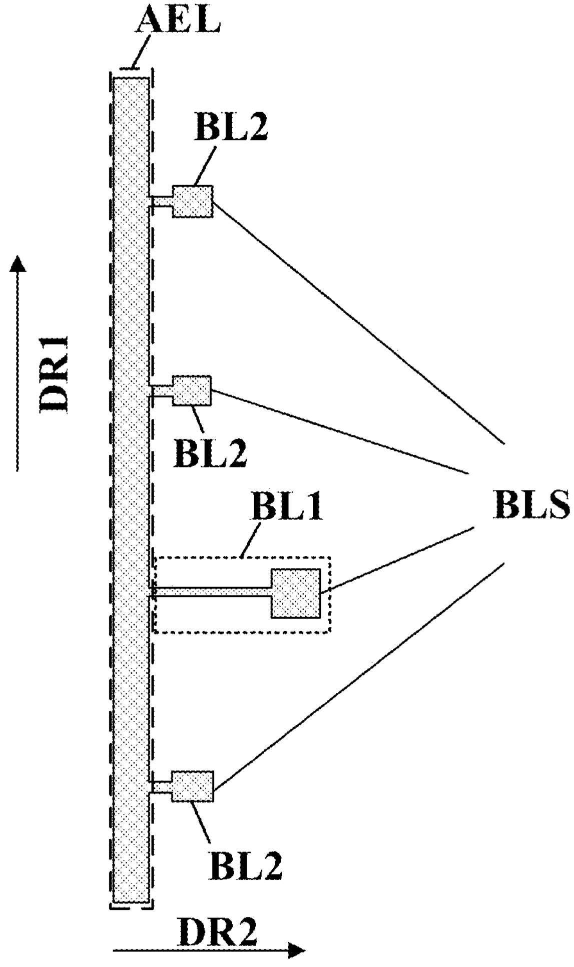
FIG. 11F illustrates the structure of an auxiliary electrode in some embodiments according to the present disclosure.

FIG. 11F illustrates the structure of an auxiliary electrode in some embodiments according to the present disclosure. Referring to FIG. 11F, the auxiliary electrode includes an auxiliary electrode line AEL extending along a first direction DR1 through a plurality of subpixels; and a plurality of branch lines BLS extending from the auxiliary electrode line AEL along a second direction DR2, the second direction DR2 different from the first direction DR1. Optionally, the plurality of branch lines BLS includes one or more first branch lines BL1 and one or more second branch lines BL2.

Figure 11G:
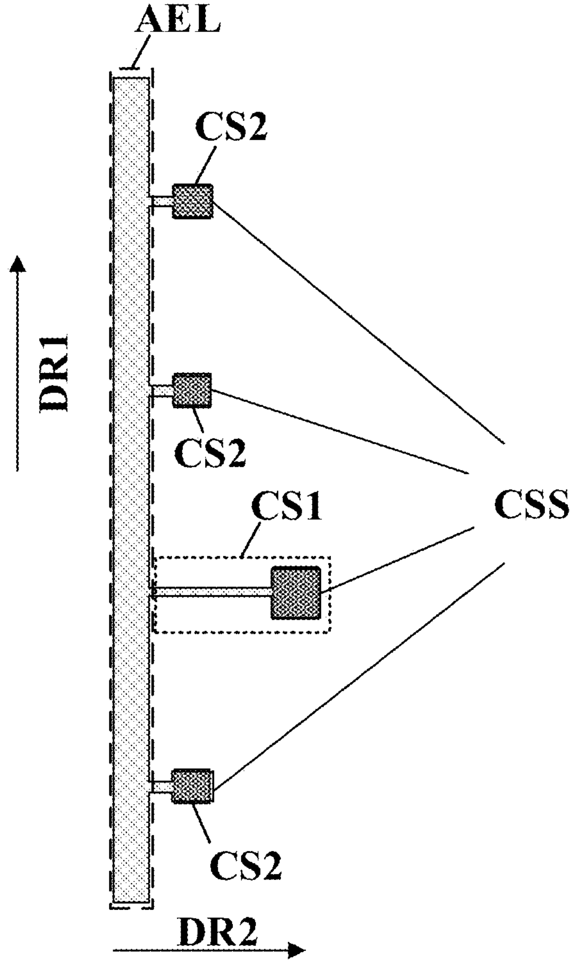
FIG. 11G illustrates the structure of an auxiliary electrode and a plurality of connecting structures in some embodiments according to the present disclosure.

FIG. 11G illustrates the structure of an auxiliary electrode and a plurality of connecting structures in some embodiments according to the present disclosure. Referring to FIG. 11G, the display substrate in some embodiments includes a plurality of connecting structures CSS, each of which electrically connecting the auxiliary electrode and the second electrode. Optionally, the plurality of connecting structures CSS includes one or more first connecting structure CS1 and one or more second connecting structures CS2. As shown in FIG. 11G, a respective first branch line of the one or more first branch lines BL1 connects a respective first connecting structure of the one or more first connecting structures CS1 to the auxiliary electrode line AEL. A respective second branch line of the one or more second branch lines BL2 connects a respective second connecting structure of the one or more multiple second connecting structures CS2 to the auxiliary electrode line AEL. The respective first branch line of the one or more first branch lines BL1 extends along the second direction DR2 by a first length. The respective second branch line of the one or more second branch lines BL2 respectively extends along the second direction DR2 by a second length. The first length is greater than each of the second lengths.

Figure 11H:
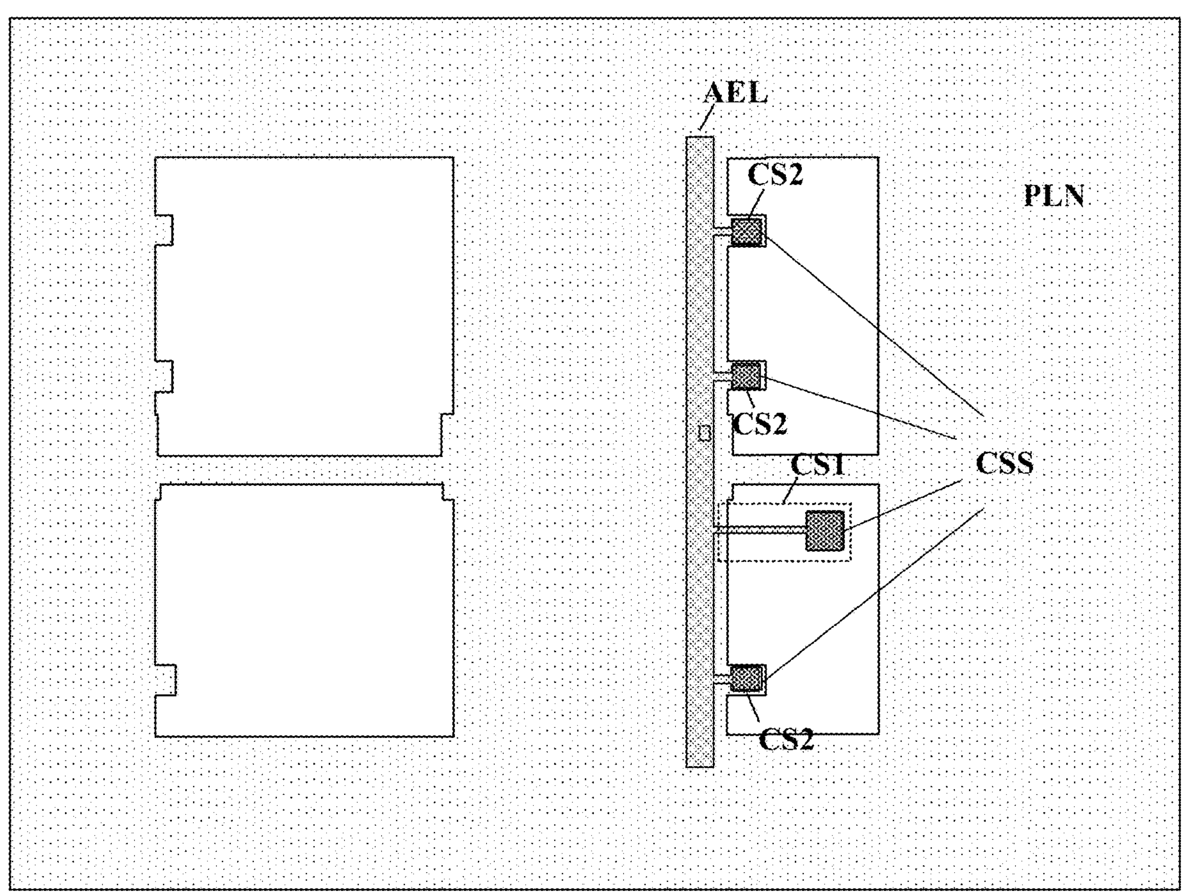
FIG. 11H illustrates the structure of a planarization layer, an auxiliary electrode, a plurality of connecting structures in some embodiments according to the present disclosure.

FIG. 11H illustrates the structure of a planarization layer, an auxiliary electrode, a plurality of connecting structures in some embodiments according to the present disclosure. Referring to FIG. 11H, in some embodiments, an orthographic projection of the planarization layer PLN on a base substrate is completely non-overlapping with an orthographic projection of the one or more first connecting structures CS1 on the base substrate. Optionally, the orthographic projection of the planarization layer PLN on the base substrate at least partially overlaps with orthographic projections of the one or more second connecting structures CS2 on the base substrate. In one example depicted in FIG. 11H, the orthographic projection of the planarization layer PLN on the base substrate covers the orthographic projections of the one or more second connecting structures CS2 on the base substrate.

Figure 12C:
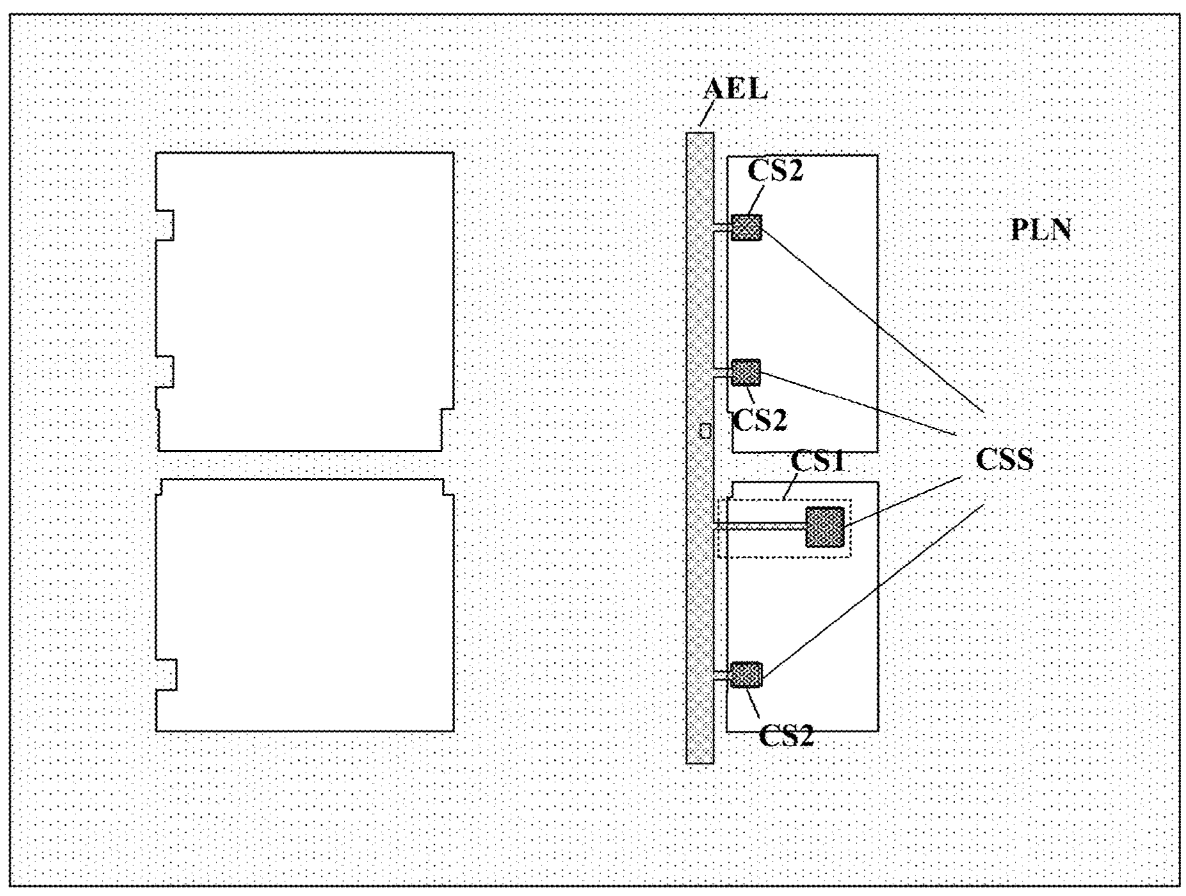
FIG. 12C illustrates the structure of a planarization layer, an auxiliary electrode, a plurality of connecting structures in some embodiments according to the present disclosure.

FIG. 12C illustrates the structure of a planarization layer, an auxiliary electrode, a plurality of connecting structures in some embodiments according to the present disclosure. Referring to FIG. 12C, in some embodiments, an orthographic projection of the planarization layer PLN on a base substrate is completely non-overlapping with an orthographic projection of the one or more first connecting structures CS1 on the base substrate, and is completely non-overlapping with orthographic projections of the one or more second connecting structures CS2 on the base substrate.

Figure 13C:
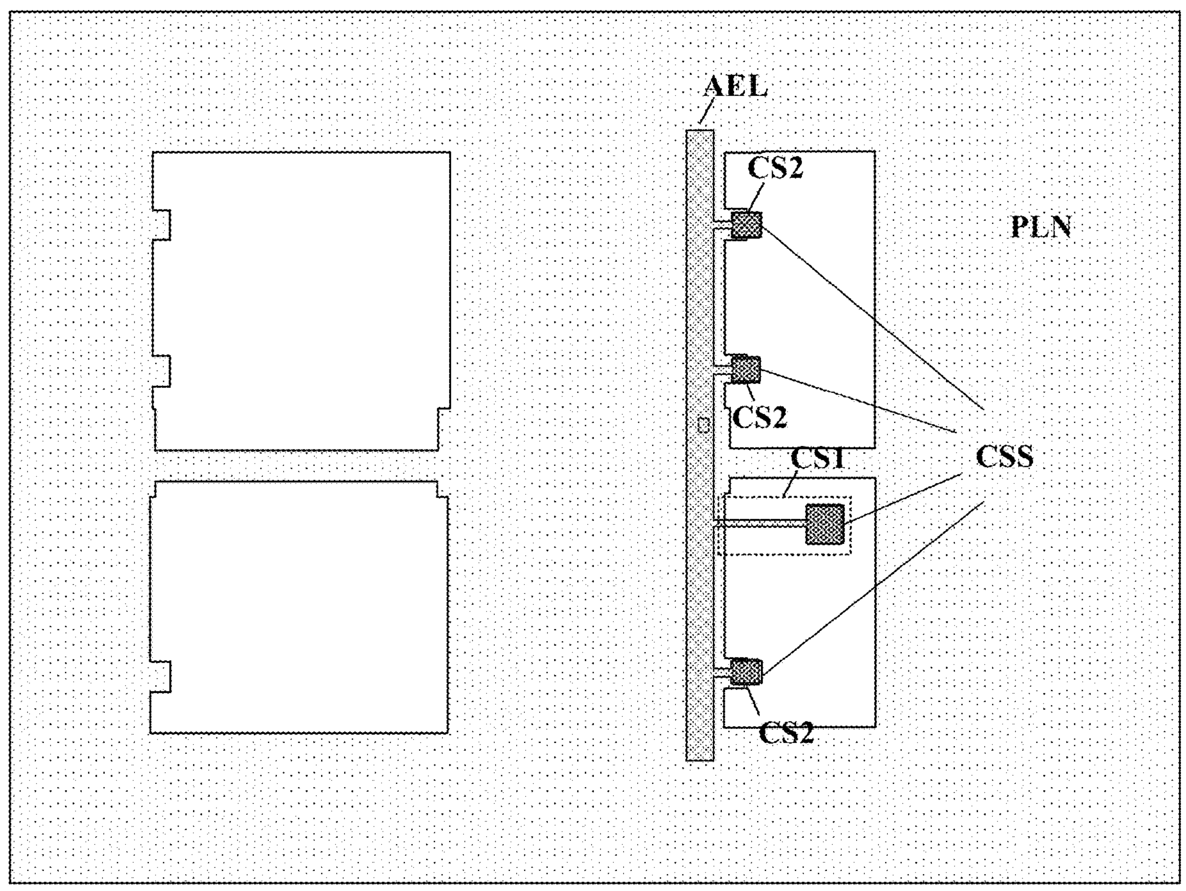
FIG. 13C illustrates the structure of a planarization layer, an auxiliary electrode, a plurality of connecting structures in some embodiments according to the present disclosure.

FIG. 13C illustrates the structure of a planarization layer, an auxiliary electrode, a plurality of connecting structures in some embodiments according to the present disclosure. Referring to FIG. 13C, in some embodiments, an orthographic projection of the planarization layer PLN on a base substrate is completely non-overlapping with an orthographic projection of the one or more first connecting structures CS1 on the base substrate. Optionally, the orthographic projection of the planarization layer PLN on the base substrate only partially overlaps with orthographic projections of the one or more second connecting structures CS2 on the base substrate. In one example depicted in FIG. 13C, the orthographic projection of the planarization layer PLN on the base substrate only partially overlaps with each of the orthographic projections of the one or more second connecting structures CS2 on the base substrate.

Referring to FIG. 10G, the display substrate in some embodiments includes a repairing structure RPS. The repairing structure connects a first conductive part EC1 and a second conductive part EC2 together. In some embodiments, the first conductive part EC1 and the second conductive part EC2 are parts of a first electrode (e.g., the first electrode E1 depicted in FIG. 2). Optionally, the first conductive part EC1 and the second conductive part EC2 are parts of a first electrode in a same subpixel region (e.g., the subpixel region SR depicted in FIG. 1, FIG. 2, FIG. 4, and FIG. 10A). Optionally, the first electrode includes a plurality of sub-layers. For example, referring to FIG. 2 and FIG. 4, in some embodiments, the first electrode E1 includes a first sub-layer SUB1, a second sub-layer SUB2, and a third sub-layer SUB3 sequentially stacked. Optionally, the first conductive part EC1 and the second conductive part EC2 are parts of one sub-layer of the plurality of sub-layers of the first electrode. Referring to FIG. 10G, in some embodiments, the first conductive part EC1 and the second conductive part EC2 are parts of the first sub-layer SUB1 of the first electrode E1.

In some embodiments, the first conductive part EC1 and the second conductive part EC2 are at least partially (e.g., at least 50%, at least 60%, at least 70%, at least 80%, at least 90%, at least 95%, at least 99%, or 100%) on a first side S1 of a virtual straight line VL, and the repairing structure RPS is at least partially (e.g., at least 50%, at least 60%, at least 70%, at least 80%, at least 90%, at least 95%, at least 99%, or 100%) on a second side S2 of the virtual straight line VL. In one example, the first conductive part EC1 and the second conductive part EC2 are completely on the first side S1 of the virtual line VL, and the repairing structure RPS is completely on the second side S2 of the virtual straight line VL. Optionally, the virtual straight line VL is a border line separating the repairing structure RPS and the first conductive part EC1, and separating the repairing structure RPS and the second conductive part EC2.

Figure 14:
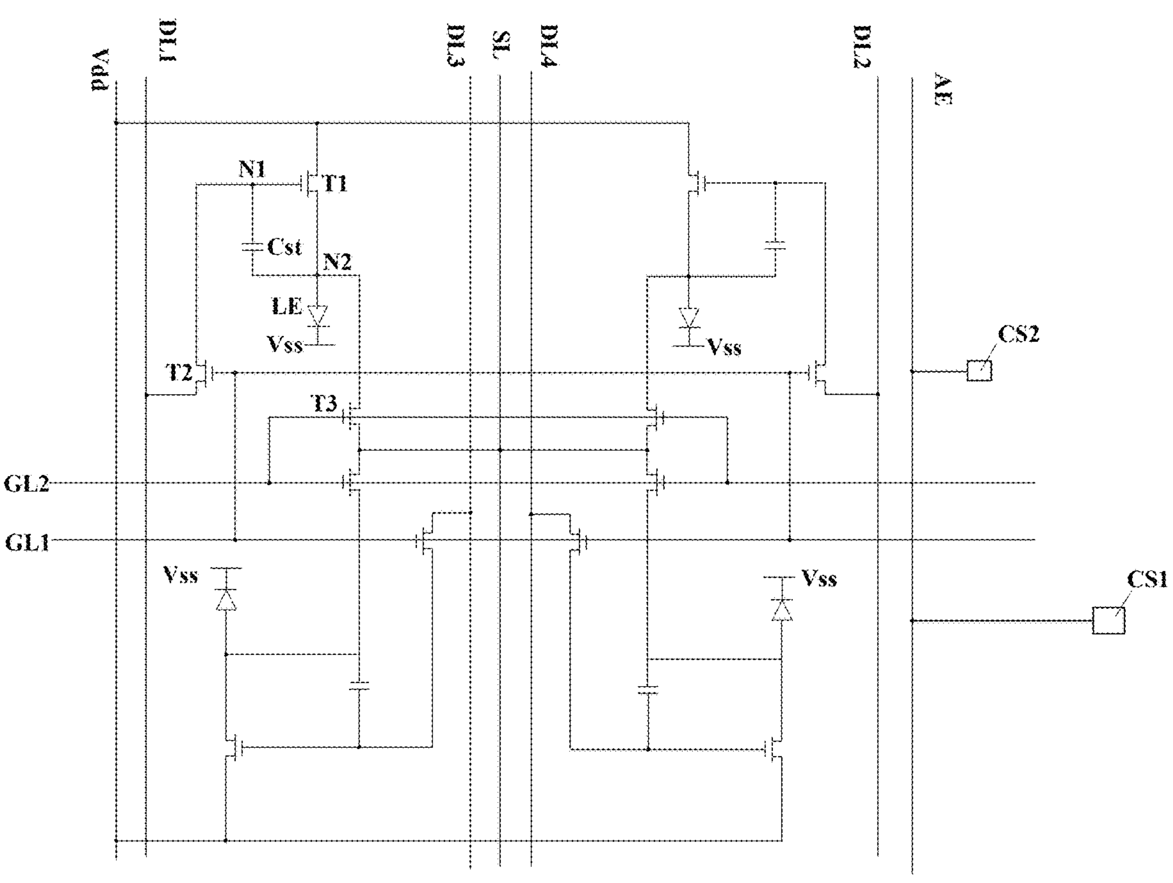
FIG. 14 is a circuit diagram of pixel driving circuits in a portion of a display substrate in some embodiments according to the present disclosure.

FIG. 14 is a circuit diagram of pixel driving circuits in a portion of a display substrate in some embodiments according to the present disclosure. Referring to FIG. 14, a respective pixel driving circuit is connected to a respective light emitting element LE. In some embodiments, the respective pixel driving circuit includes a storage capacitor Cst having a first capacitor electrode coupled to a first node N1 and a second capacitor electrode coupled to a second node N2; a driving transistor T1 having a source electrode coupled to a respective voltage supply line of a plurality of voltage supply lines Vdd, a drain electrode coupled to the second node N2, and a gate electrode coupled to the first node N1; a switching transistor T2 having a source electrode coupled to a respective data line of a plurality of data lines (including a first data line DL1, a second data line DL2, a third data line DL3, and a fourth data line DL4), a drain electrode coupled to the first node N1, and a gate electrode coupled to a respective first gate line of a plurality of first gate lines GL1; and a sensing transistor T3 having a source electrode coupled to a respective sensing line of a plurality of sensing lines SL, a drain electrode coupled to the second node N2, and a gate electrode coupled to a respective second gate line of a plurality of second gate lines GL2. The first node N1 is coupled to the gate electrode of the driving transistor T1, the source electrode of the switching transistor T2, and the first capacitor electrode of the storage capacitor Cst. The second node N2 is coupled to the drain electrode of the driving transistor T1, the drain electrode of the sensing transistor T3, the second capacitor electrode of the storage capacitor Cst, and an anode of a light emitting element LE, Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

FIG. 14 shows four pixel driving circuits configured to drive light emission in four subpixels, e.g., a first subpixel, a second subpixel, a third subpixel, and a fourth subpixel. In one example, the first subpixel, the second subpixel, the third subpixel, and the fourth subpixel are subpixels in a same pixel. In another example, the first subpixel, the second subpixel, the third subpixel, and the fourth subpixel are a red subpixel, a green subpixel, a blue subpixel, and a white subpixel. In some embodiments, the plurality of data lines include a first data line DL1, a second data line DL2, a third data line DL3, and a fourth data line DLA configured to provide data signals to the first subpixel, the second subpixel, the third subpixel, and the fourth subpixel, respectively.

In some embodiments, the display substrate includes one or more first connecting structures CS1 and one or more second connecting structures CS2. A respective first connecting structure of the one or more first connecting structures CS1 connects the auxiliary electrode AE with a second electrode of a light emitting element. A respective second connecting structure of the one or more second connecting structures CS2 connects the auxiliary electrode AE with a second electrode of a light emitting element. In some embodiments, the respective first connecting structure and the respective second connecting structure have different structures.

Figure 15:
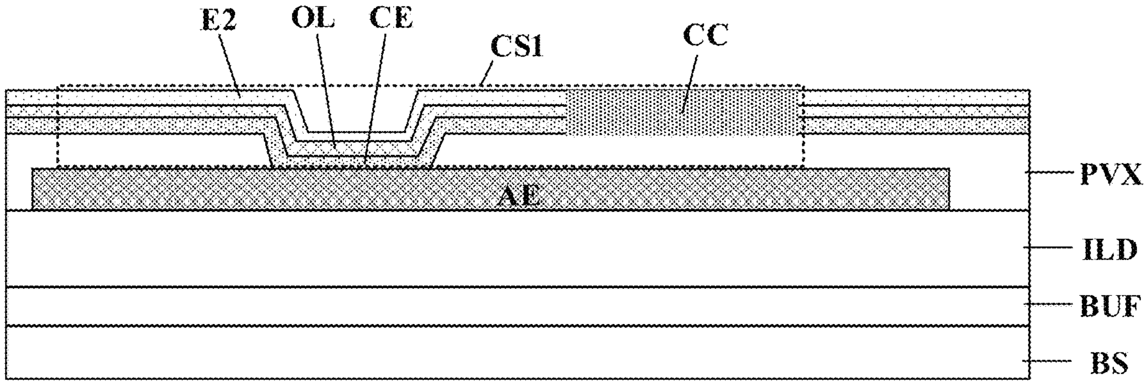
FIG. 15 is a schematic diagram illustrating the structure of a respective first connecting structure in some embodiments according to the present disclosure.

FIG. 15 is a schematic diagram illustrating the structure of a respective first connecting structure in some embodiments according to the present disclosure. Referring to FIG. 15, the respective first connecting structure in some embodiments includes a connecting electrode CE, at least one of a portion of an organic layer OL or a portion of a second electrode E2 on the connecting electrode CE. In one example depicted in FIG. 15, the respective first connecting structure includes a sequentially stacked structure comprising the connecting electrode CE, the portion of the organic layer OL on the connecting electrode CE, and the portion of the second electrode E2 on a side of the portion of the organic layer OL away from the connecting electrode CE. In some embodiments, the auxiliary electrode AE is on a side of the connecting electrode CE away from the portion of the organic layer OL, In one example, the auxiliary electrode AE is in a same layer as a source electrode and a drain electrode of a transistor (e.g., the driving transistor T1, the switching transistor T2, and/or the sensing transistor T3) in the display substrate. In one example, the connecting electrode CE is in direct contact with the auxiliary electrode AE, the portion of the organic layer OL is in direct contact with the connecting electrode CE, and the portion of the second electrode E2 is in direct contact with the portion of the organic layer OL.

In some embodiments, at least a portion of the connecting electrode CE is in a same layer as the first connecting electrode CE1. In some embodiments, at least a portion of the connecting electrode CE is in a same layer as the second connecting electrode CE2. In some embodiments, at least a portion of the connecting electrode CE is in a same layer as the third connecting electrode CE3. In some embodiments, the connecting electrode CE comprises multiple sub-layers, a respective sub-layer of the multiple sub-layers being in a same layer as one of the first connecting electrode CE1, the second connecting electrode CE2, or the third connecting electrode CE3, In one particular example, the connecting electrode CE is in a same layer as the first connecting electrode CE1.

In some embodiments, the respective first connecting structure further includes a conductive channel CC comprising a sintered conductive material comprising at least one of an organic material of the portion of the organic layer OL, a conductive material of the connecting electrode CE, or a conductive material of the portion of the second electrode E2. Optionally, the conductive channel CC includes a sintered conductive material comprising an organic material of the portion of the organic layer OL, a conductive material of the connecting electrode CE, and a conductive material of the portion of the second electrode E2. The second electrode E2 is connected to the connecting electrode CE through the conductive channel CC, and connected to the auxiliary electrode AE through the connecting electrode CE.

In some embodiments, an orthographic projection of the planarization layer PLN on a base substrate BS is non-overlapping with an orthographic projection of the conductive channel CC on the base substrate BS. Optionally, the orthographic projection of the planarization layer PLN on the base substrate BS is non-overlapping with an orthographic projection of the respective first connecting structure on the base substrate BS.

In some embodiments, the conductive channel CC may be formed by sintering the organic layer OL, the connecting electrode CE, and the portion of the second electrode E2, e.g., by a laser. In some embodiments, the second electrode E2 is electrically connected to the auxiliary electrode AE by sintering the organic layer OL, the connecting electrode CE, and the portion of the second electrode E2. Optionally, the sintering may be performed by a laser. The conductive channel CC is at least partially sintered so that the conductive channel CC is electrically conductive, electrically connecting the second electrode E2 with the connecting electrode CE.

Figure 16:
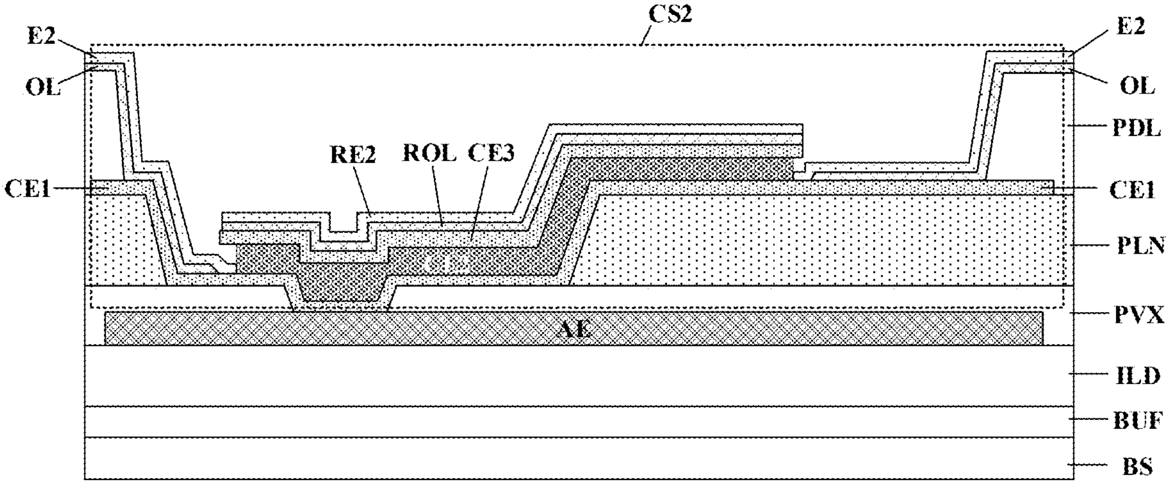
FIG. 16 is a schematic diagram illustrating the structure of a respective second connecting structure in some embodiments according to the present disclosure.

FIG. 16 is a schematic diagram illustrating the structure of a respective second connecting structure in some embodiments according to the present disclosure. The respective second connecting structure has a structure different from the respective first connecting Structure, Referring to FIG. 16, and FIG. 2 to FIG. 8, the respective second connecting structure in some embodiments includes a first connecting electrode CE1, a second connecting electrode CE2, and a third connecting electrode CE3 sequentially stacked. In one example, the first connecting electrode CE1 is in direct contact with the second connecting electrode CE2, and the second connecting electrode CE2 is in direct contact with the third connecting electrode CE3. The second connecting electrode CE2 connects the first connecting electrode CE1 and the third connecting electrode CE3, In some embodiments, the auxiliary electrode AE is on a side of the first connecting electrode CE1 away from the second connecting electrode CE2. In one example, the auxiliary electrode AE is in a same layer as a source electrode and a drain electrode of a transistor (e.g., the driving transistor T1, the switching transistor T2, and/or the sensing transistor T3) in the display substrate.

In some embodiments, the first sub-layer SUB1 and the first connecting electrode CE1 are in a same layer; the second sub-layer SUB2 and the second connecting electrode CE2 are in a same layer, and the third sub-layer SUB3 and the third connecting electrode CE3 are in a same layer. Optionally, the first sub-layer SUB1 and the first connecting electrode CE1 are spaced apart from each other, e.g., by a pixel definition layer PDL; the second sub-layer SUB2 and the second connecting electrode CE2 are spaced apart from each other, e.g., by the pixel definition layer PDL; and the third sub-layer SUB3 and the third connecting electrode CE3 are spaced apart from each other, e.g., by the pixel definition layer PDL.

In some embodiments, the second electrode E2 is in direct contact with at least one of the first connecting electrode CE1, the second connecting electrode CE2, or the third connecting electrode CE3, In one example, the second electrode E2 is in direct contact with the first connecting electrode CE1. In another example, the second electrode E2 is in direct contact with the second connecting electrode CE2. In another example, the second electrode E2 is in direct contact with the first connecting electrode CE1 and the second connecting electrode CE2. In another example, the second electrode E2 is in direct contact with the second connecting electrode CE2 and the third connecting electrode CE3. In another example, the second electrode E2 is in direct contact with the first connecting electrode CE1, the second connecting electrode CE2, and the third connecting electrode CE3.

In some embodiments, the respective second connecting structure further includes at least one of a residual organic layer ROL stacked on a side of the third connecting electrode CE3 away from the second connecting electrode CE2; or a residual second electrode RE2 stacked on a side of the residual organic layer ROL away from the third connecting electrode CE3. In one example as depicted in FIG. 16, the respective second connecting structure includes a sequentially stacked structure comprising a first connecting electrode CE1, a second connecting electrode CE2 on the first connecting electrode CE1, a third connecting electrode CE3 on a side of the second connecting electrode CE2 away from the first connecting electrode CE1, a residual organic layer ROL on a side of the third connecting electrode CE3 away from the second connecting electrode CE2, and a residual second electrode RE2 on a side of the residual organic layer ROL away from the third connecting electrode CE3.

In some embodiments, the residual organic layer ROL is in a same layer as the organic layer OL, and at least partially (e.g., completely) segregated from the organic layer OL. Optionally, at least one sub-layer of the residual organic layer ROL and at least one sub-layer of the organic layer OL are in a same layer. In one example, the residual organic layer ROL includes a residual hole transport layer in a same layer as a hole transport layer of the organic layer OL. In another example, the residual organic layer ROL includes a residual hole injection layer in a same layer as a hole injection layer of the organic layer OL. In one example, the residual organic layer ROL includes a residual electron transport layer in a same layer as an electron transport layer of the organic layer OL, In another example, the residual organic layer ROL includes a residual electron injection layer in a same layer as an electron injection layer of the organic layer OL.

In some embodiments, the residual second electrode RE2 is in a same layer as the second electrode E2, and at least partially (e.g., completely) segregated from the second electrode E2.

FIG. 16 depicts an embodiment of the respective second connecting structure. Various alternative embodiments may be implemented. For example, the respective second connecting structure may adopt a structure of any of the connecting structures depicted in FIG. 2 to FIG. 9B.

In some embodiments, an orthographic projection of the planarization layer PLN on a base substrate BS at least partially overlaps with an orthographic projection of the first connecting electrode CE1 on the base substrate BS. Optionally, the orthographic projection of the planarization layer PLN on the base substrate BS at least partially overlaps with an orthographic projection of the second connecting electrode CE2 on the base substrate BS. Optionally, the orthographic projection of the planarization layer PLN on the base substrate BS at least partially overlaps with an orthographic projection of the third connecting electrode CE3 on the base substrate BS. Optionally, the orthographic projection of the planarization layer PLN on the base substrate BS at least partially overlaps with an orthographic projection of the respective second connecting structure on the base substrate BS.

Figure 17:
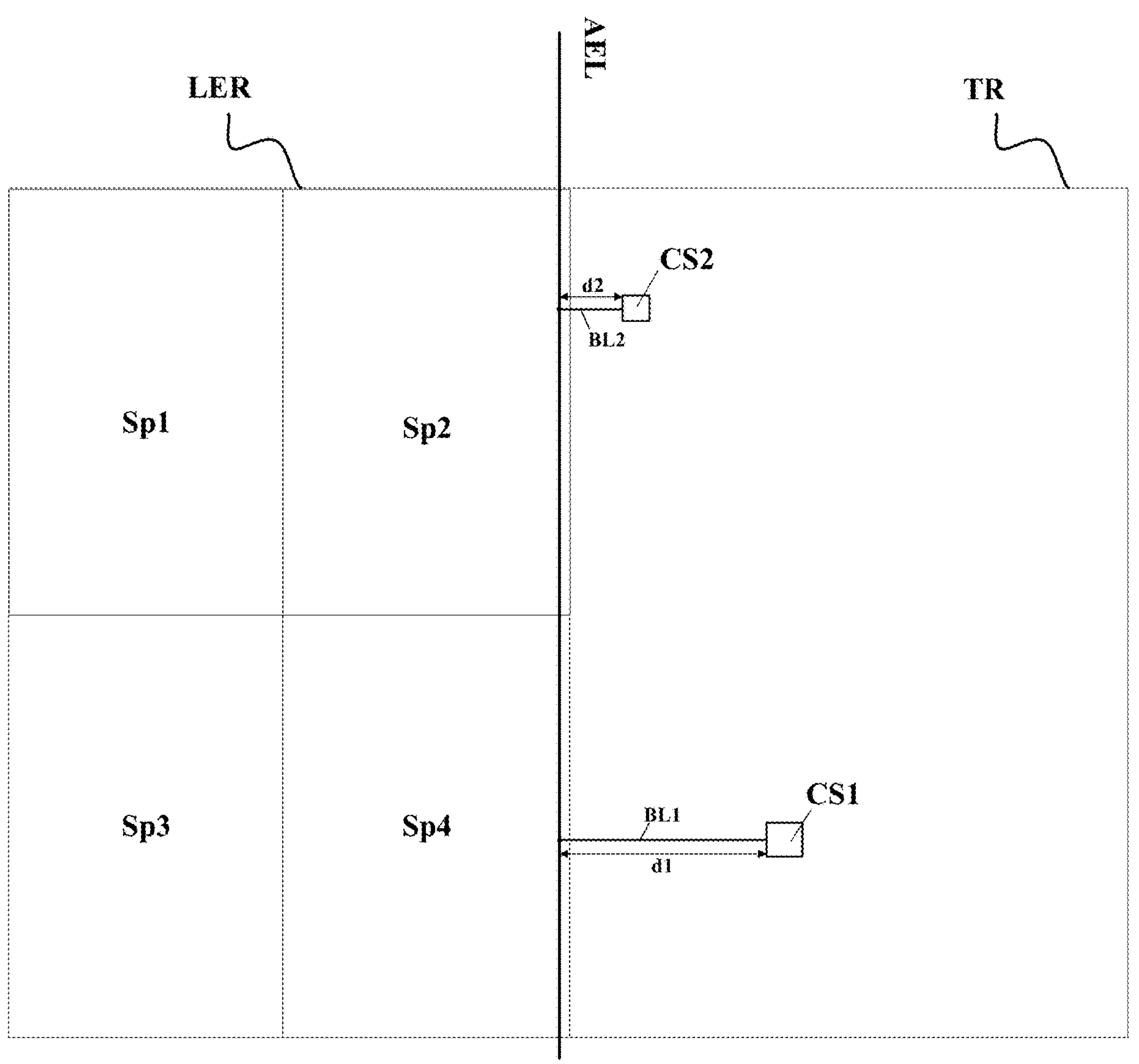
FIG. 17 is a schematic diagram of a portion of a display substrate in some embodiments according to the present disclosure.

FIG. 17 is a schematic diagram of a portion of a display substrate in some embodiments according to the present disclosure. Referring to FIG. 17, the display substrate in some embodiments includes a light emitting region LER and a transparent region TR. A light emitting region LER refers to a region configured to emit light, such as a region corresponding to a pixel electrode in a liquid crystal display or a region corresponding to a light emissive layer in an organic light emitting display. A transparent region refers to a region configured to allow light from a background of the display substrate to transmit through the display substrate, such as a region substantially free of any light emitting elements and substantially non-transparent component (e.g., thin film transistors associated with the light emitting elements, signal lines, and other non-transparent layers or elements), Optionally, layers in the transparent region are substantially transparent, therefore, the transparent region is also substantially transparent.

In some embodiments, the one or more first connecting structures CS1 and the one or more second connecting structures CS2 are in the transparent region TR. A respective first connecting structure of the one or more first connecting structures CS1 is connected to an auxiliary electrode line AEL through a respective first branch line of the one or more first branch lines BL1. A respective second connecting structure of the one or more second connecting structures CS2 is connected to an auxiliary electrode line AEL through a respective second branch line of the one or more second branch lines BL2.

FIG. 17 illustrate four subpixels including a first subpixel sp1, a second subpixel sp2, a third subpixel sp3, and a fourth subpixel sp4. In one example, FIG. 17 illustrates a portion of the display substrate corresponding to the pixel driving circuits depicted in FIG. 14. For example, the four pixel driving circuits depicted in FIG. 14 are configured to drive light emission in four subpixels depicted in FIG. 17. In one example, the first subpixel sp1, the second subpixel sp2, the third subpixel sp3, and the fourth subpixel sp4 are subpixels in a same pixel. In another example, the first subpixel sp1, the second subpixel sp2, the third subpixel sp3, and the fourth subpixel sp4 are a red subpixel, a green subpixel, a blue subpixel, and a white subpixel. In some embodiments, the plurality of data lines include a first data line DL1, a second data line DL2, a third data line DL3, and a fourth data line DL4 configured to provide data signals to the first subpixel sp1, the second subpixel sp2, the third subpixel sp3, and the fourth subpixel sp4, respectively.

The inventors of the present disclosure discover that, by having the one or more first connecting structures CS1 and the one or more second connecting structures CS2, the connection between the second electrode and the auxiliary electrode can be optimized, effectively reducing the voltage drop across the extension path of the second electrode during operation of the display substrate.

In some embodiments, a respective first connecting structure of the one or more first connecting strictures CS1 is spaced apart from the light emitting region LER by a first shortest distance d1; a respective second connecting structure of the one or more second connecting structures CS2 is spaced apart from the light emitting region LER by a second shortest distance d2. In some embodiments, the first shortest distance d1 is greater than the second shortest distance d2. Optionally, the first shortest distance d1 is greater than the second shortest distance d2 by at least 10%, e.g., by at least 20%, by at least 30%, by at least 40%, by at least 50%, by at least 60%, by at least 70%, by at least 80%, by at least 90%, by at least 100%, by at least 110%, by at least 120%, by at least 130%, by at least 140%, by at least 150%, by at least 160%, by at least 170%, by at least 180%, by at least 190%, or by at least 200%.

In some embodiments, an orthographic projection of the planarization layer PLN on a base substrate BS is non-overlapping with an orthographic projection of the respective first connecting structure on the base substrate BS; and the orthographic projection of the planarization layer PLN on the base substrate BS at least partially overlaps with an orthographic projection of the respective second connecting structure on the base substrate BS. Optionally, the orthographic projection of the planarization layer PLN on the base substrate BS is non-overlapping with an orthographic projection of the conductive channel CC of the respective first connecting structure on the base substrate BS; and the orthographic projection of the planarization layer PLN on the base substrate BS at least partially overlaps with an orthographic projection of at least one of the first connecting electrode CE1, the second connecting electrode CE2, or the third connecting electrode CE3 on the base substrate BS.

Figure 18:
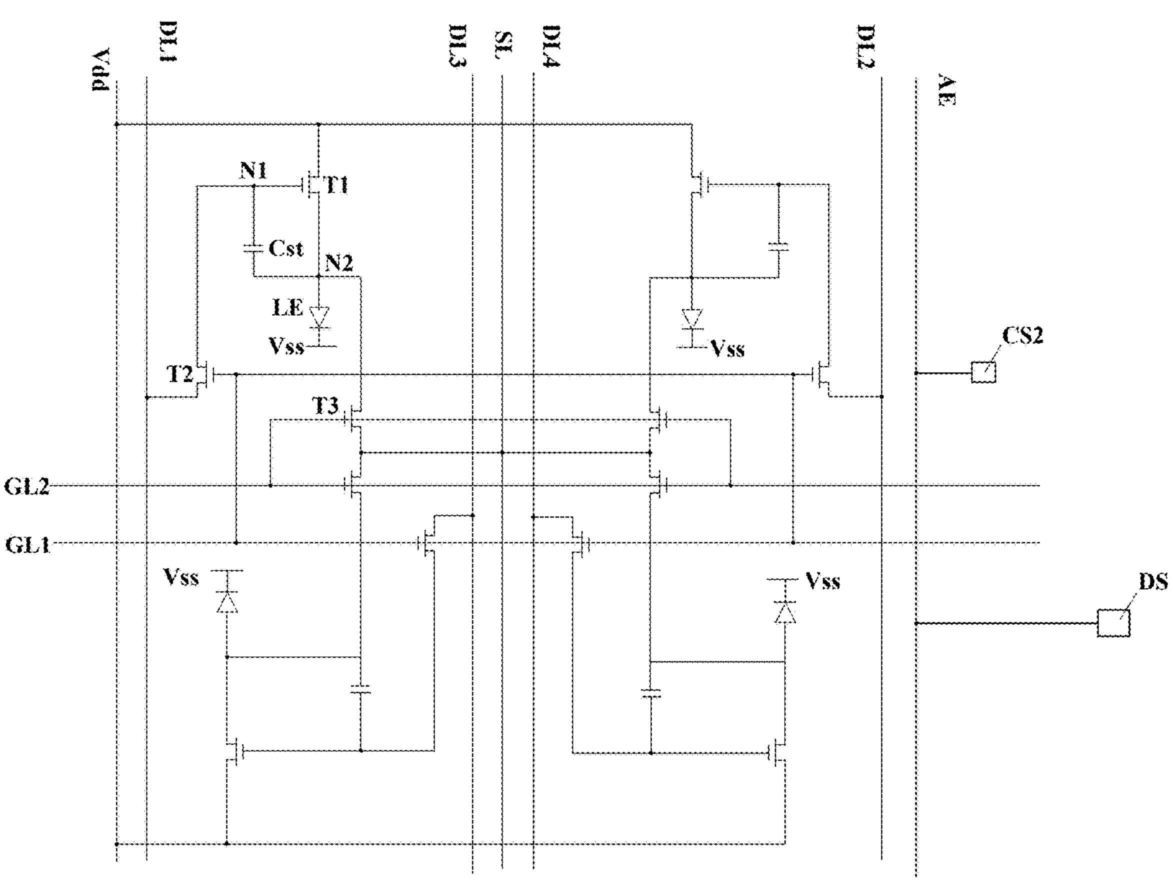
FIG. 18 is a circuit diagram of pixel driving circuits in a portion of a display substrate in some embodiments according to the present disclosure.

FIG. 18 is a circuit diagram of pixel driving circuits in a portion of a display substrate in some embodiments according to the present disclosure, Referring to FIG. 18, in some embodiments, the display substrate includes one or more dummy structures DS and one or more second connecting structures CS2. In a respective dummy structure of the one or more dummy structures DS, the auxiliary electrode AE is not connected to the second electrode of a light emitting element. A respective second connecting structure of the one or more second connecting structures CS2 connects the auxiliary electrode AE with a second electrode of a light emitting element. In some embodiments, the dummy structure and the respective second connecting structure have different structures.

Figure 19:
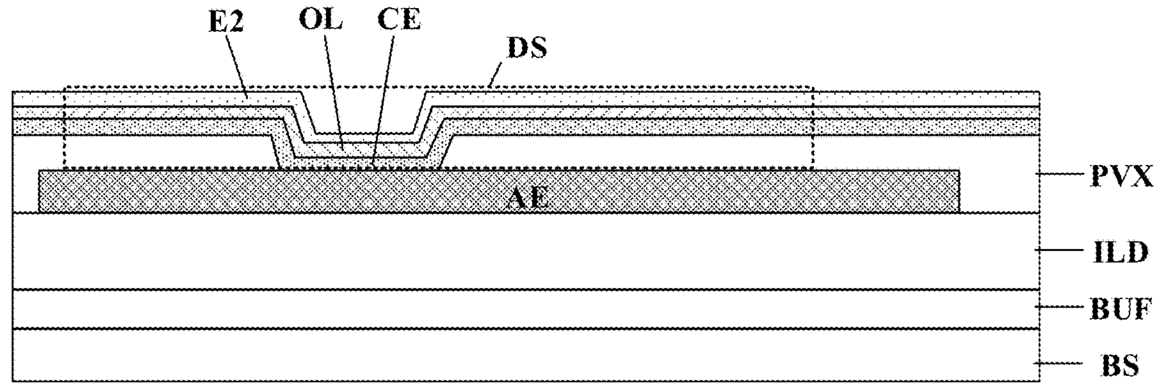
FIG. 19 is a schematic diagram illustrating the structure of a respective dummy structure in some embodiments according to the present disclosure.

FIG. 19 is a schematic diagram illustrating the structure of a respective dummy structure in some embodiments according to the present disclosure. The respective dummy structure has a structure different from the respective first connecting structure. Referring to FIG. 19, the respective dummy structure in some embodiments includes a connecting electrode CE, at least one of a portion of an organic layer OL or a portion of a second electrode E2 on the connecting electrode CE. In one example depicted in FIG. 19, the respective dummy structure includes a sequentially stacked structure comprising the connecting electrode CE, the portion of the organic layer OL on the connecting electrode CE, and the portion of the second electrode E2 on a side of the portion of the organic layer OL away from the connecting electrode CE. In some embodiments, the auxiliary electrode AE is on a side of the connecting electrode CE away from the portion of the organic layer OL. In one example, the auxiliary electrode AE is in a same layer as a source electrode and a drain electrode of a transistor (e.g., the driving transistor T1, the switching transistor T2, and/or the sensing transistor T3) in the display substrate. In one example, the connecting electrode CE is in direct contact with the auxiliary electrode AE, the portion of the organic layer OL is in direct contact with the connecting electrode CE, and the portion of the second electrode E2 is in direct contact with the portion of the organic layer OL.

In some embodiments, at least a portion of the connecting electrode CE is in a same layer as the first connecting electrode CE1, In some embodiments, at least a portion of the connecting electrode CE is in a same layer as the second connecting electrode CE2. In some embodiments, at least a portion of the connecting electrode CE is in a same layer as the third connecting electrode CE3. In some embodiments, the connecting electrode CE comprises multiple sub-layers, a respective sub-layer of the multiple sub-layers being in a same layer as one of the first connecting electrode CE1, the second connecting electrode CE2, or the third connecting electrode CE3, In one particular example, the connecting electrode CE is in a same layer as the first connecting electrode CE1.

The respective dummy structure differs from the respective first connecting structure in that a conductive channel is absent in the respective dummy structure. In the respective dummy structure, the portion of the second electrode E2 is spaced apart from the connecting electrode CE by the portion of the organic layer OL. Absent of the conductive channel, the portion of the second electrode E2 is electrically isolated from the auxiliary electrode AE.

In some embodiments, an orthographic projection of the planarization layer PLN on a base substrate BS is non-overlapping with an orthographic projection of the respective dummy structure DS on the base substrate BS.

Figure 20:
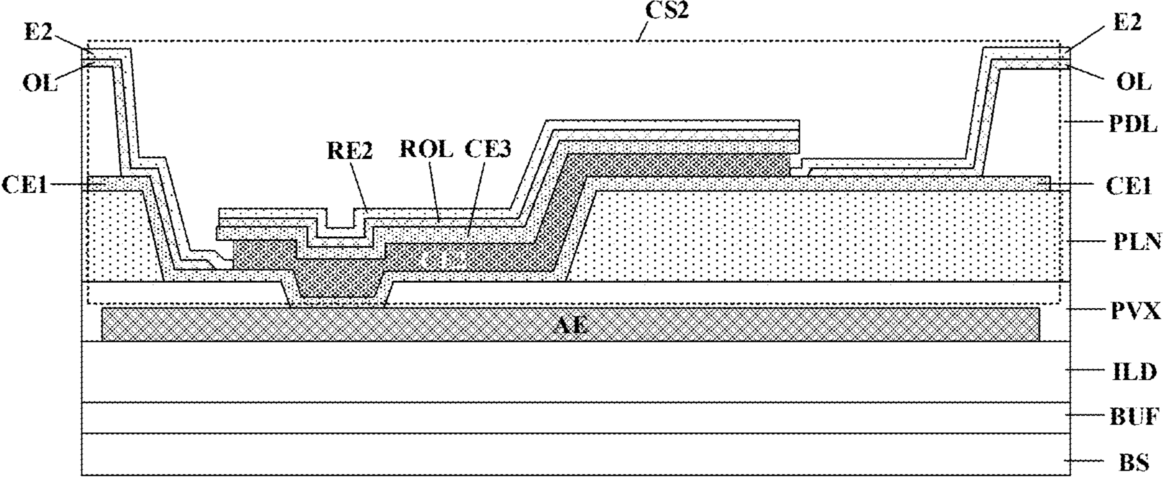
FIG. 20 is a schematic diagram illustrating the structure of a respective second connecting structure in some embodiments according to the present disclosure.

FIG. 20 is a schematic diagram illustrating the structure of a respective second connecting structure in some embodiments according to the present disclosure. The respective second connecting structure depicted in FIG. 20 has a structure largely similar to that depicted in FIG. 16. FIG. 20 depicts an embodiment of the respective second connecting structure. Various alternative embodiments may be implemented. For example, the respective second connecting structure may adopt a structure of any of the connecting structures depicted in FIG. 2 to FIG. 9B.

Figure 21:
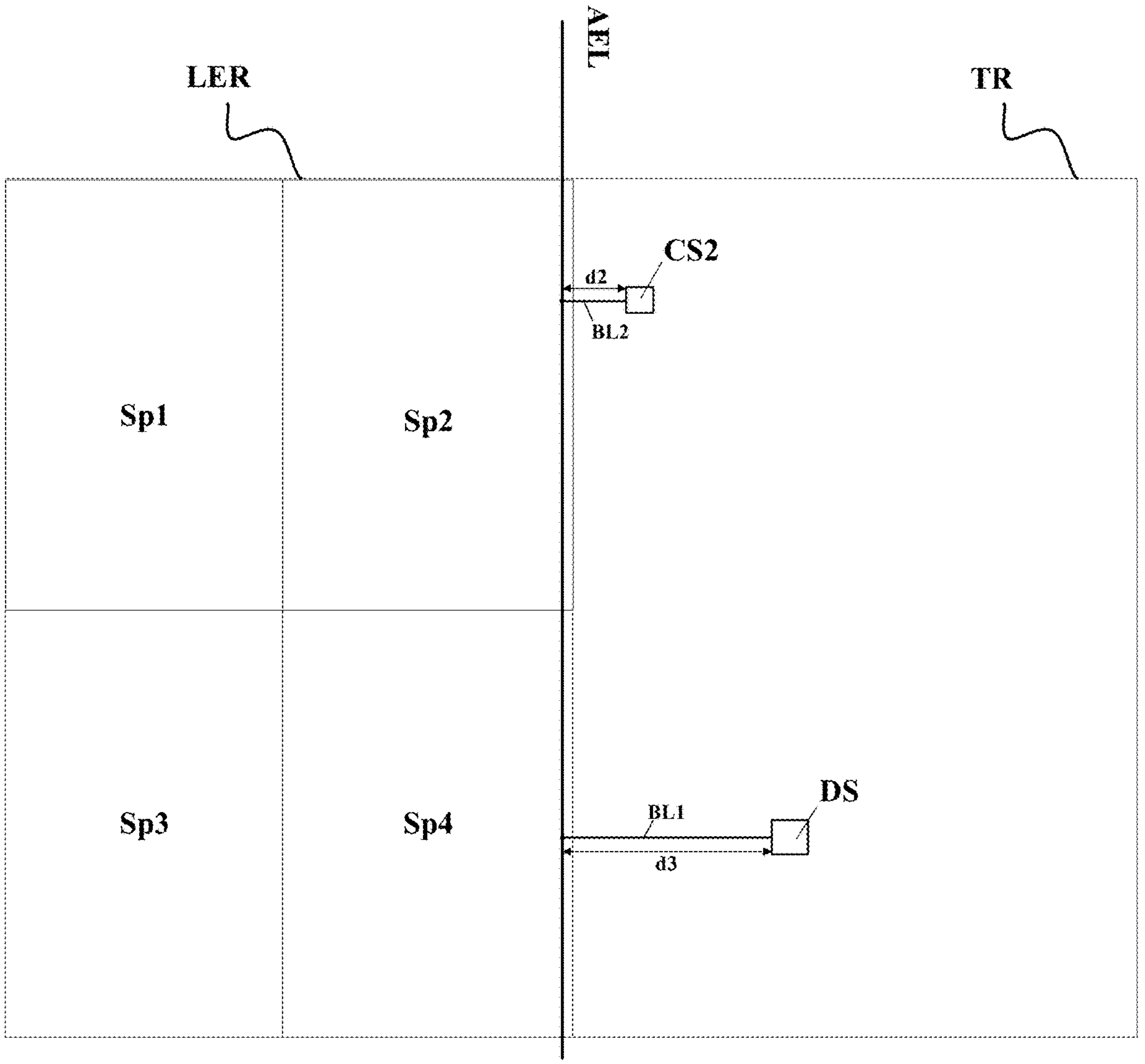
FIG. 21 is a schematic diagram of a portion of a display substrate in some embodiments according to the present disclosure.

FIG. 21 is a schematic diagram of a portion of a display substrate in some embodiments according to the present disclosure. Referring to FIG. 21, the display substrate in some embodiments includes a light emitting region LER and a transparent region TR. In some embodiments, the one or more dummy structures DS and the one or more second connecting structures CS2 are in the transparent region TR.

The inventors of the present disclosure discover that, by having the one or more first connecting structures CS1 and the one or more dummy structures DS, the density of the one or more first connecting structures can be adjusted. Thus, the connection between the second electrode and the auxiliary electrode can be optimized, effectively reducing the voltage drop across the extension path of the second electrode during operation of the display substrate.

In some embodiments, a respective dummy structure of the one or more dummy structures DS is spaced apart from the light emitting region LER by a third shortest distance d3; a respective second connecting structure of the one or more second connecting structures CS2 is spaced apart from the light emitting region LER by a second shortest distance d2. In some embodiments, the third shortest distance d3 is greater than the second shortest distance d2. Optionally, the third shortest distance d3 is greater than the second shortest distance d2 by at least 10%, e.g., by at least 20%, by at least 30%, by at least 40%, by at least 50%, by at least 60%, by at least 70%, by at least 80%, by at least 90%, by at least 100%, by at least 110%, by at least 120%, by at least 130%, by at least 140%, by at least 150%, by at least 160%, by at least 170%, by at least 180%, by at least 190%, or by at least 200%.

In some embodiments, an orthographic projection of the planarization layer PLN on a base substrate BS is non-overlapping with an orthographic projection of the respective dummy structure on the base substrate BS; and the orthographic projection of the planarization layer PLN on the base substrate BS at least partially overlaps with an orthographic projection of the respective second connecting structure on the base substrate BS.

In some embodiments, the display substrate includes a plurality of first repeating units. A respective first repeating unit of the plurality of first repeating units has a structure depicted in FIG. 17. In some embodiments, the respective first repeating unit includes at least one first connecting structure of the one or more first connecting structures and at least one second connecting structure of the one or more second connecting structure. In one example, the respective first repeating unit includes one first connecting structure and one second connecting Structure, as depicted in FIG. 17. Optionally, the plurality of first repeating units are arranged in an array in the display substrate. Optionally, the respective first repeating unit includes multiple subpixels and a portion of the transparent region TR. The respective first repeating unit includes a conductive channel as described above.

In some embodiments, the display substrate further includes a plurality of second repeating units. A respective second repeating unit of the plurality of second repeating units has a structure depicted in FIG. 21. In some embodiments, the respective second repeating unit includes at least one dummy structure of the one or more dummy structures and at least one second connecting structure of the one or more second connecting structure. In one example, the respective second repeating unit includes one dummy structure and one second connecting structure, as depicted in FIG. 21. Optionally, the plurality of second repeating units are arranged in an array in the display substrate. Optionally, the respective second repeating unit includes multiple subpixels and a portion of the transparent region TR. The plurality of second repeating units are absent of the conductive channel.

In some embodiments, the display substrate includes the plurality of first repeating units, and is absent of any second repeating unit of the plurality of second repeating units. In alternative embodiments, the display substrate includes the plurality of first repeating units and the plurality of second repeating units.

In some embodiments, the respective first repeating unit includes a pixel, and the pixel includes a plurality of subpixels (e.g., the first subpixel sp1, the second subpixel sp2, the third subpixel sp3, and the fourth subpixel sp4). In some embodiments, the respective second repeating unit includes a pixel, and the pixel includes a plurality of subpixels (e.g., the first subpixel sp1, the second subpixel sp2, the third subpixel sp3, and the fourth subpixel sp4).

In some embodiments, a ratio of a number of the one or more second connecting structures to a number of the one or more first connecting structures is equal to or greater than 0.9:1.0, for example, 0.9:1.0 to 1.0:0.9, 1.8:1.0 to 2.0:0.8, 2.8:1.0 to 3.0:0.8, 3.8:1.0 to 4.0:0.8, 4.8:1.0 to 5.0:0.8, 5.8:1.0 to 6.0:0.8, 6.8:1.0 to 7.0:0.8, 7.8:1.0 to 8.0:0.8, 8.8:1.0 to 9.0:0.8, or 9.8:1.0 to 10.0:0.8. In one example, the ratio of the number of the one or more second connecting structures to the number of the one or more first connecting structures is 1:1. In another example, the ratio of the number of the one or more second connecting structures to the number of the one or more first connecting structures is 2:1. In another example, the ratio of the number of the one or more second connecting structures to the number of the one or more first connecting structures is 4:1. In another example, the ratio of the number of the one or more second connecting structures to the number of the one or more first connecting structures is 9:1.

In some embodiments, a ratio of a number of the one or more second connecting structures to a sum of a number of the one or more first connecting structures and a number of the one or more dummy structures is in a range of 0.9:1.0, e.g., 1:1.

In some embodiments, a ratio of a number of the pixels to a number of the one or more first connecting structures is equal to or greater than 0.9:1.0, for example, 0.9:1.0 to 1.0:0.9, 1.8:1.0 to 2.0:0.8, 2.8:1.0 to 3.0:0.8, 3.8:1.0 to 4.0:0.8, 4.8:1.0 to 5.0:0.8, 5.8:1.0 to 6.0:0.8, 6.8:1.0 to 7.0:0.8, 7.8:1.0 to 8.0:0.8, 8.8:1.0 to 9.0:0.8, or 9.8:1.0 to 10.0:0.8. In one example, the ratio of the number of the pixels to the number of the one or more first connecting structures is 1:1. In another example, the ratio of the number of the pixels to the number of the one or more first connecting structures is 2:1. In another example, the ratio of the number of the pixels to the number of the one or more first connecting structures is 4:1. In another example, the ratio of the number of the pixels to the number of the one or more first connecting structures is 9:1.

Figure 22:
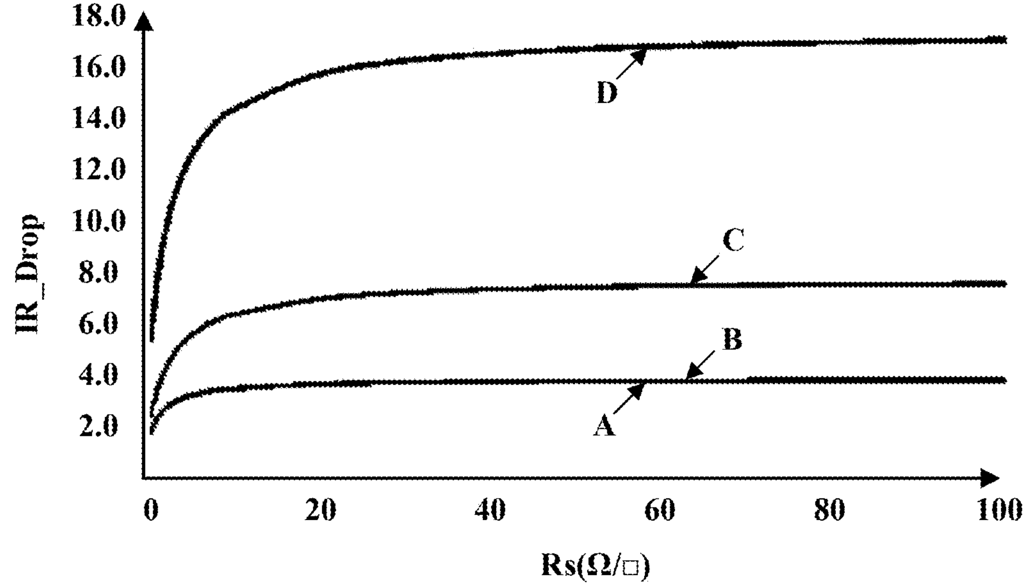
FIG. 22 illustrates values of voltage drop in display substrates having different ratios of the number of second connecting structures to the number of first connecting structures in some embodiments according to the present disclosure.

FIG. 22 illustrates values of voltage drop in display substrates having different ratios of the number of second connecting structures to the number of first connecting structures in some embodiments according to the present disclosure. The voltage drop varies as the sheet resistance of the second electrode changes. The greater the sheet resistance of the second electrode, the greater the value of the voltage drop. The variation of the voltage drop in a second electrode in a display substrate having a ratio of the number of the one or more second connecting structures to the number of the one or more first connecting structures of 1:1 is denoted by a curve "A". The variation of the voltage drop in a second electrode in a display substrate having a ratio of the number of the one or more second connecting structures to the number of the one or more first connecting structures of 2:1 is denoted by a curve "B". The variation of the voltage drop in a second electrode in a display substrate having a ratio of the number of the one or more second connecting structures to the number of the one or more first connecting structures of 4:1 is denoted by a curve "C". The variation of the voltage drop in a second electrode in a display substrate having a ratio of the number of the one or more second connecting structures to the number of the one or more first connecting structures of 9:1 is denoted by a curve "D".

As shown in FIG. 22, at a same sheet resistance, the curve A and the curve B has substantially a same value of voltage drop. The curve C has a value of voltage drop greater than the values of voltage drop in the curve A and the curve B. The curve D has a value of voltage drop greater than the values of voltage drop in the curve A, the curve B, and the curve C. The ratio can be determined based on the fabrication process, to achieve optimal display uniformity in the display substrate.

Figure 23:
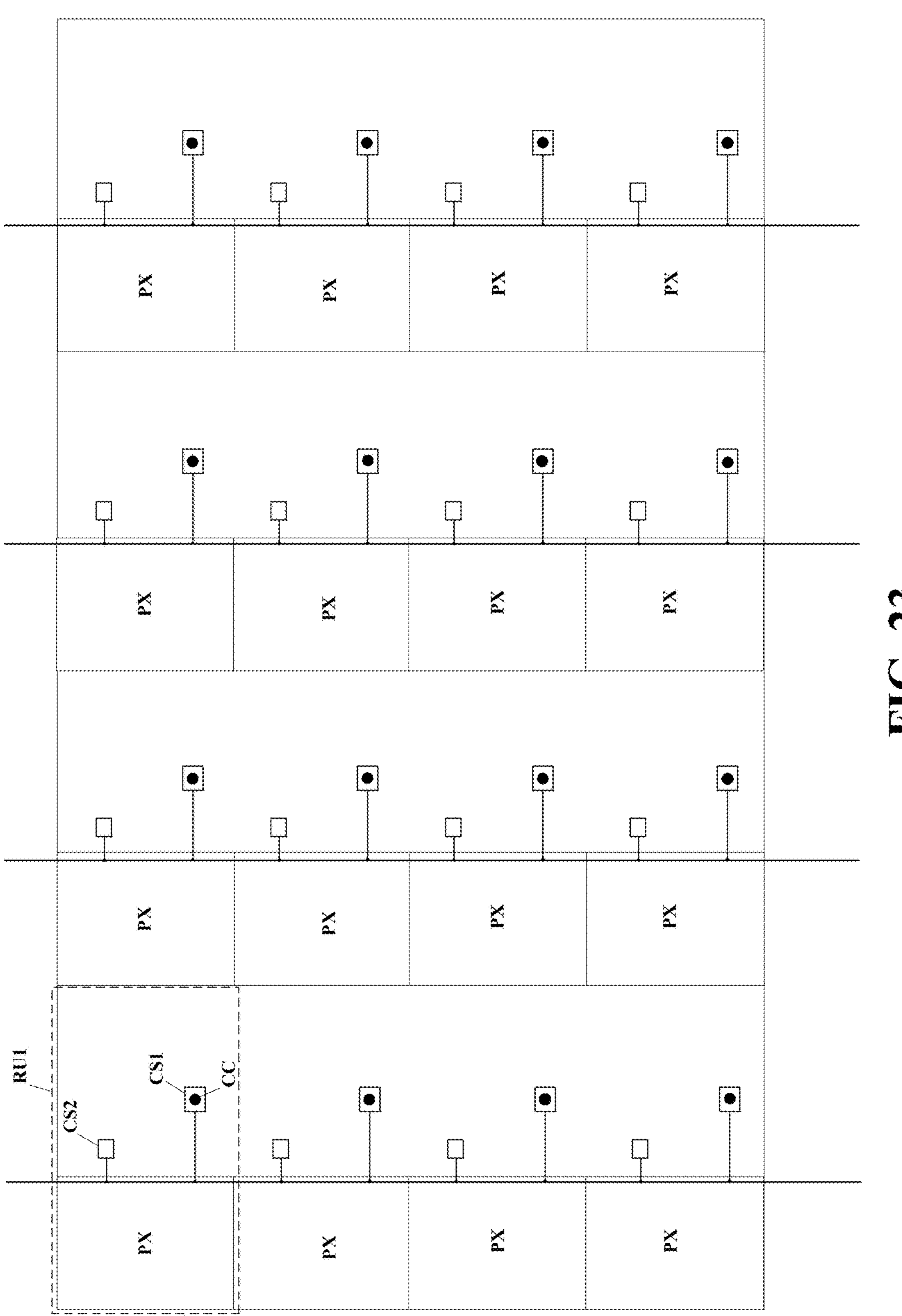
FIG. 23 is a schematic diagram illustrating a layout of a display substrate in some embodiments according to the present disclosure.

FIG. 23 is a schematic diagram illustrating a layout of a display substrate in some embodiments according to the present disclosure. Referring to FIG. 23, the display substrate in some embodiments includes a plurality of first repeating units RU1, but is absent of any second repeating unit. The ratio of the number of the one or more second connecting structures to the number of the one or more first connecting structures is in a range of 0.9:1.0 to 1.0:0.9, e.g., 1:1. The ratio of the number of the pixels to the number of the one or more first connecting structures is in a range of 0.9:1.0 to 1.0:0.9, e.g., 1:1.

Figure 24:
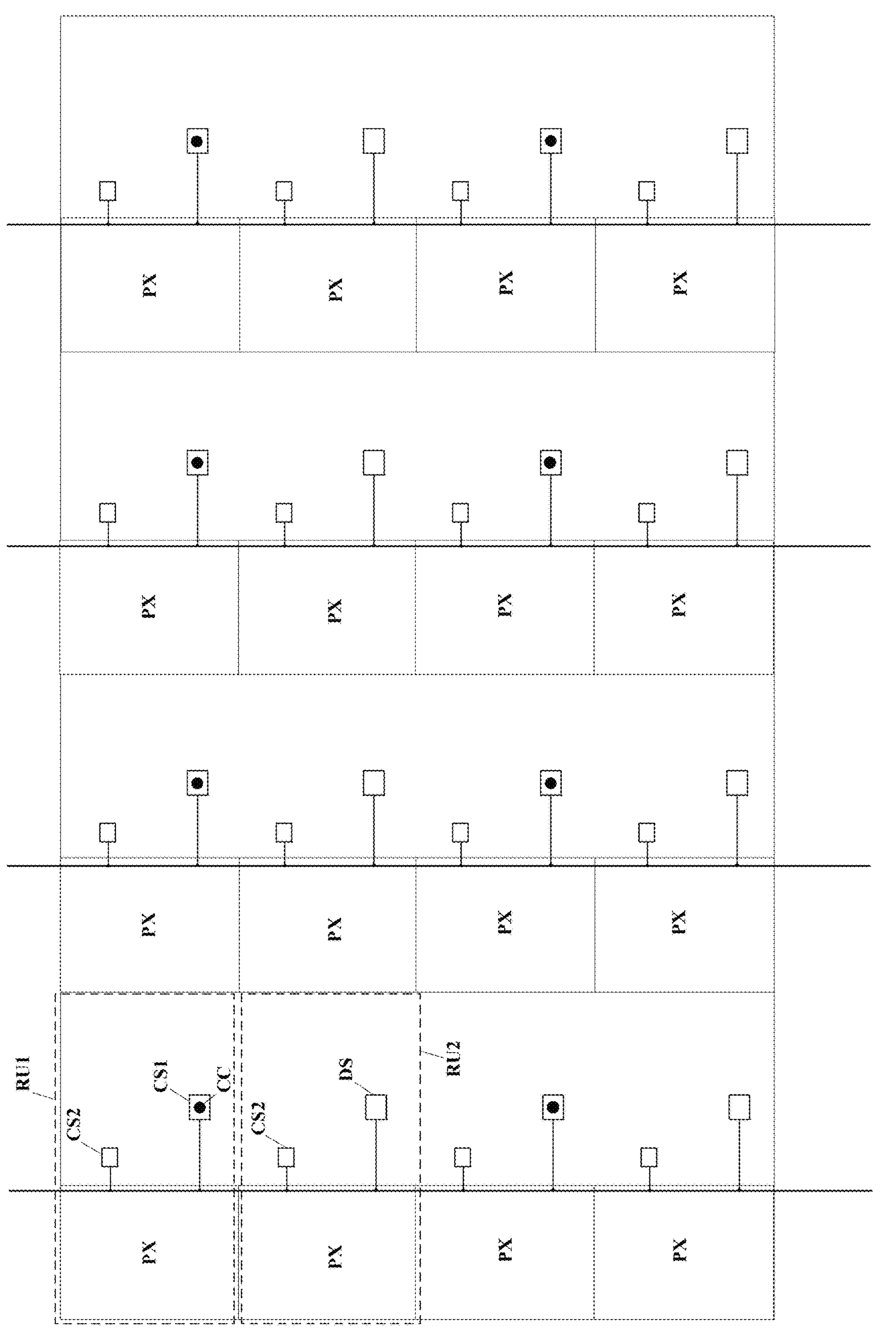
FIG. 24 is a schematic diagram illustrating a layout of a display substrate in some embodiments according to the present disclosure.

FIG. 24 is a schematic diagram illustrating a layout of a display substrate in some embodiments according to the present disclosure. Referring to FIG. 24, the display substrate in some embodiments includes a plurality of first repeating units RU1 and a plurality of second repeating units RU2. A conductive channel CC is present in a respective first repeating unit of the plurality of first repeating units RU1, and is absent in a respective second repeating unit of the plurality of second repeating units RU2. The ratio of the number of the one or more second connecting structures to the number of the one or more first connecting structures is in a range of 1.8:1.0 to 2.0:0.8, e.g., 2:1. The ratio of the number of the pixels to the number of the one or more first connecting structures is in a range of 1.8:1.0 to 2.0:0.8, e.g., 2:1. The plurality of first repeating units RU1 are arranged in a plurality of first rows, the plurality of second repeating units RU2 are arranged in a plurality of second rows, the plurality of first rows and the plurality of second rows are alternately arranged. The inventors of the present disclosure discover that this structure is conducive to reduce any potential mura due to the conductive channels in the display substrate, achieving a high degree of display uniformity in the display substrate.

Figure 25:
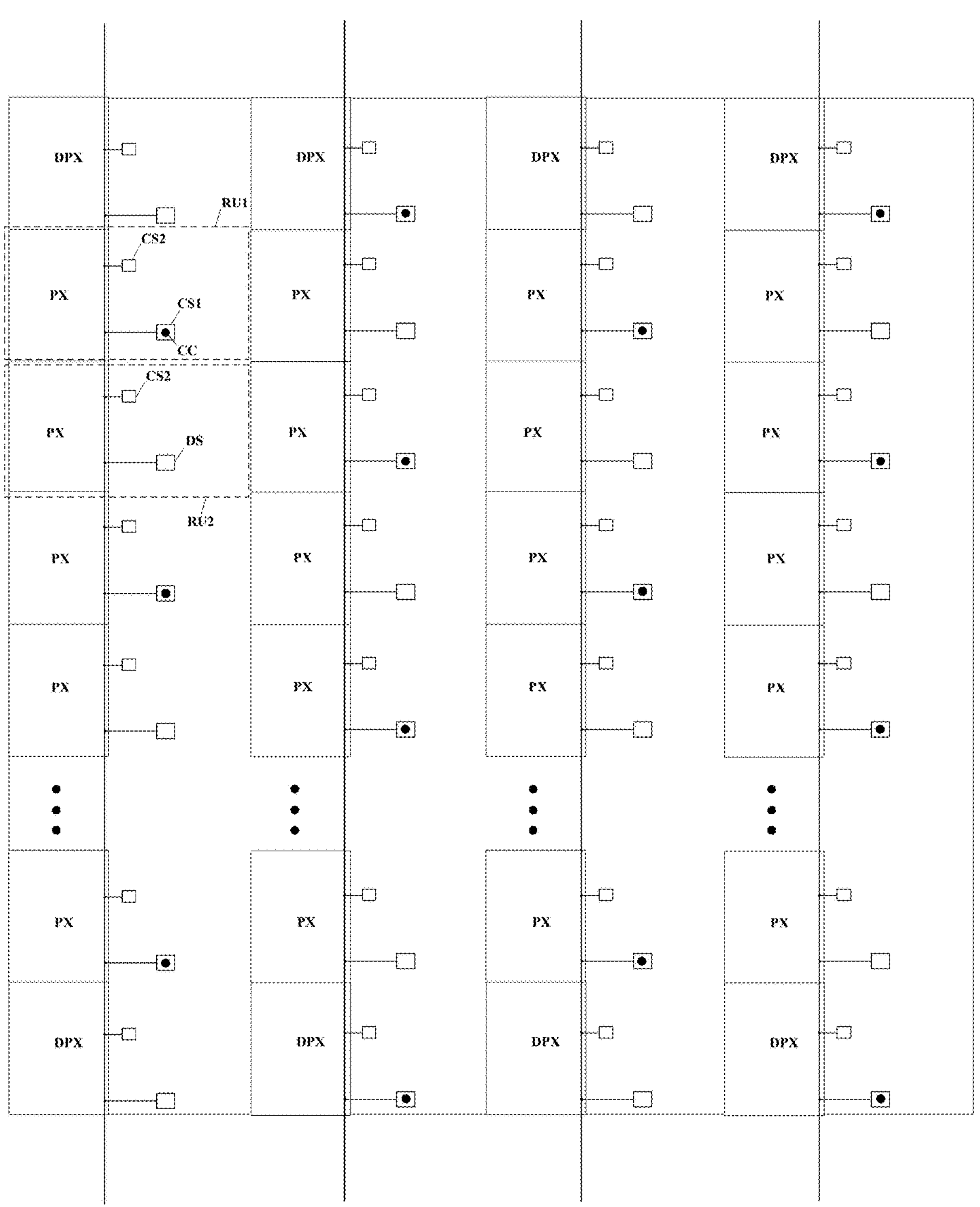
FIG. 25 is a schematic diagram illustrating a layout of a display substrate in some embodiments according to the present disclosure.

FIG. 25 is a schematic diagram illustrating a layout of a display substrate in some embodiments according to the present disclosure. Referring to FIG. 25, the display substrate in some embodiments includes a plurality of first repeating units RU1 and a plurality of second repeating units RU2. A conductive channel CC is present in a respective first repeating unit of the plurality of first repeating units RU1, and is absent in a respective second repeating unit of the plurality of second repeating units RU2. The ratio of the number of the one or more second connecting structures to the number of the one or more first connecting structures is in a range of 1.8:1.0 to 2.0:0.8, e.g., 2:1. The display substrate includes a plurality of pixel PX and a plurality of dummy pixels DPX. As used herein, the term "dummy" refers to a pixel that has a structure that is the same as or similar to an active pixel, but the structure is only used for a configuration existing as a pattern, without actually performing a function in the display substrate. Thus, an electrical signal may not be applied to a "dummy" pixel or even in a case in which an electrical signal is applied thereto, the "dummy" pixel may not perform an electrically equivalent function, Optionally, the ratio of a sum of the number of the pixels and the number of dummy pixels to the number of the one or more first connecting structures is in a range of 1.8:1.0 to 2.0:0.8, e.g., 2:1. A respective first repeating unit may include a pixel or a dummy pixel. A respective second repeating unit may include a pixel or a dummy pixel;

In some embodiments, referring to FIG. 25, in a row of repeating units, first repeating units and second repeating units are alternately arranged. Optionally, in a column of repeating units, first repeating units and second repeating units are alternately arranged.

In some embodiments, dummy pixels are arranged in rows. In a row of repeating units comprising dummy pixels, first repeating units comprising dummy pixels and second repeating units comprising dummy pixels are alternately arranged.

In another aspect, the present invention provides a display apparatus, including the display substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present invention provides a method of fabricating a display substrate. In some embodiments, the method includes forming a light emitting element on a planarization layer, comprising a first electrode, an organic layer on the first electrode, and a second electrode on a side of the organic layer away from the first electrode; forming an auxiliary electrode in a layer different from the second electrode; forming one or more first connecting structures electrically connecting the auxiliary electrode with the second electrode, respectively, and forming one or more second connecting structures electrically connecting the auxiliary electrode with the second electrode, respectively. Optionally, forming a respective first connecting structure of the one or more first connecting structures comprises forming a conductive channel comprising a sintered conductive material. Optionally, the conductive channel is absent in the one or more second connecting structures.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention" "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:

a planarization layer;

a light emitting element on the planarization layer, comprising a first electrode, an organic layer on the first electrode, and a second electrode on a side of the organic layer away from the first electrode;

an auxiliary electrode in a layer different from the second electrode;

one or more first connecting structures electrically connecting the auxiliary electrode with the second electrode, respectively; and one or more second connecting structures electrically connecting the auxiliary electrode with the second electrode, respectively;

wherein a respective first connecting structure of the one or more first connecting structures comprises a conductive channel comprising a sintered conductive material; and the conductive channel is absent in the one or more second connecting structures.

2. The display substrate of claim 1, comprising a light emitting region and a transparent region;

wherein the one or more first connecting structures and the one or more second connecting structures are in the transparent region.

3. The display substrate of claim 2, wherein the respective first connecting structure is spaced apart from the light emitting region by a first shortest distance;

a respective second connecting structure of the one or more second connecting structures is spaced apart from the light emitting region by a second shortest distance; and the first shortest distance is greater than the second shortest distance.

4. The display substrate of claim 3, further comprising a planarization layer which extends at least partially in the light emitting region;

wherein an orthographic projection of the planarization layer on a base substrate is non-overlapping with an orthographic projection of the respective first connecting structure on the base substrate, and at least partially overlaps with an orthographic projection of the respective second connecting structure on the base substrate.

5. The display substrate of claim 1, wherein the respective first connecting structure comprises a sequentially stacked structure comprising a connecting electrode, a portion of the organic layer on the connecting electrode, and a portion of the second electrode on a side of the portion of the organic layer away from the connecting electrode.

6. The display substrate of claim 5, wherein the sintered conductive material comprises at least one of an organic material of the portion of the organic layer, a conductive material of the connecting electrode, or a conductive material of the portion of the second electrode.

7. The display substrate of claim 5, wherein the sintered conductive material comprises an organic material of the portion of the organic layer, a conductive material of the connecting electrode, and a conductive material of the portion of the second electrode.

8. The display substrate of claim 5, wherein the auxiliary electrode is on a side of the connecting electrode away from the organic layer;

the second electrode is connected to the connecting electrode through the conductive channel, and in turn connected to the auxiliary electrode through the connecting electrode; and the auxiliary electrode extends at least partially in one or more subpixels.

9. The display substrate of claim 1, wherein a respective second connecting structure of the one or more second connecting structures comprises a first connecting electrode, a second connecting electrode, and a third connecting electrode sequentially stacked;

wherein the second electrode is in direct contact with at least one of the first connecting electrode, the second connecting electrode, or the third connecting electrode.

10. The display substrate of claim 9, wherein the auxiliary electrode is on a side of the first connecting electrode away from the second connecting electrode;

the first connecting electrode extends through a via to connect with the auxiliary electrode; and the auxiliary electrode extends at least partially in one or more subpixels.

11. The display substrate of claim 10, further comprising a pixel definition layer surrounding a subpixel region;

an orthographic projection of the planarization layer on a base substrate at least partially overlaps with an orthographic projection of the pixel definition layer on the base substrate; and an orthographic projection of the pixel definition layer on the base substrate is non-overlapping with an orthographic projection of the second connecting electrode on the base substrate, and is non-overlapping with an orthographic projection of the third connecting electrode on the base substrate.

12. The display substrate of claim 11, wherein the second electrode extends from a light emitting region, over the pixel definition layer, and into a transparent region to be in direct contact with at least one of the first connecting electrode, the second connecting electrode, or the third connecting electrode.

13. The display substrate of claim 9, wherein the respective second connecting structure further comprises at least one of:

a residual organic layer stacked on a side of the third connecting electrode away from the second connecting electrode, the residual organic layer in a same layer as the organic layer, and at least partially segregated from the organic layer; or a residual second electrode stacked on a side of the residual organic layer away from the third connecting electrode, the residual second electrode in a same layer as the second electrode, and at least partially segregated from the second electrode.

14. The display substrate of claim 9, wherein the first electrode comprises a first sub-layer, a second sub-layer, and a third sub-layer sequentially stacked;

the first sub-layer and the first connecting electrode are in a same layer, and are spaced apart from each other by a pixel definition layer;

the second sub-layer and the second connecting electrode are in a same layer, and are spaced apart from each other by the pixel definition layer; and the third sub-layer and the third connecting electrode are in a same layer, and are spaced apart from each other by the pixel definition layer.

15. The display substrate of claim 1, further comprising one or more dummy structures;

wherein a respective dummy structure of the one or more dummy structures comprises a sequentially stacked structure comprising a connecting electrode, a portion of the organic layer on the connecting electrode, and a portion of the second electrode on a side of the portion of the organic layer away from the connecting electrode;

the conductive channel connecting the portion of the second electrode and the auxiliary electrode is absent in the respective dummy structure; and the portion of the second electrode is electrically isolated from the auxiliary electrode.

16. The display substrate of claim 1, wherein a ratio of a number of the one or more second connecting structures to a number of the one or more first connecting structures in the display substrate is equal to or greater than 0.9:1.0.

17. The display substrate of claim 1, wherein a ratio of a number of the one or more second connecting structures to a number of the one or more first connecting structures in the display substrate is in a range of 0.9:1.0 to 1.0:0.9.

18. The display substrate of claim 1, comprising a plurality of first repeating units and a plurality of second repeating units;

a respective first repeating unit of the plurality of first repeating units comprises at least one first connecting structure of the one or more first connecting structures and at least one second connecting structure of the one or more second connecting structure;

a respective second repeating unit includes at least one dummy structure of one or more dummy structures and at least one second connecting structure of the one or more second connecting structure;

the conductive channel is present in a respective first repeating unit of the plurality of first repeating units, and is absent in a respective second repeating unit of the plurality of second repeating units.

19. The display substrate of claim 18, wherein, in a row of repeating units, first repeating units and second repeating units are alternately arranged; and in a column of repeating units, first repeating units and second repeating units are alternately arranged.

20. A display apparatus, comprising the display substrate of claim 1.

* * * * *